United States Patent
Hatade

(10) Patent No.: US 7,122,875 B2
(45) Date of Patent: Oct. 17, 2006

(54) SEMICONDUCTOR DEVICE

(75) Inventor: Kazunari Hatade, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/998,983

(22) Filed: Nov. 30, 2004

(65) Prior Publication Data
US 2005/0161761 A1    Jul. 28, 2005

(30) Foreign Application Priority Data
Jan. 26, 2004   (JP)   .............................. 2004-016663

(51) Int. Cl.
H01L 23/58  (2006.01)
(52) U.S. Cl. .................. 257/488; 257/49; 257/E29.009
(58) Field of Classification Search ................ 257/487, 257/488, 490–496, 327, 341, 342, 367, 347, 257/77, 129
See application file for complete search history.

(56) References Cited
U.S. PATENT DOCUMENTS 4,292,642 A    9/1981   Appels et al.
4,766,474 A *  8/1988   Nakagawa et al. ......... 257/409
6,246,101 B1   6/2001   Akiyama
6,307,232 B1  10/2001   Akiyama et al.

FOREIGN PATENT DOCUMENTS

| JP | 10-341018 | 12/1998 |
| JP | 2000-22163 | 1/2000 |
| JP | 2003-68872 | 3/2003 |

* cited by examiner

*Primary Examiner*—Minhloan Tran
*Assistant Examiner*—Benjamin Tzu-Hung Liu
(74) *Attorney, Agent, or Firm*—McDermott Will & Emery LLP

(57) ABSTRACT

A p well serving as a channel region of a MOSFET is formed on one side of an $n^-$ layer and an $n^+$ drain region is formed on the other side. Above the $n^-$ layer, a plurality of first floating field plates are formed with a first insulating film interposed therebetween. A plurality of second floating field plates are formed thereon with a second insulating film interposed therebetween. Assuming that the thickness of the first insulating film is "a" and the distance between the first floating field plates and the second floating field plates in a direction of thickness of the second insulating film is "b", a relation a>b is held.

20 Claims, 41 Drawing Sheets

F I G . 2
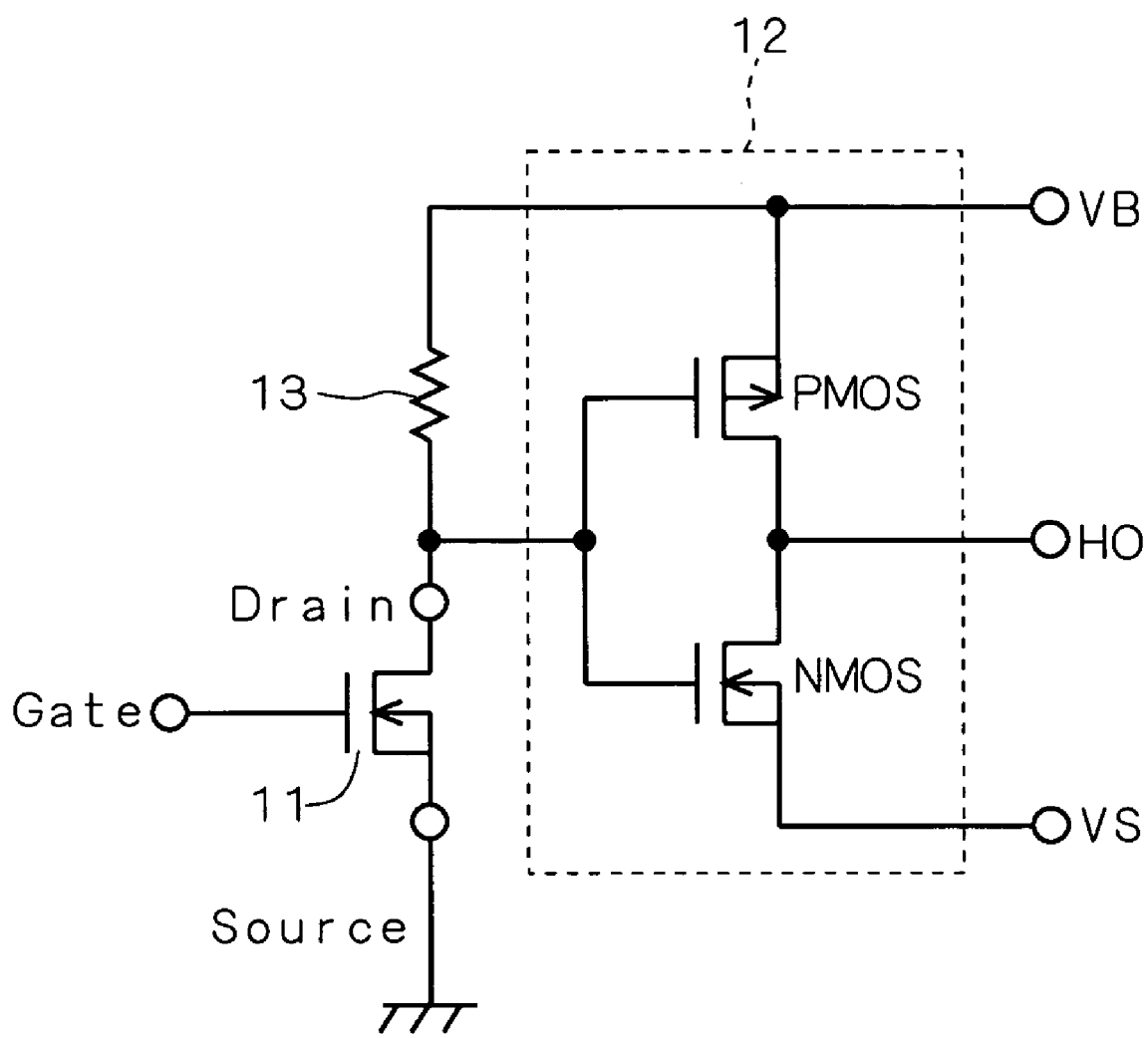

SEMICONDUCTOR DEVICE

BACKGROUND OF THE INVENTION

1. Field of the Invention

The present invention relates to a technique to ensure improvement in stability of withstand voltage and an increase of withstand voltage in a semiconductor device, especially in a high breakdown voltage semiconductor device.

2. Description of the Background Art

In order to drive two power switching devices (MOSFET, IGBT or the like) of high side and low side, for example in a half-bridge type inverter, a power-device driving apparatus having a high side (high potential island) driving circuit for driving the high side power switching device and a low side driving circuit for driving the low side power switching device. Since the high side circuit is operated with its potential in a floating state with respect to the ground potential, such a power-device driving apparatus is provided with a level shifting circuit for transmitting a driving signal to the high side driving circuit. A general-type level shifting circuit consists of a high breakdown voltage switching element such as a MOSFET which is driven by a driving signal and a level shifting resistor connected thereto in series (see FIG. 2 discussed later). A voltage drop in the level shifting resistor is transmitted to the high side driving circuit as the driving signal. The high breakdown voltage switching element needs a stable and high withstand voltage for preventing a breakage in the power-device driving apparatus or generation of wrong signals in the level shifting circuit.

As a technique for improvement in stability and increase of withstand voltage of the high breakdown voltage switching element such as a diode, well known are, for example, a method of forming a plurality of field plates in a floating state (hereinafter, referred to simply as "floating field plates") on a semiconductor substrate with an insulating film interposed therebetween to uniformize an electric field distribution in a substrate surface (shown in e.g., Japanese Patent Application Laid Open Gazette No. 10-341018 (1998)) and a method of using a RESURF structure as a semiconductor element structure to accelerate depletion in a substrate (shown in U.S. Pat. No. 4,292,642).

When a high voltage is applied to a high breakdown voltage semiconductor device in a cut-off state (OFF state), the high breakdown voltage semiconductor device keeps the voltage. At that time, if an electric field concentration (electric field peak) locally occurs in a semiconductor substrate on which the device is formed, it becomes easier to cause a breakdown in a pn junction or a breakage in an insulating film at that local portion and this causes deterioration of withstand voltage characteristic. In a case where the high breakdown voltage semiconductor device is an n-channel type MOSFET having a RESURF structure, for example, an electric field peak is likely to occur near a drain-side n layer in a junction depth between an n⁻ layer formed on an upper portion of the semiconductor substrate and a p⁻ substrate therebelow and a substrate of the semiconductor substrate below an electrode and an edge portion of the field plate (discussed in detail later).

In an actual use of the high breakdown voltage semiconductor device, its upper surface is covered with an overcoat insulating film or an epoxy resin for assembly. When a high voltage is applied between a drain and a source of the MOSFET in an OFF state and an electric field peak occurs inside thereof, for example, this causes polarization of the overcoat insulating film or the epoxy resin for assembly. Electric charges generated by the polarization are kept for a certain period of time after the application of the high voltage is finished. Then, when a high voltage is next applied between the drain and the source of the MOSFET, with the electric charges, extension of a depletion layer is suppressed locally (especially, near a surface of a silicon substrate). In the local portion where extension of the depletion layer is suppressed, the peak of electric field becomes higher. When the peak reaches a breakdown critical electric field in the silicon surface, this causes a decrease or variation in withstand voltage, or a breakage of the semiconductor device under certain circumstances.

SUMMARY OF THE INVENTION

It is an object of the present invention to ensure an improvement in stability of withstand voltage and an increase in withstand voltage by relieving an electric field concentration in a substrate on which a semiconductor device is formed.

The present invention is intended for a semiconductor device. The semiconductor device of the present invention includes a first semiconductor region of a first conductivity type, and a second semiconductor region of a second conductivity type and a third semiconductor region of the first conductivity type having impurity concentration higher than that of the first semiconductor region which are so formed as to sandwich the first semiconductor region.

According to a first aspect of the present invention, the semiconductor device includes a first insulating film formed on the first semiconductor region, a plurality of first floating field plates formed on the first insulating film, being arranged above the first semiconductor region along a first direction which is a direction from the third semiconductor region towards the second semiconductor region, a second insulating film formed on the first floating field plates, and a plurality of second floating field plates formed on the second insulating film, being arranged above the first semiconductor region along the first direction. In the first aspect of the present invention, assuming that the thickness of the first insulating film is "a" and the distance between the first floating field plates and the second floating field plates in a second direction which is a direction of the thickness is "b", a relation a>b is held.

Since the thickness "a" of the first insulating film is large, distortion of equipotential lines in the first insulating film is suppressed and therefore the electric field concentration in an upper surface of the first semiconductor region is relieved. Further, since the distance "b" between the first floating field plates and the second floating field plates is small, a capacitor formed by the first floating field plates and the second floating field plates produces a high capacity coupling effect to accelerate polarization of the second insulating film. With this, it becomes easier for the depletion layer to extend in an upper portion of the first semiconductor region below a gap between two adjacent ones of the first floating field plates, where the depletion layer has conventionally have difficulty in extending, and the electric field concentration in that portion is thereby relieved. Therefore, a margin with respect to the electric field strength at a breakdown critical electric field point becomes larger and the problems of the device, such as a decrease in withstand voltage and instability of withstand voltage characteristic, can be suppressed. As a result, the device can keep a high withstand voltage with stability.

According to a second aspect of the present invention, the semiconductor device includes an electrode formed on the third semiconductor region, a first insulating film formed on the first semiconductor region, a second insulating film formed on the first insulating film, a plurality of second floating field plates formed on the second insulating film, being arranged above the first semiconductor region along a first direction which is a direction from the third semiconductor region towards the second semiconductor region, a third insulating film formed on the second floating field plates, and a plurality of third floating field plates formed on the third insulating film, being arranged above the first semiconductor region along the first direction. In the fifth aspect of the present invention, the electrode has a first electrode portion extending on the first insulating film along the first direction.

The electric field concentration in the upper surface of the first semiconductor region near the third semiconductor region is relieved. The breakdown critical electric field point of the device is present near the third semiconductor region in many cases, and since the electric field concentration near the region is relieved, the problems of the device, such as a decrease in withstand voltage and instability of withstand voltage characteristic, can be suppressed. As a result, the device can keep a high withstand voltage with stability.

According to a third aspect of the present invention, the semiconductor device includes an electrode formed on the third semiconductor region, a first insulating film formed on the first semiconductor region, a second insulating film formed on the first insulating film, a plurality of second floating field plates formed on the second insulating film, being arranged above the first semiconductor region along a first direction which is a direction from the third semiconductor region towards the second semiconductor region, a third insulating film formed on the second floating field plates, and a plurality of third floating field plates formed on the third insulating film, being arranged above the first semiconductor region along the first direction. In the sixth aspect of the present invention, the electrode has a first electrode portion extending on the first insulating film and a second electrode portion extending on the second insulating film, and the length of a portion in the second electrode portion which extends above the first insulating film along the first direction is longer than the length of a portion in the first electrode portion which extends on the first insulating film along the first direction.

The electric field concentration in the upper surface of the first semiconductor region near the third semiconductor region is relieved. The breakdown critical electric field point of the device is present near the third semiconductor region in many cases, and since the electric field concentration near the region is relieved, the problems of the device, such as a decrease in withstand voltage and instability of withstand voltage characteristic, can be suppressed. As a result, the device can keep a high withstand voltage with stability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram showing a principal part of a high side driving unit in the power-device driving apparatus;

DESCRIPTION OF THE PREFERRED EMBODIMENTS

<The First Preferred Embodiment>

Figure 1:
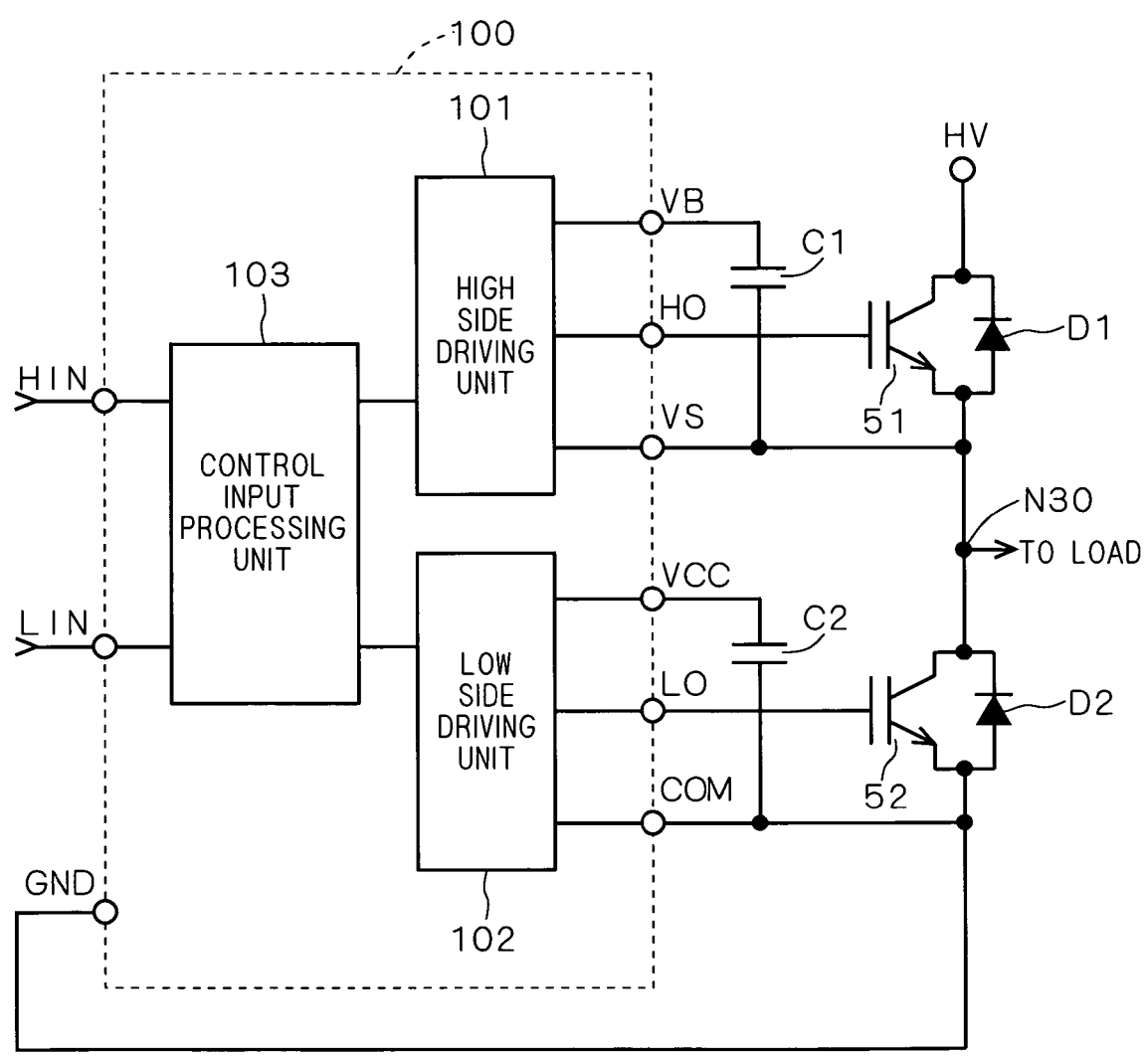
FIG. 1 is a view showing a power device and a power-device driving apparatus.

FIG. 1 is a view for explanation on an example of semiconductor device to which the present invention can be applied, showing a general-type power device and a power-device driving apparatus. In FIG. 1, n-channel type IGBTs (insulated gate bipolar transistors) 51 and 52 which are power switching devices perform switching of a high voltage HV which is a main power supply. A load is connected to a node N30 and free wheeling diodes D1 and D2 are connected to the IGBTs 51 and 52, respectively, for protecting the IGBTs 51 and 52 from a back electromotive voltage due to the load.

The power-device driving apparatus 100 for driving the IGBTs 51 and 52 operates in accordance with a high side control input HIN for controlling the high side IGBT 51 and a low side control input LIN for controlling the low side IGBT 52. The power-device driving apparatus 100 further has a high side driving unit 101 for driving the high side IGBT 51, a low side driving unit 102 for driving the low side IGBT 52 and a control input processing unit 103.

The control input processing unit 103 performs a signal processing to avoid undesirable conditions, such as a case where the IGBTs 51 and 52 are turned on at the same time and no current flows in the load as a through current flows in the IGBTs 51 and 52, or the like. A high side driving signal output HO of the high side driving unit 101 is connected to a control terminal of the IGBT 51. A low side driving signal output LO of the low side driving unit 102 is connected to a control terminal of the IGBT 52.

A low side fixed supply voltage VCC serving as a power supply for the low side driving unit 102 is supplied by a low side fixed power supply (not shown). A high side floating offset voltage VS serves as a reference potential of the high side driving unit 101. A high side floating supply absolute voltage VB serving as a power supply for the high side driving unit 101 is supplied by a high side floating power supply (not shown). A common ground COM and the high side floating offset voltage VS are connected to emitter terminals of the IGBTs 51 and 52, respectively.

Capacitors C1 and C2 are connected between the high side floating supply absolute voltage VB and the high side floating offset voltage VS and between the common ground COM and the low side fixed supply voltage VCC, respectively, to make a power supply voltage supplied to the high side driving unit 101 and the low side driving unit 102 follow potential variations in accordance with operations of the IGBTs 51 and 52.

Thus, the power device has the above structure to perform switching of the main power supply HV for the IGBTs 51 and 52 on the basis of the control inputs HIN and LIN.

Since the high side driving unit 101 is operated with its potential in a floating state with respect to the ground potential of the circuit, the high side driving unit 101 has a level shifting circuit for transmitting a driving signal to a high side circuit. FIG. 2 is a circuit diagram showing a principal part of the high side driving unit 101. In this figure, constituent elements identical to those in FIG. 1 are represented by the same reference signs. A high breakdown voltage MOSFET (hereinafter, referred to as an "HV-MOS") 11 is a high breakdown voltage switching element. A high side driving signal output CMOS 12 consists of a pMOS transistor and an nMOS transistor and outputs a high side driving signal. A level shifting resistor 13 plays a part which corresponds to a pull-up resistor for setting a gate potential of the high side driving signal output CMOS 12.

The HV-MOS 11 performs switching in accordance with the high side control input HIN and changes the gate potential of the high side driving signal output CMOS 12. This makes the high side driving signal output CMOS 12 perform switching of a voltage between the high side floating supply absolute voltage VB and the high side floating offset voltage VS and output a driving signal to the high side driving signal output HO to drive the IGBT 51.

Figure 3:
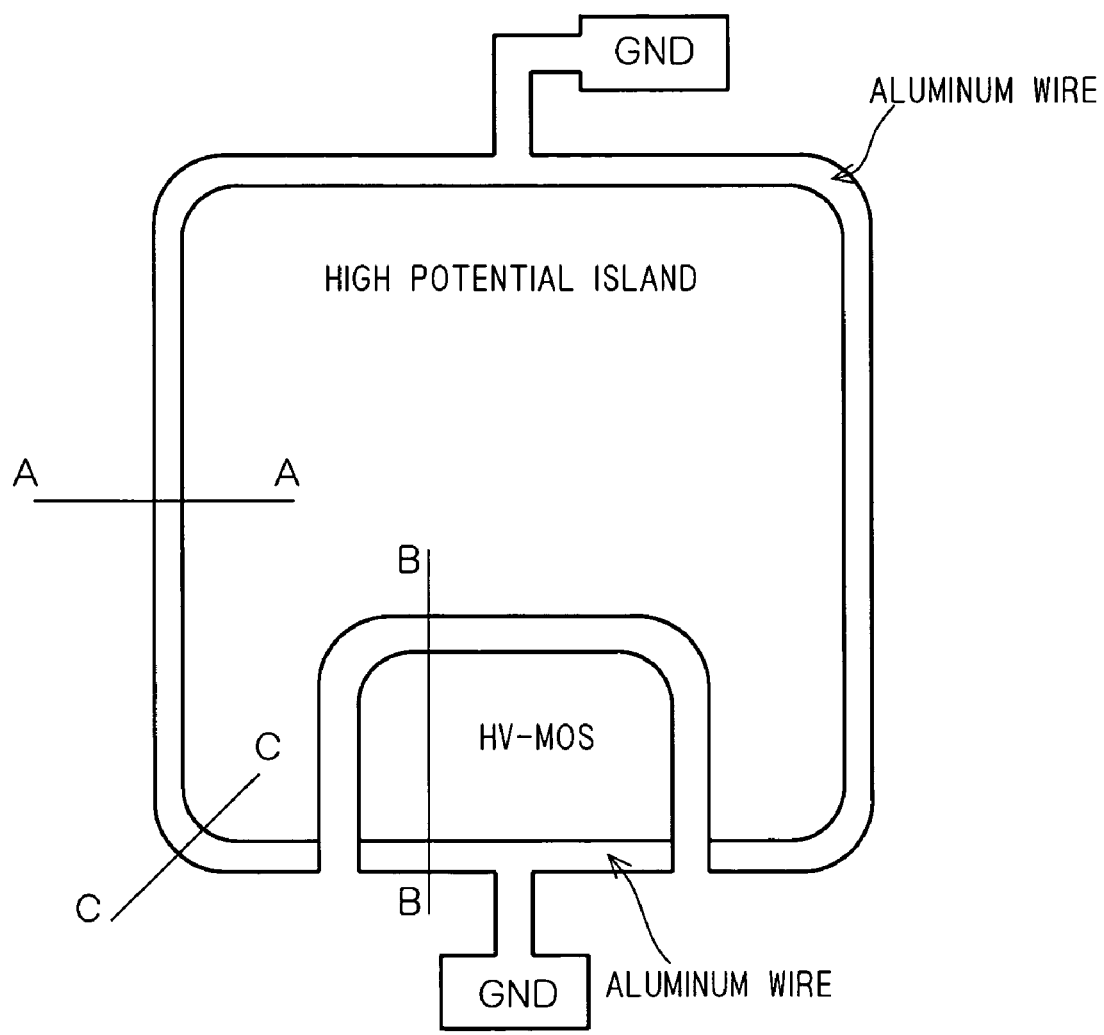
FIG. 3 is a schematic plan view showing a layout of the high side driving unit in the power-device driving apparatus.
Figure 4:
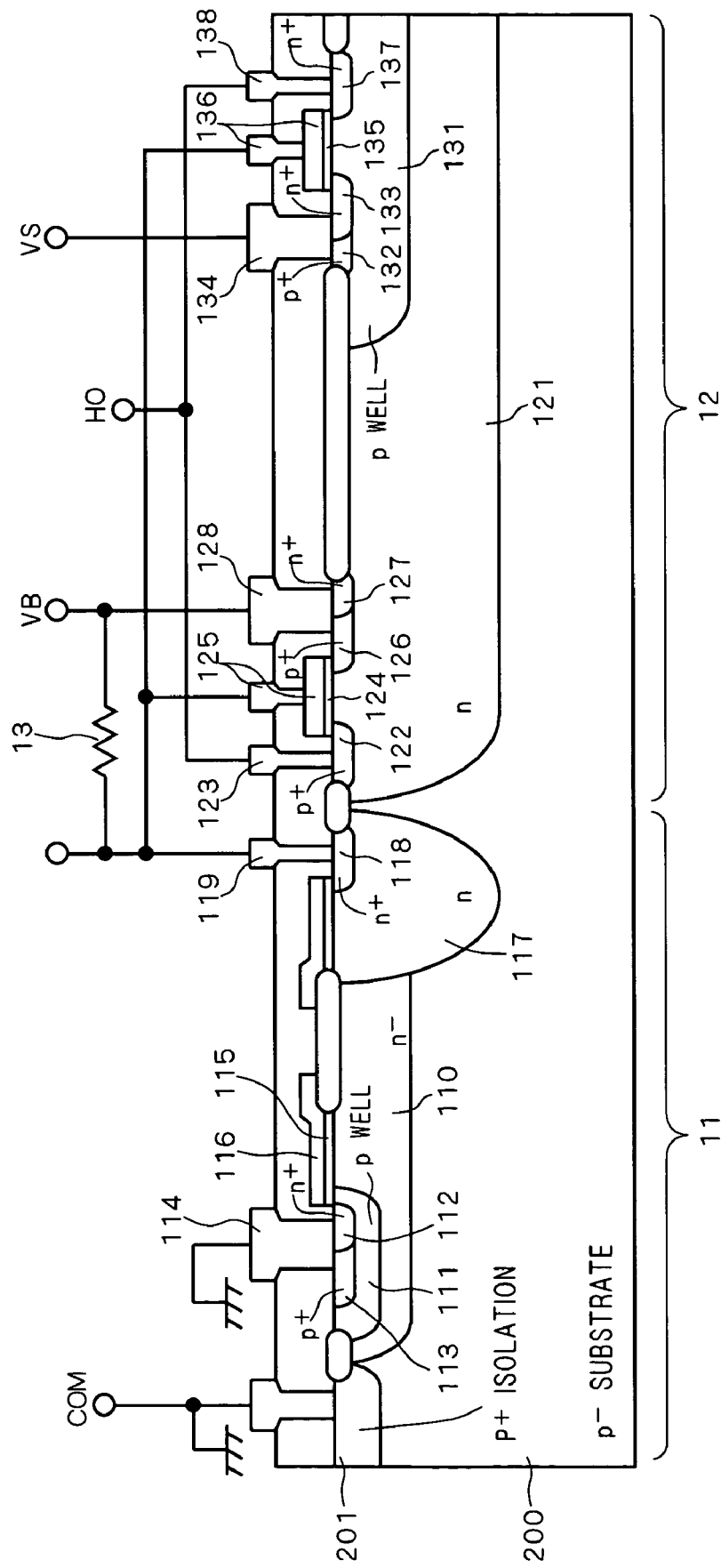
FIGS. 4 and 5 are schematic cross sections each showing a principal part of the high side driving unit in the power-device driving apparatus.

FIG. 3 is a schematic plan view showing a layout of a high potential island in the power-device driving apparatus 100. A high side driving circuit consisting of the high side driving signal output CMOS 12 and the level shifting resistor 13 is formed in a region termed a high potential island. This figure is a schematic plan view showing a layout of the high side driving unit 101. The aluminum wire of this figure is brought into a contact with a ground potential GND. FIG. 4 is a schematic cross section showing a principal part of the high side driving unit 101 of FIG. 2, corresponding to the section of B—B of FIG. 3. In FIG. 4, constituent elements identical to those in FIGS. 1 and 2 are represented by the same reference signs.

A bottom portion of a p$^+$ isolation 201 reaches a p$^-$ region 200 of a silicon substrate (p$^-$ substrate) and potentials of the p$^+$ isolation 201 and the p$^-$ region 200 are the lowest ones in the circuit (the ground potential GND or the common ground COM potential). In a region where the HV-MOS 11 is formed, an n$^-$ layer 110 serving as the first semiconductor region, a p well 111 serving as the second semiconductor region and an n region 117 and an n$^+$ drain region 118 serving as the third semiconductor region, having impurity concentration higher than that of the n$^-$ layer 110 are so formed as to reach an upper surface of the substrate. The p well 111 is so formed inside the n⁻ layer 110 as to come into contact with the n⁻ layer 110. The n region 117 is formed at such a position as to sandwich the n⁻ layer 110 with the p well 111. In other words, the p well 111 is formed on one side of the n⁻ layer 110 and the n region 117 is formed on the other side thereof, sandwiching the n⁻ layer 110.

Inside the p well 111, an n⁺ source region 112 and a p⁺ region 113 are further formed and a source electrode 114 is so formed thereon as to come into contact therewith. In the p well 111 between the n⁺ source region 112 and the n⁻ layer 110, a gate electrode 116 is formed with a gate insulating film 115 interposed therebetween. In other words, the p well 111 functions as a channel region of the HV-MOS 11. A drain electrode 119 of the HV-MOS 11 is so formed on the n⁺ drain region 118 as to be connected thereto.

In an n layer 121 where the pMOS transistor of the high side driving signal output CMOS 12 is formed, a p⁺ drain region 122, an n⁺ region 127 and a p⁺ source region 126 are formed. A drain electrode 123 is formed on the p⁺ drain region 122, a source electrode 128 is formed on the p⁺ source region 126 and the n⁺ region 127 and a gate electrode 125 is formed on the n layer 121 between the p⁺ drain region 122 and the p⁺ source region 126 with a gate insulating film 124 interposed therebetween. On the other hand, in a p well 131 where the nMOS transistor of the high side driving signal output CMOS 12 is formed, a p⁺ region 132, an n⁺ source region 133 and an n⁺ drain region 137 are formed. A source electrode 134 is formed on the p⁺ region 132 and the n⁺ source region 133, a drain electrode 138 is formed on the n⁺ drain region 137, and a gate electrode 136 is formed on the p well 131 between the n⁺ source region 133 and the n⁺ drain region 137 with a gate insulating film 135 interposed therebetween.

The drain electrode 119 of the HV-MOS 11 is connected to the gate electrodes 125 and 136 of the pMOS transistor and the nMOS transistor of the high side driving signal output CMOS 12, respectively, and also connected to the source electrode 128 of the pMOS transistor and the high side floating supply absolute voltage VB with the level shifting resistor 13 interposed therebetween.

Figure 5:
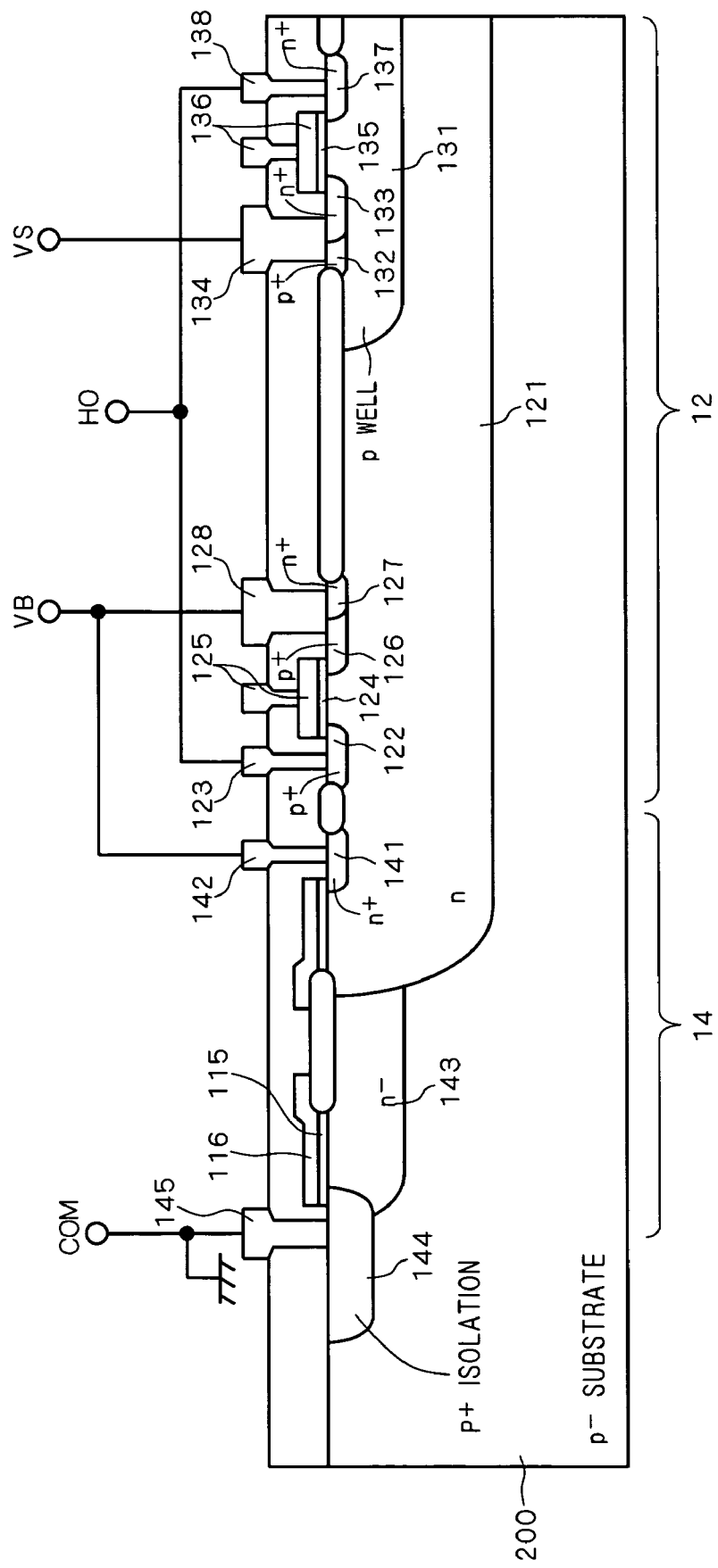

FIG. 5 is another schematic cross section (different from FIG. 4) showing the high side driving unit 101 in the power-device driving apparatus 100, corresponding to the sections of A—A and C—C of FIG. 3. In FIG. 5, constituent elements identical to those in FIG. 4 are represented by the same reference signs. A region 14 of FIG. 5 indicates a high breakdown voltage diode (not shown in FIGS. 1 or 2) connected to the high side driving unit 101.

The high breakdown voltage diode (hereinafter, referred to as an "HV-diode") 14 has a structure like the above-described HV-MOS 11, and an n⁻ layer 143 serving as a first semiconductor region, a p⁺ isolation 144 serving as the second semiconductor region and the n layer 121 and an n⁺ cathode region 141 serving as the third semiconductor region, having impurity concentration higher than that of the n⁻ layer 143 are so formed as to reach an upper surface of the substrate. The p⁺ isolation 144 is in a contact with one side of the n⁻ layer 143, the n layer 121 is in a contact with the other side of the n⁻ layer 143. In other words, the p⁺ isolation 144 and the n layer 121 are so formed as to sandwich the n⁻ layer 143. The p⁺ isolation 144, which functions as an anode of the HV-diode 14, is hereinafter referred to as a "p⁺ anode region 144". A cathode electrode 142 of the HV-diode 14 is so formed on the n⁺ cathode region 141 as to come into contact therewith. An anode electrode 145 is so formed on the p⁺ anode region 144 as to come into contact therewith. The p⁺ anode region 144 reaches the p⁻ region 200. Since the anode electrode 145 is formed on the p⁺ anode region 144, the potential of the n⁻ region 200 is the lowest one (ground potential GND or common ground COM potential) in the circuit. The HV-diode 14 keeps a voltage between the high side floating supply absolute voltage VB and the ground potential GND or the common ground COM potential.

Figure 6:
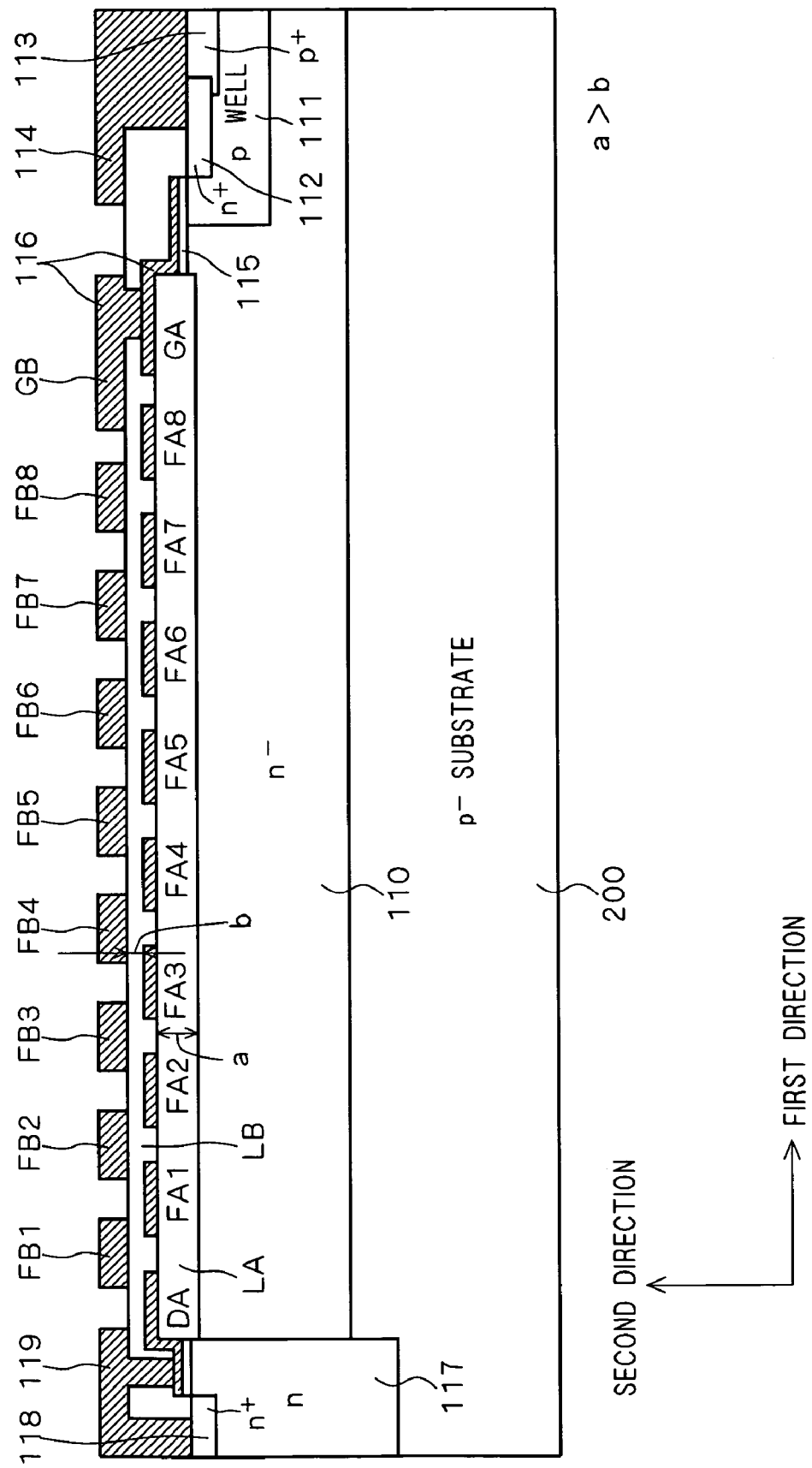
FIG. 6 is a view showing a structure of an HV-MOS in accordance with a first preferred embodiment.

FIG. 6 is a view showing a structure of the HV-MOS in accordance with the first preferred embodiment, which is an enlarged view of the HV-MOS 11 of FIG. 4. In FIG. 6, constituent elements identical to those in FIG. 4 are represented by the same reference signs. In this figure, however, the lateral sides are shown conversely to those of FIG. 4, for convenience of the following discussion.

A first insulating film LA is formed on the n⁻ layer 110. On an upper surface of the first insulating film LA, a plurality of first floating field plates FA (FA1 to FA8) are formed above the n⁻ layer 110. Further on the first floating field plates FA, a second insulating film LB is formed. On an upper surface of the second insulating film LB, a plurality of second floating field plates FB (FB1 to FB8) are formed above the n⁻ layer 110.

In this description, a direction from the third semiconductor region (herein, the n region 117) towards the second semiconductor region (herein, p well 111) is referred to as a "first direction", and a direction of thicknesses of the first insulating film LA and the second insulating film LB as a second direction (indicated by the arrows in FIG. 6). The first floating field plates FA1 to FA8 are aligned in the first direction and the second floating field plates FB1 to FB8 are aligned also in the first direction.

The drain electrode 119 has a portion DA extending on the first insulating film LA, which serves as a normal field plate (not in the floating state) and is hereinafter referred to as a "first drain electrode portion DA". On the other hand, the gate electrode 116 has a portion GA extending on the first insulating film LA and a portion GB extending on the second insulating film LB, both of which serve as normal field plates. Hereinafter, the former is referred to as a "first gate electrode portion GA" and the latter is referred to as a "second gate electrode portion GB".

The first floating field plates FA and the second floating field plates FB accelerate extension of a depletion layer in the n⁻ layer 110 by a field plate effect. The respective first floating field plates FA and respective second floating field plates FB are capacity-coupled to one another with the second insulating film LB interposed therebetween, to thereby form a plurality of capacitors. The second floating field plate FB1 nearest the drain is capacity-coupled to the first drain electrode portion DA with the second insulating film LB interposed therebetween, to thereby form a capacitor. The first floating field plate FA8 nearest the gate is capacity-coupled to the second gate electrode portion GB with the second insulating film LB interposed therebetween, to thereby form a capacitor. These capacitors in large numbers share and keep the high voltage applied between the drain electrode 119 and the source electrode 114 when the HV-MOS is cut off, to thereby determine potentials of the respective first floating field plates FA and those of the respective second floating field plates FB. This prevents excessive acceleration of extension of the depletion layer due to the field plate effect.

Supposing that the first floating field plates FA are one consecutive plate, the extension of the depletion layer is excessively accelerated and an electric field concentration occurs in a surface of the silicon substrate near the drain, thereby hindering an increase of withstand voltage of the HV-MOS. Then, in the first preferred embodiment, a plurality of first floating field plates FA and a plurality of second floating field plates FB are aligned in the first direction, to thereby suppress excessive extension of the depletion layer and ensure an increase of withstand voltage of the HV-MOS.

The HV-MOS of FIG. 6, which has a RESURF structure, ensures further increase of withstand voltage. Specifically, by applying a reverse voltage lower than the breakdown voltage of a pn junction (hereinafter, referred to as a "second pn junction") between the n$^-$ layer 110 and the p well 111 to a pn junction (hereinafter, referred to as a "first pn junction") between the n$^-$ layer 110 and the p$^-$ region 200 (the fourth semiconductor region), the impurity concentration of the n$^-$ layer 110 is made lower and the thickness thereof is made thinner to such a degree that the depletion layer should extend up to the upper surface of the substrate from the first pn junction in the n$^-$ layer 110 between the n region 117 and the p well 111.

In the first preferred embodiment, the first insulating film LA is made thicker and the second insulating film LB is made thinner as compared with those in the conventional structure so that assuming that the thickness of the first insulating film LA is "a" and the distance between the first floating field plates FA and the second floating field plates FB in a second direction (a direction of thickness of the second insulating film LB) is "b", a relation a>b can be held.

Figure 7:
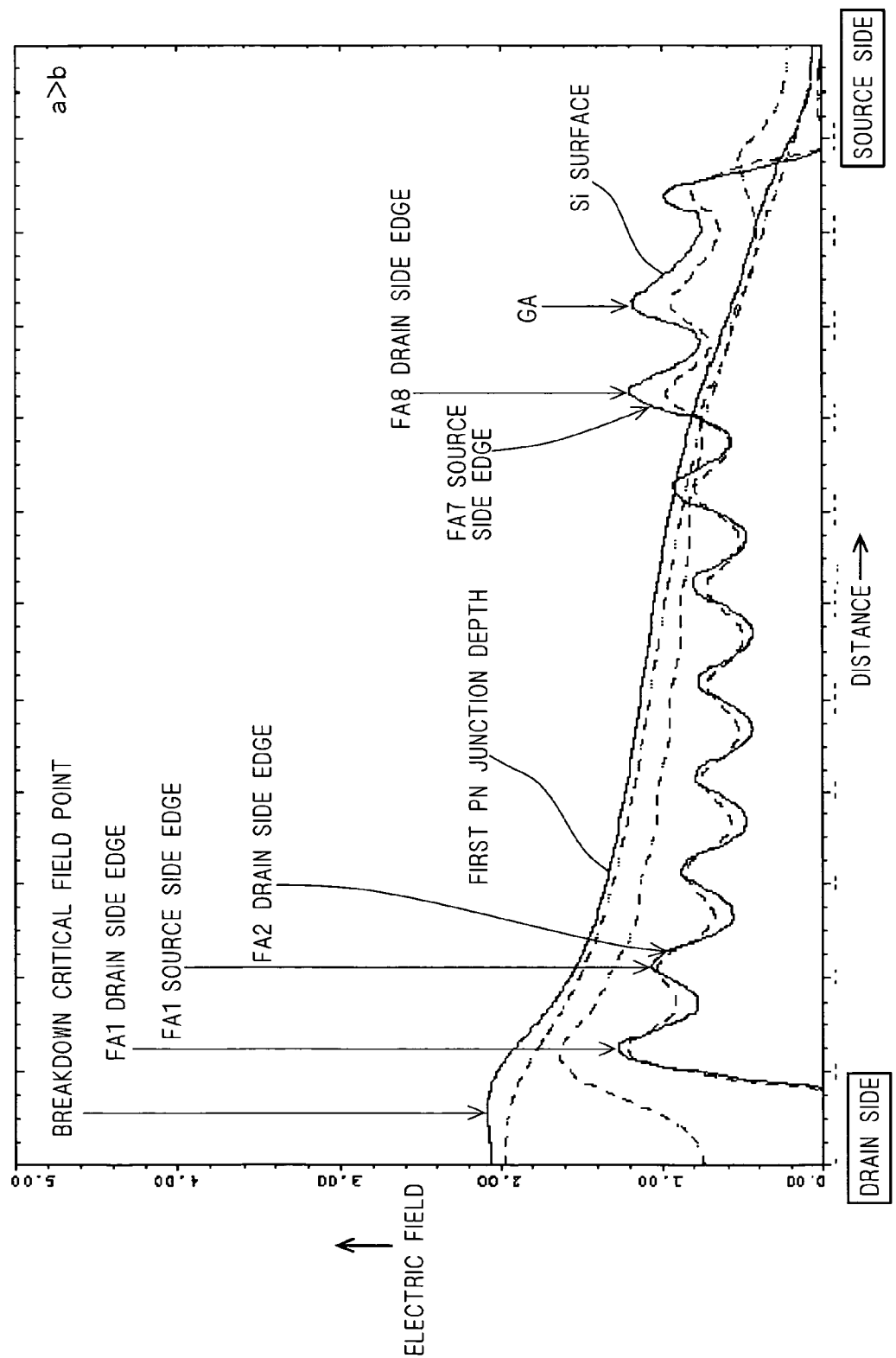
FIG. 7 is a graph showing an electric field distribution between a drain and a source of the HV-MOS in an OFF state in accordance with the first preferred embodiment.

FIG. 7 is a graph showing an electric field distribution inside the HV-MOS of FIG. 6 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p$^-$ region 200. In particularly, the solid lines indicate the electric field distribution in the silicon substrate surface and the electric field distribution in a first pn junction depth between the n$^-$ layer 110 and the p$^-$ region 200. On the other hand, FIG. 8 is a graph showing an electric field distribution in the background-art HV-MOS (where a relation a<b is held in FIG. 6 and the drain electrode 119 and the second floating field plate FB1 are connected to each other), like that in FIG. 7.

Figure 8:
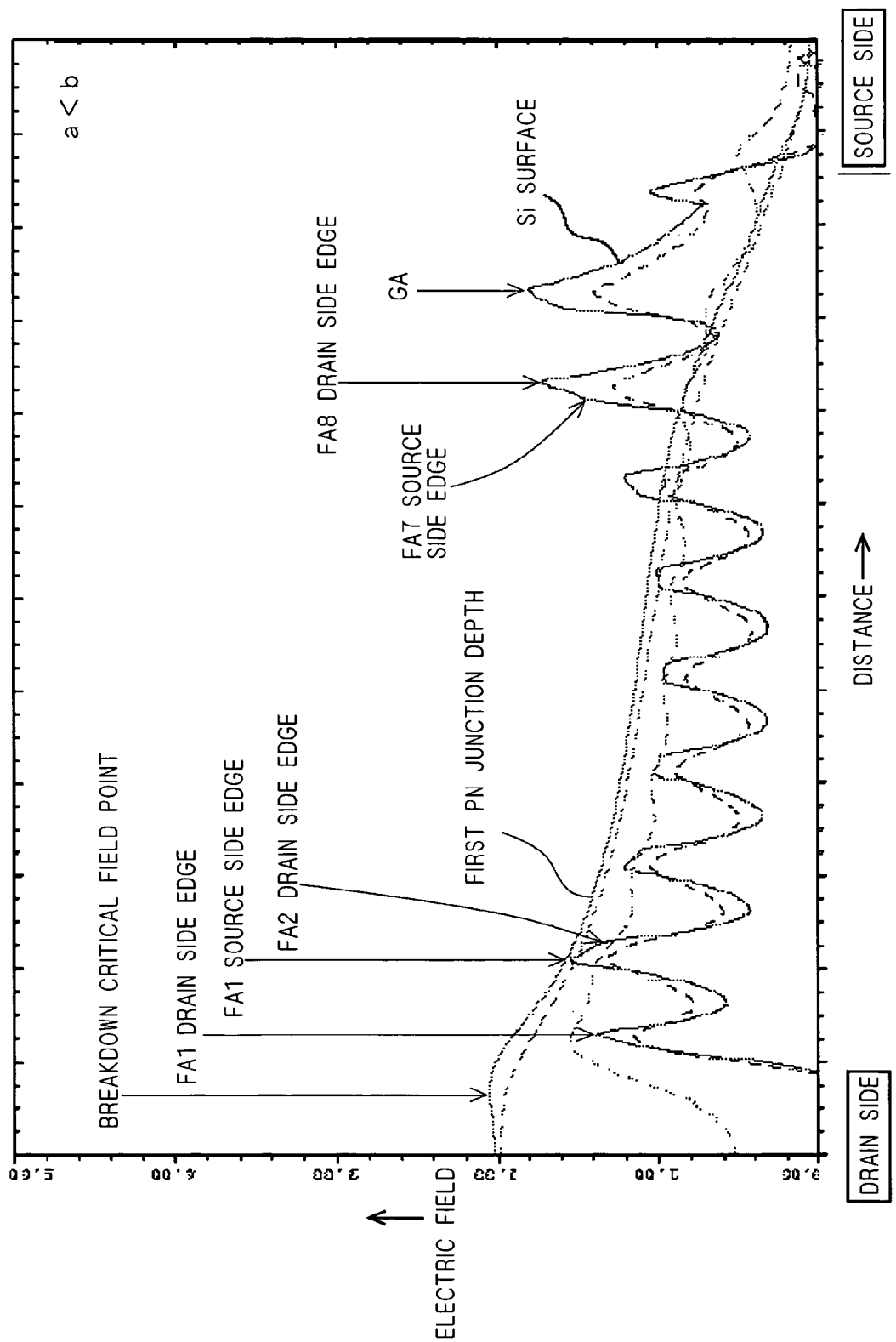
FIG. 8 is a graph showing an electric field distribution between a drain and a source of a background-art HV-MOS in an OFF state.

As can be seen from FIGS. 7 and 8, a portion having the highest electric field strength is a portion near the drain in the first pn junction depth. Therefore, a breakdown critical electric field point that determines a value of the withstand voltage of the HV-MOS is the portion. On the other hand, in the silicon substrate surface, electric field peaks (electric field concentrations) can be observed at a portion below an edge of the first gate electrode portion GA and portions below respective edges of the first floating field plates FA1 to FA8 on their drain side or portions below respective edges thereof on their source side.

As shown in FIG. 8, in the background-art HV-MOS, the electric field peaks in the silicon substrate surface are relatively large and the difference (margin) from the electric field strength at the breakdown critical electric field point is very small. Therefore, the electric field peak in the silicon substrate surface is likely to exceed the electric field strength at the breakdown critical electric field point due to an effect of polarization of the overcoat insulating film or the epoxy resin formed on the HV-MOS during actual use, and this may cause problems such as a decrease in withstand voltage and instability of withstand voltage characteristic.

In contrast to that, in the first preferred embodiment of FIG. 7, the electric field peaks in the silicon substrate surface are relatively small. In other words, the electric field concentration is relieved. Therefore, since the margin with respect to the electric field strength at the breakdown critical electric field point increases and the electric field peak in the silicon substrate surface becomes unlikely to exceed the electric field strength of the breakdown critical electric field point, the problems such as a decrease in withstand voltage and instability of withstand voltage characteristic can be suppressed. As a result, the HV-MOS can keep a high withstand voltage with stability.

Figure 9:
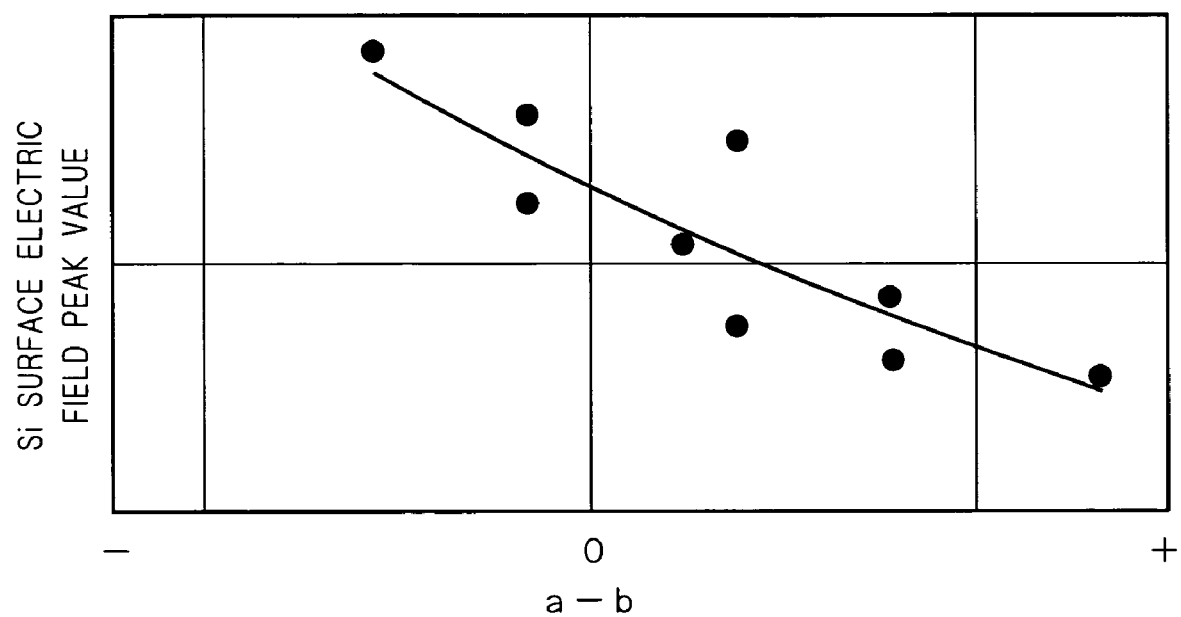
FIG. 9 is a graph for explanation on an effect of the first preferred embodiment.

FIG. 9 is a graph showing a relation between a value of (a–b) and a value of the electric field peak in the silicon substrate surface. It is found from this figure that as a value of (a–b) becomes larger, a value of the electric field peak becomes smaller. In other words, by increasing the value of (a–b) with the thickness "a" increased and the distance "b" decreased, the margin with respect to the electric field strength at the breakdown critical electric field point increases and the above effect can be increased.

Figure 10:
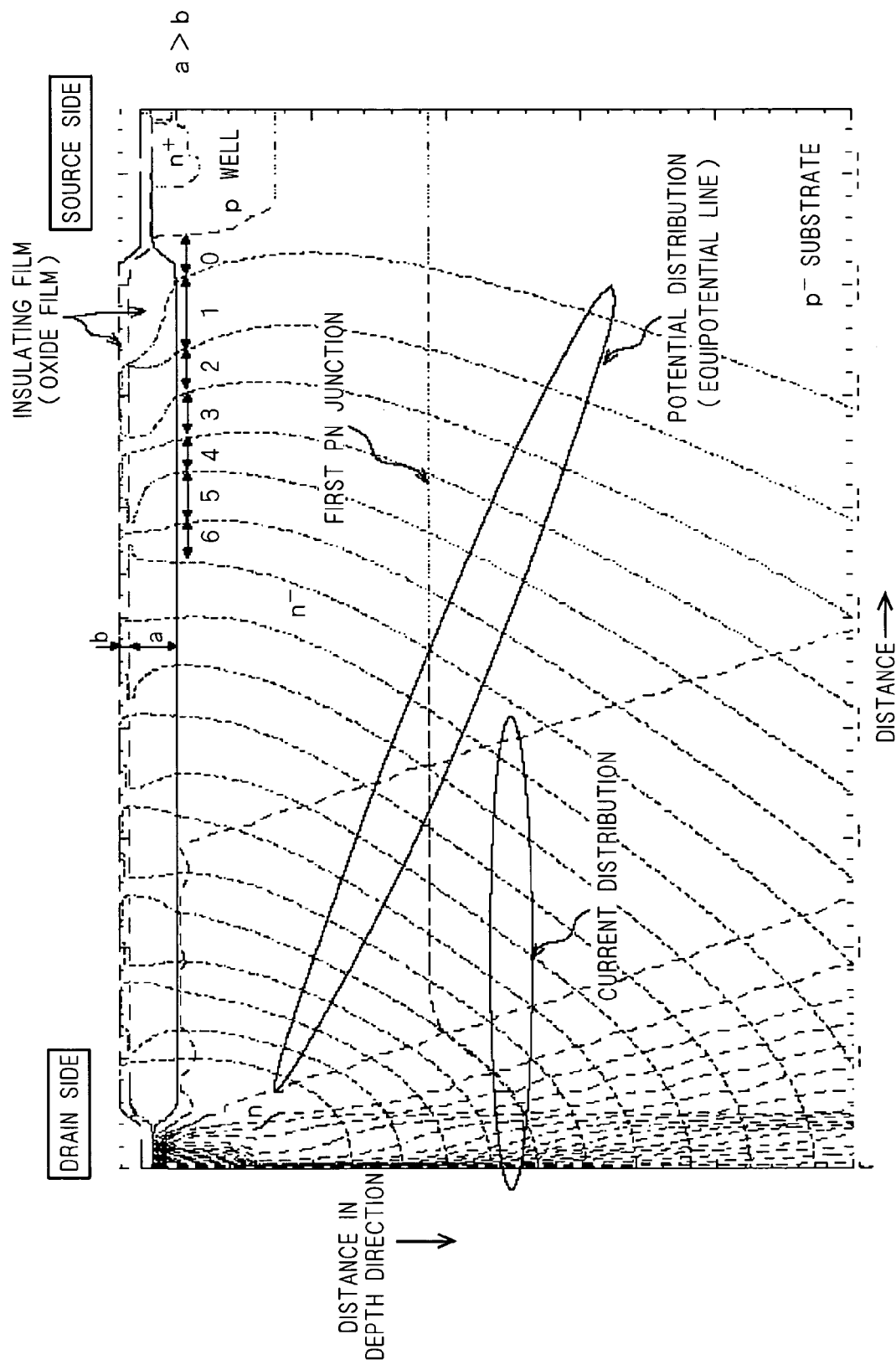
FIG. 10 is a graph showing a potential distribution and a current distribution between the drain and the source of the HV-MOS in an OFF state in accordance with the first preferred embodiment.

FIG. 10 is a graph showing a potential distribution and a current distribution inside the HV-MOS of FIG. 6 at a time when a high voltage is applied between the drain electrode 119 and the source electrode 114 in an OFF state of the HV-MOS. The potential distribution is indicated by equipotential lines, and its shape corresponds to the extension of the depletion layer from the source side towards the drain side. On the other hand, FIG. 11 is a graph showing a potential distribution and a current distribution in the background-art HV-MOS (where a relation a<b is held in FIG. 6), like those in FIG. 10.

Figure 11:
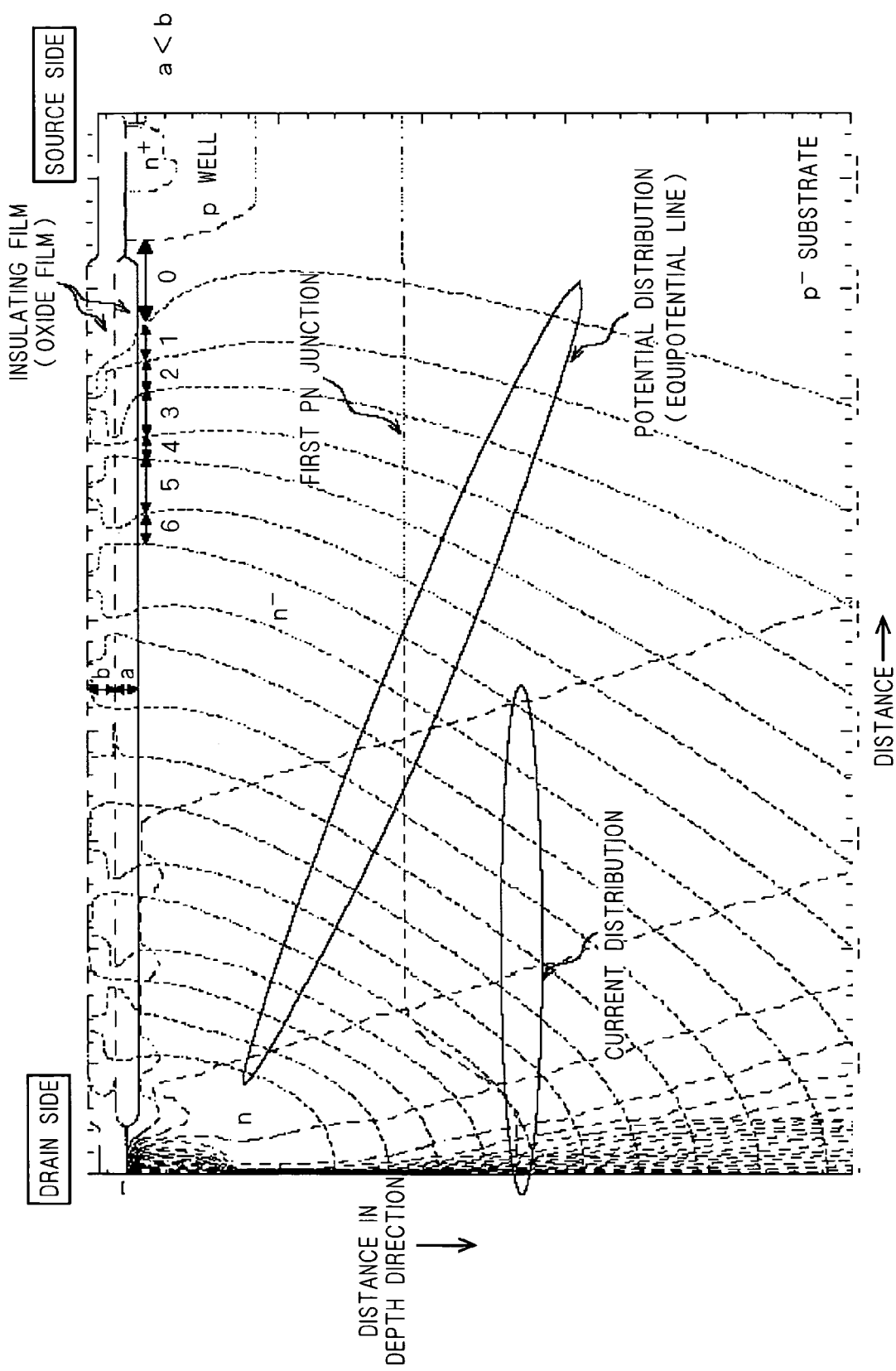
FIG. 11 is a graph showing a potential distribution and a current distribution between the drain and the source of the background-art HV-MOS in an OFF state.

Reference numerals 0 to 6 of FIGS. 10 and 11 represent intervals of the equipotential lines in the silicon substrate surface (in the interface between the n$^-$ layer 110 and the first insulating film LA). In the HV-MOS of the first preferred embodiment, distortion in the equipotential lines is suppressed in the first insulating film LA as shown in FIG. 10 since the thickness "a" of the first insulating film LA is large, and the sizes of the intervals thereby become more uniform than those in the background-art case of FIG. 11. This means that extension of the depletion layer near the silicon substrate surface in the HV-MOS of the first preferred embodiment is more uniform than that in the background-art structure. Since the electric field concentration becomes unlikely to occur when the extension of the depletion layer becomes uniform, the magnitude of the electric field peak in the silicon substrate surface is reduced to lower in the HV-MOS of the first preferred embodiment. Thus, also from the potential distribution of FIG. 10, the effect discussed referring to FIG. 7 can be observed.

Figure 12:
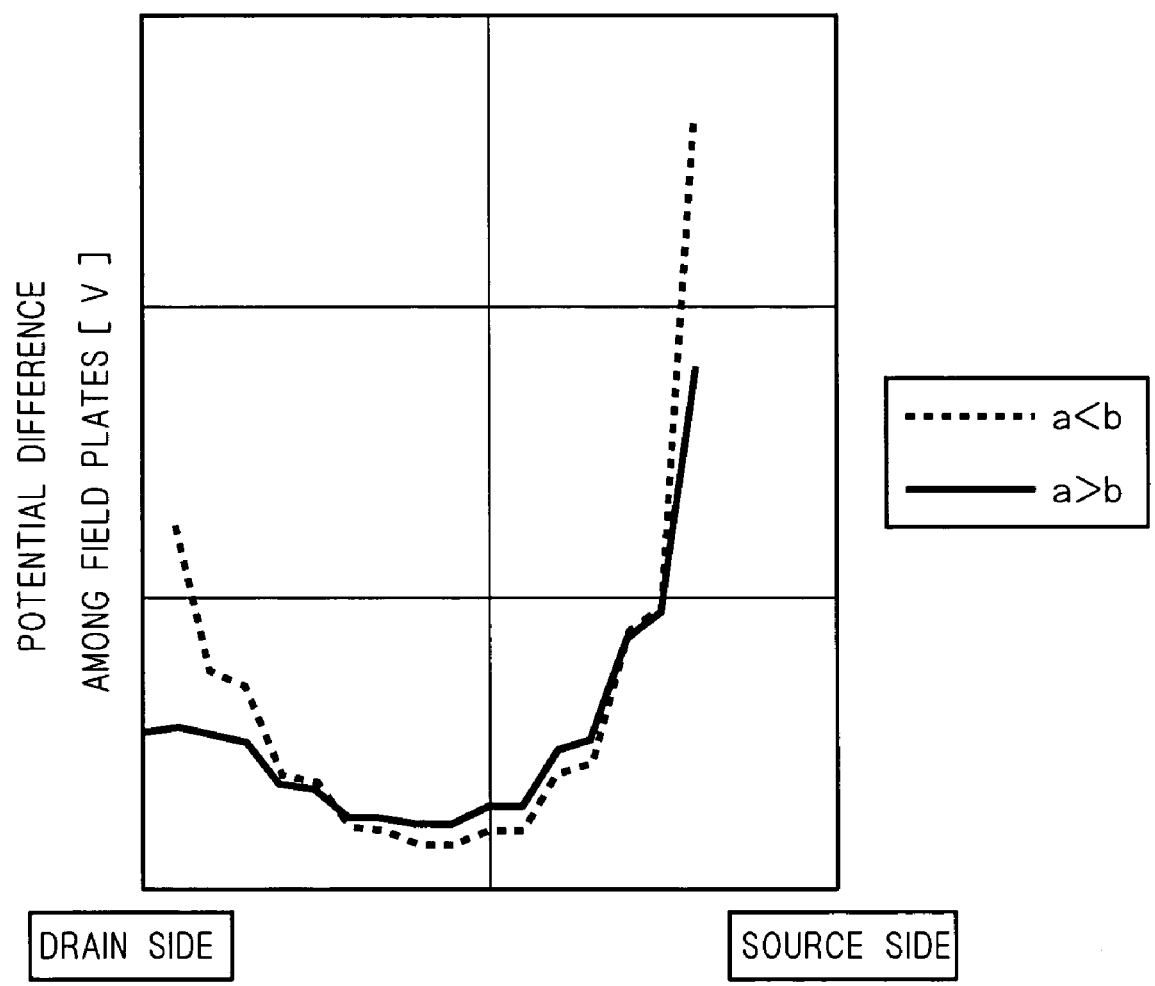
FIG. 12 is a graph for explanation on an effect of the first preferred embodiment.

FIG. 12 is a graph showing a distribution of potential differences held in the capacitors formed among the first floating field plates FA, the second floating field plates FB, the first drain electrode portion DA, the first gate electrode portion GA and the second gate electrode portion GB, between the drain and the source, at a time when a high voltage is applied between the source and the drain of the HV-MOS in an OFF state. In FIG. 12, the solid line indicates a distribution in the HV-MQS of the first preferred embodiment shown in FIG. 6 and the dotted line indicates a distribution in the background-art HV-MOS (where a relation a<b is held and the drain electrode 119 and the second floating field plate FB1 is connected to each other in FIG. 6). In the background-art HV-MOS, a high voltage tends to be kept especially in the capacitors near the source side and the drain side and there is a possibility of causing dielectric breakdown of the second insulating film LB at those portions. As shown in FIG. 12, the tendency decreases in the HV-MOS of the first preferred embodiment and variation of potential differences held in the capacitors becomes smaller. In short, the first preferred embodiment produces an effect of preventing the dielectric breakdown of the second insulating film LB, leading to an increase in withstand voltage of the HV-MOS.

In the HV-MOS of the first preferred embodiment, since the distance "b" between the first floating field plates FA and the second floating field plates FB in the direction of thickness (the second direction) is made smaller, capacitance values of the capacitors increase. Therefore, since the capacity coupling effect in the capacitors increases, the polarization of the second insulating film LB is accelerated. In the background-art structure, the depletion layer in an upper portion of the $n^-$ layer 110 is easy to extend below the respective first floating field plates FA but it is hard to extend below gaps among the first floating field plates FA. In the first preferred embodiment, however, the high capacity coupling effect in the capacitors accelerates the polarization of the second insulating film LB and this produces an effect of making the extension of the depletion layer easier even below the gaps among the first floating field plates FA, leading to an increase in withstand voltage of the HV-MOS.

As discussed above, the present invention can be applied to a semiconductor device having a RESURF structure. This allows a further increase in withstand voltage as compared with the conventional RESURF structure. Further, the present invention can be applied to a multi-RESURF structure where the $n^-$ layer 110 has a multilayer structure in which respective layers have different impurity concentrations (shown in, e.g., U.S. Pat. No. 4,422,089).

Figure 13:
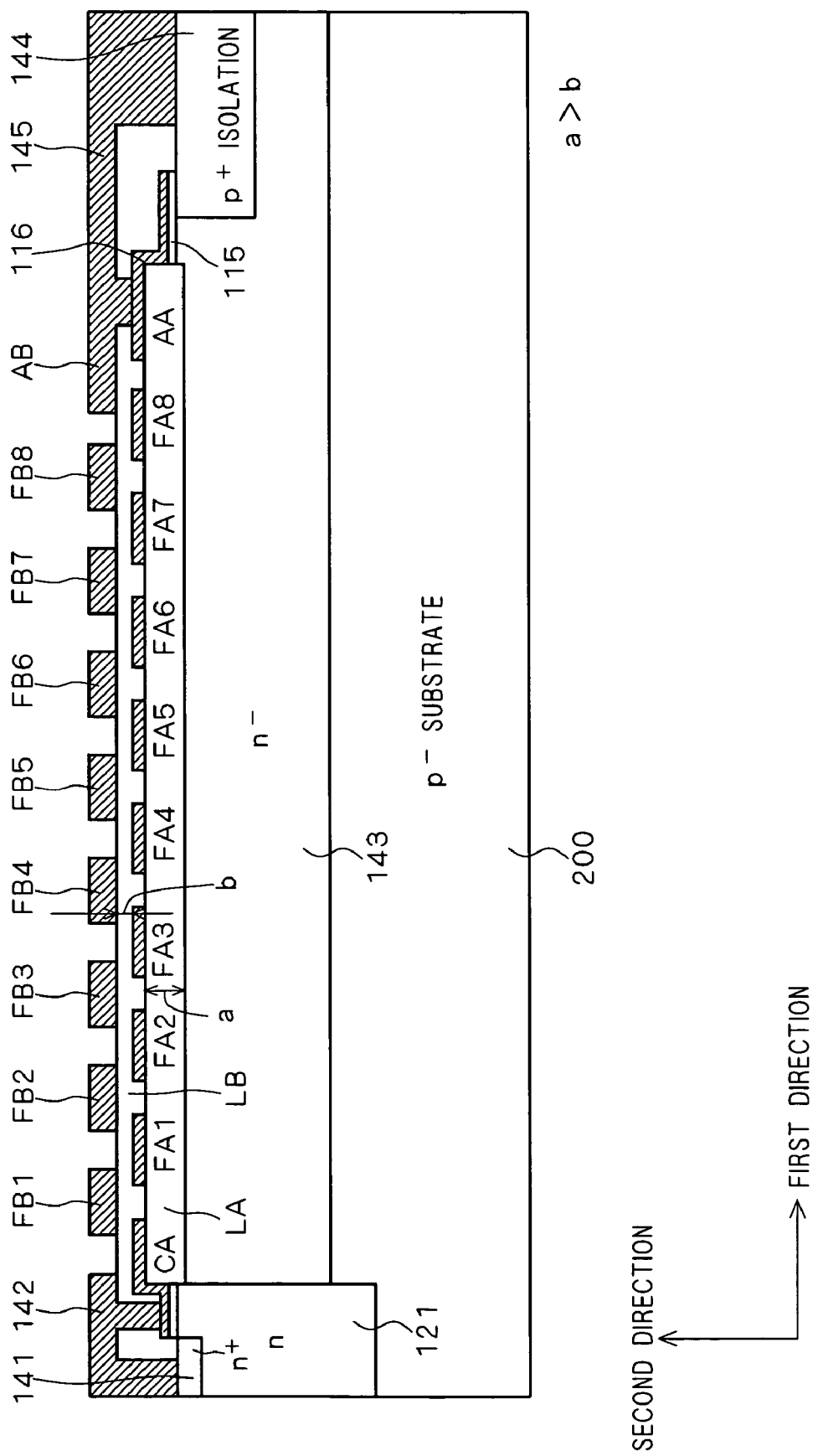
FIG. 13 is a view showing a case where the invention of the first preferred embodiment is applied to a high breakdown voltage diode (HV-diode)

Though the case where the present invention is applied to a MOSFET has been discussed above, application of the present invention is not limited to this but the present invention can be widely applied to, e.g., a diode, an IGBT or the like. FIG. 13 is a view showing a case where the first preferred embodiment is applied to a high breakdown voltage diode (HV-diode), and is an enlarged view of the HV-diode of FIG. 5. Since constituent elements identical to those in FIGS. 5 and 6 are represented by the same reference signs, detailed description thereof will be omitted. Also in this figure, the lateral sides are shown conversely to those of FIG. 5, for convenience of the following discussion.

The cathode electrode 142 has a portion CA extending on the first insulating film LA, which functions as a normal field plate. This portion is hereinafter referred to as a "first cathode electrode portion CA". The anode electrode 145 has a portion AA extending on the first insulating film LA and a portion AB extending on the second insulating film LB, both of which function as normal field plates. Hereinafter, the portion AA is referred to as a "first anode electrode portion AA" and the portion AB is referred to as a "second anode electrode portion AB".

In the HV-diode 14, as discussed above, since the $n^-$ layer 143 serves as the first semiconductor region, the $p^+$ anode region 144 serves as the second semiconductor region and the n layer 121 serves as the third semiconductor region, the "first direction" in this case is a direction from the n layer 121 towards the $p^+$ anode region 144. (see the arrows of FIG. 13).

Also the HV-diode 14 has the RESURF structure. Specifically, by applying a reverse voltage lower than the breakdown voltage of the second pn junction between the $n^-$ layer 143 and the $p^+$ anode region 144 to the first pn junction between the $n^-$ layer 143 and the $p^-$ region 200 (the fourth semiconductor region), the impurity concentration of the $n^-$ layer 143 becomes lower and the thickness thereof becomes thinner to such a degree that the depletion layer should extend up to the upper surface of the substrate from the first pn junction in the $n^-$ layer 143 between the n layer 121 and the $p^+$ anode region 144.

Also in the HV-diode of FIG. 13, the first insulating film LA is made thicker and the second insulating film LB is made thinner as compared with those in the conventional structure so that assuming that the thickness of the first insulating film LA is "a" and the distance between the first floating field plates FA and the second floating field plates FB in the second direction is "b", a relation a>b can be held. Also in the HV-diode which satisfies the relation a>b, the electric field peak in the silicon substrate surface becomes lower and the electric field concentration is relieved, and therefore the same effect of, e.g., suppressing the problems such as a decrease in withstand voltage and instability of withstand voltage characteristic as discussed above can be produced.

<The Second Preferred Embodiment>

Figure 14:
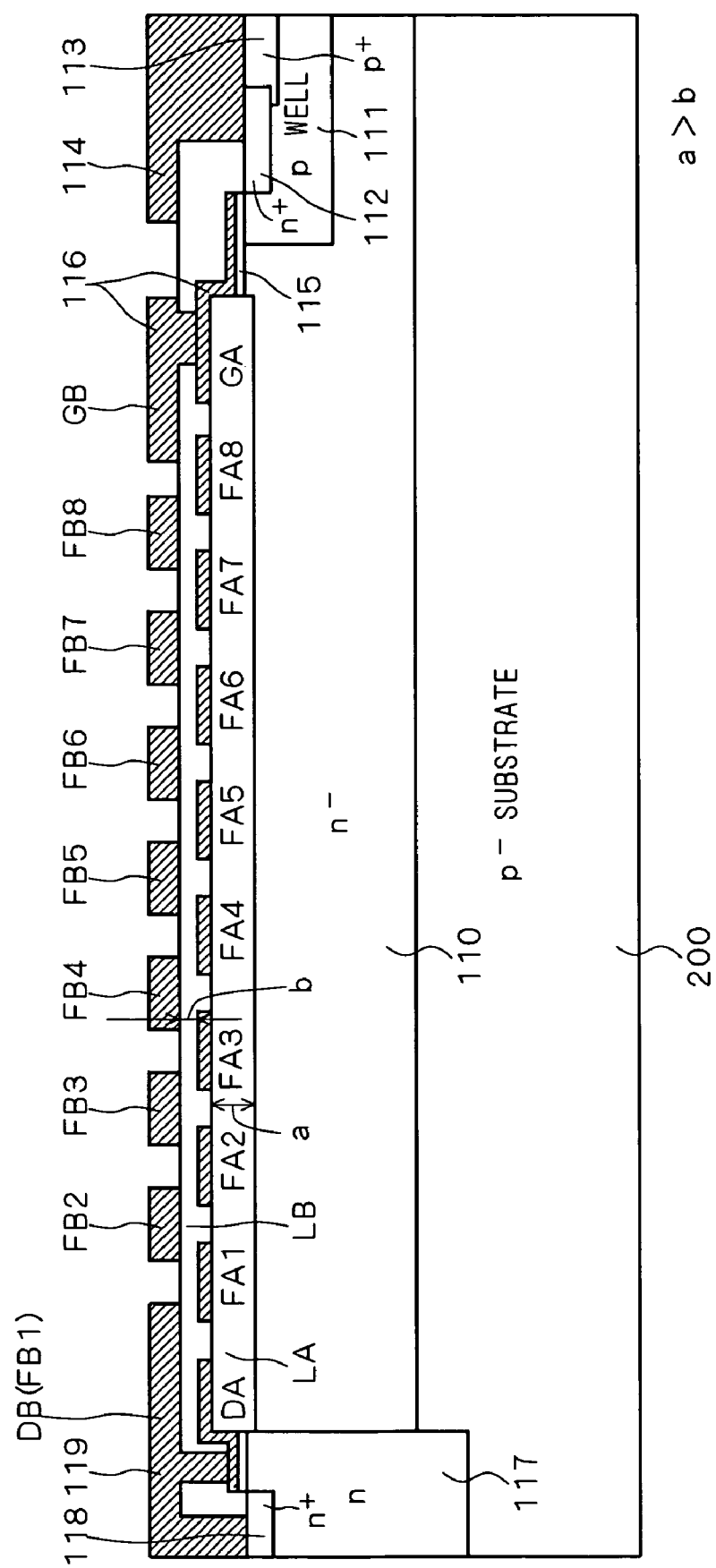
FIG. 14 is a view showing a structure of an HV-MOS in accordance with a second preferred embodiment.

FIG. 14 is a view showing a structure of an HV-MOS in accordance with the second preferred embodiment. The HV-MOS of the second preferred embodiment is different from the HV-MOS of the first preferred embodiment shown in FIG. 6 in that the drain electrode 119 has a portion DB extending on the second insulating film LB. This portion DB functions as a normal field plate (not in the floating state) and is hereinafter referred to as a "second drain electrode portion DB".

As shown in FIG. 14, the length of a portion in the second drain electrode portion DB which extends above the first insulating film LA along the first direction (the direction from the n region 117 towards the $n^+$ source region 112) is longer than the length of a portion in the first drain electrode portion DA which extends on the first insulating film LA along the first direction. In other words, the second drain electrode portion DB covers the first drain electrode portion DA with the second insulating film LB interposed therebetween. The second drain electrode portion DB partially overlaps part of the first floating field plate FA1 with the second insulating film LB interposed therebetween. In other words, as shown in FIG. 14, the second drain electrode portion DB is a portion where the second floating field plate FB1 is connected to the drain electrode 119 of FIG. 6.

Figure 15:
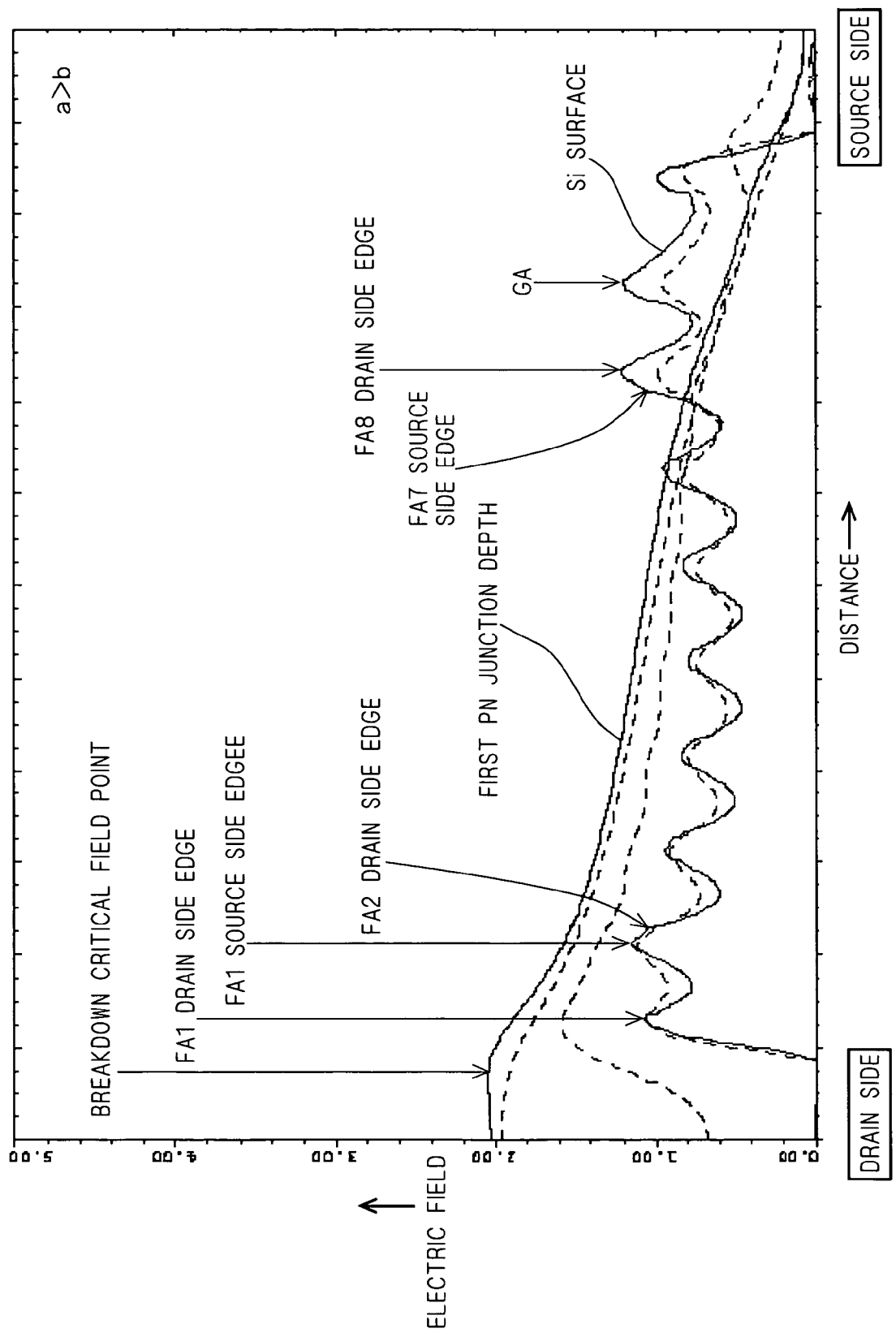
FIG. 15 is a graph showing an electric field distribution between a drain and a source of the HV-MOS in an OFF state in accordance with the second preferred embodiment.

FIG. 15 is a graph showing an electric field distribution inside the HV-MOS of FIG. 14 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the $p^-$ region 200. In particularly, the solid lines indicate the electric field distribution in the silicon substrate surface and the electric field distribution in the first pn junction depth between the $n^-$ layer 110 and the $p^-$ region 200.

As can be seen from comparison between FIG. 15 and FIG. 7 of the first preferred embodiment, in the second preferred embodiment, the electric field peak below an edge portion of the first floating field plate FA1 on the drain side in the silicon substrate surface can be relieved. With this, since the electric field strength near the breakdown critical electric field point (a portion in the first pn junction depth of the n region 117 on the drain side) becomes lower, the withstand voltage in the HV-MOS increases. In short, the second preferred embodiment can achieve a further increase in withstand voltage as compared with the first preferred embodiment.

Figure 16:
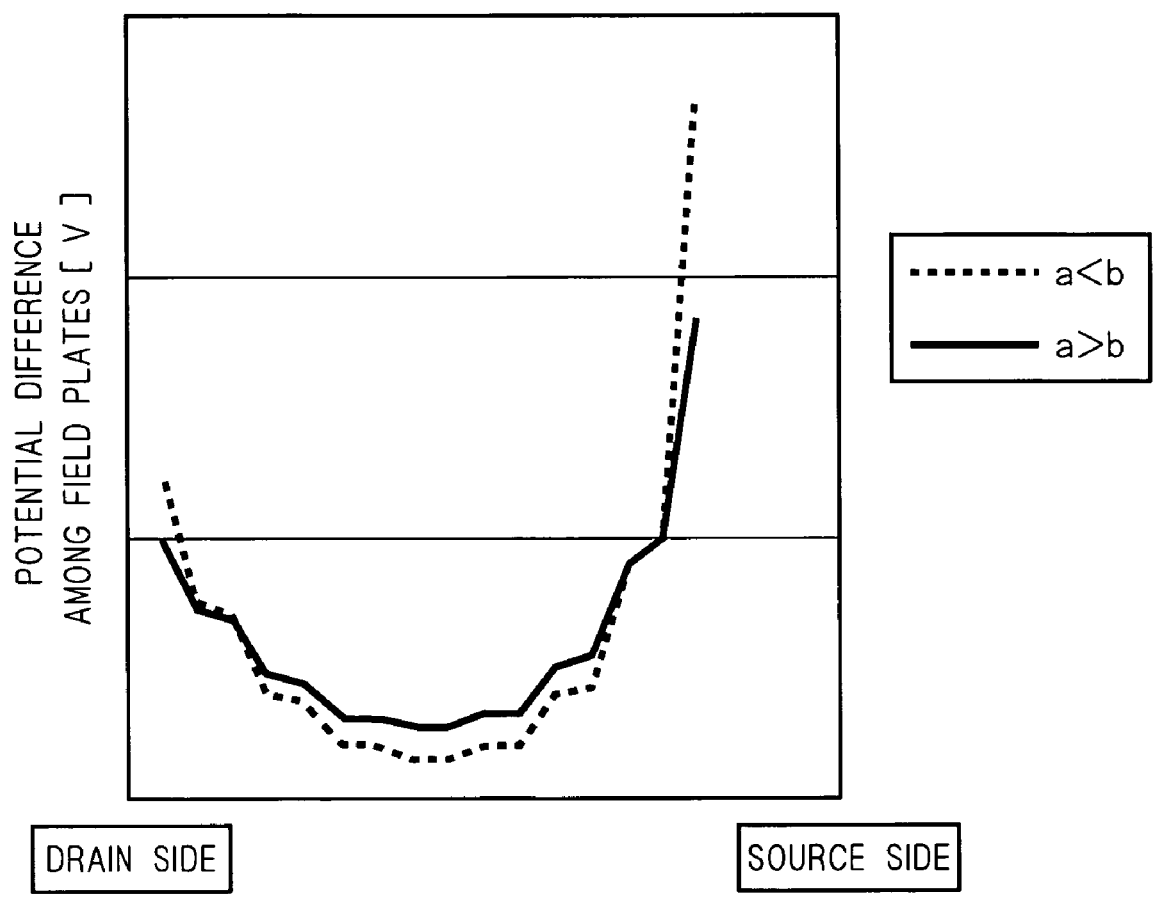
FIG. 16 is a graph for explanation on an effect of the second preferred embodiment.

FIG. 16 is a graph showing a distribution of potential differences held in the capacitors formed among the first floating field plates FA, the second floating field plates FB, the first drain electrode portion DA, the first gate electrode portion GA and the second gate electrode portion GB, between the drain and the source, at a time when a high voltage is applied between the source and the drain of the HV-MOS in an OFF state. In FIG. 16, the solid line indicates a distribution in the HV-MOS of the second preferred embodiment shown in FIG. 14 and the dotted line indicates a distribution in the background-art HV-MOS (where a relation a<b is held in FIG. 14). It is found in the second preferred embodiment that variation of potential differences held in the capacitors becomes smaller, like in the first preferred embodiment. In short, the second preferred embodiment also produces an effect of preventing the dielectric breakdown of the second insulating film LB, leading to an increase in withstand voltage of the HV-MOS.

<The Third Preferred Embodiment>

Figure 17:
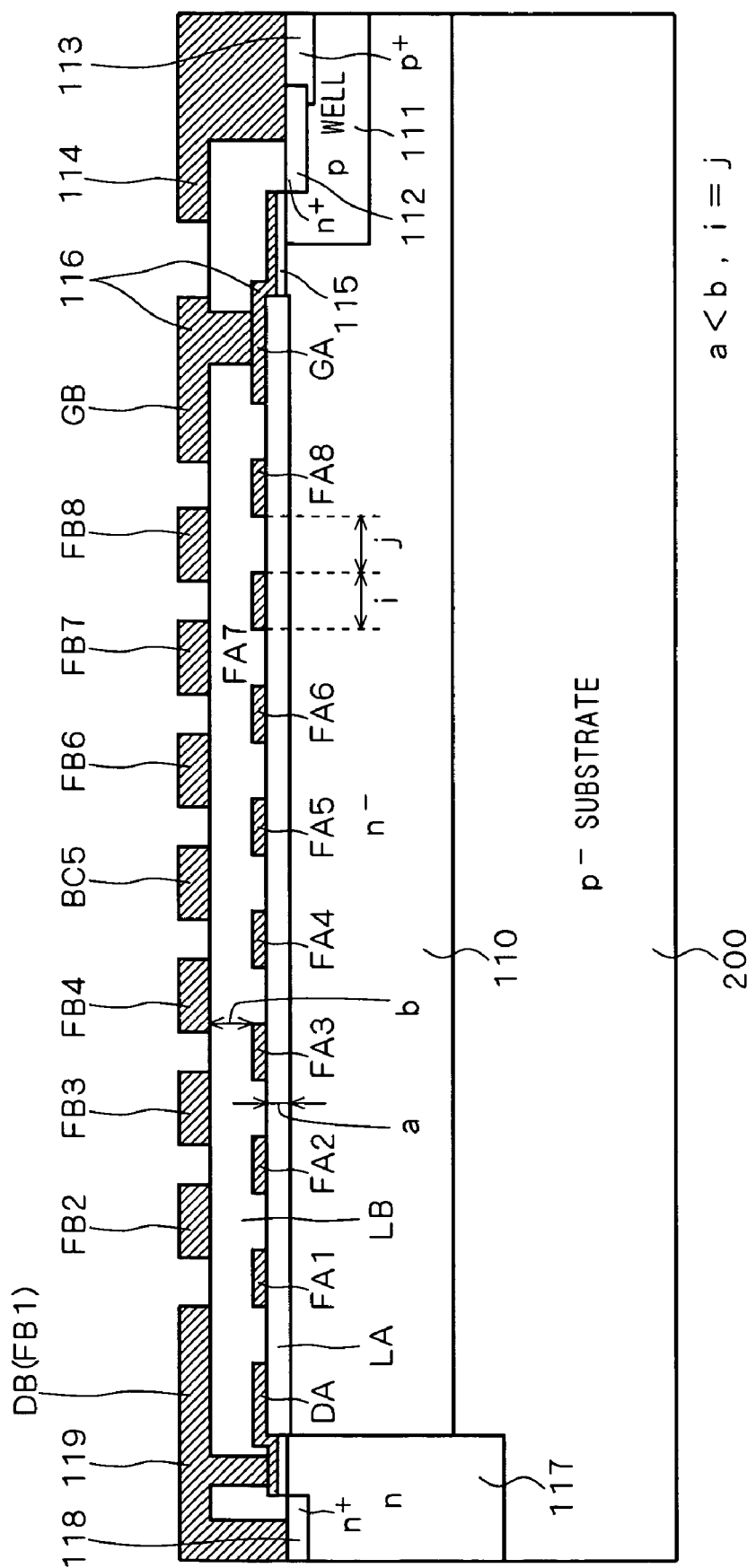
FIG. 17 is a view showing a structure of an HV-MOS in accordance with a third preferred embodiment.

FIG. 17 is a view showing a structure of an HV-MOS in accordance with the third preferred embodiment. In FIG. 17, since constituent elements identical to those in FIGS. 6 and 14 are represented by the same reference signs, detailed description thereof will be omitted.

In the third preferred embodiment, the width of each of the first floating field plates FA is made equal to the interval of the first floating field plates FA. In other words, assuming that the width of each of the first floating field plates FA in the first direction (from the n region 117 towards the n⁺ source region 112) is "i" and the distance between one and its adjacent one of the first floating field plates FA in the first direction is "j", a relation i=j is held. Further, in the case of FIG. 17, the relation between the thickness "a" (the thickness of the first insulating film LA) and the distance "b" (the distance between the first floating field plates FA and the second floating field plates FB in the second direction) is a<b like in the background-art structure. FIG. 17 of the third preferred embodiment is not different from FIG. 14 of the second preferred embodiment in other than the above.

Figure 18:
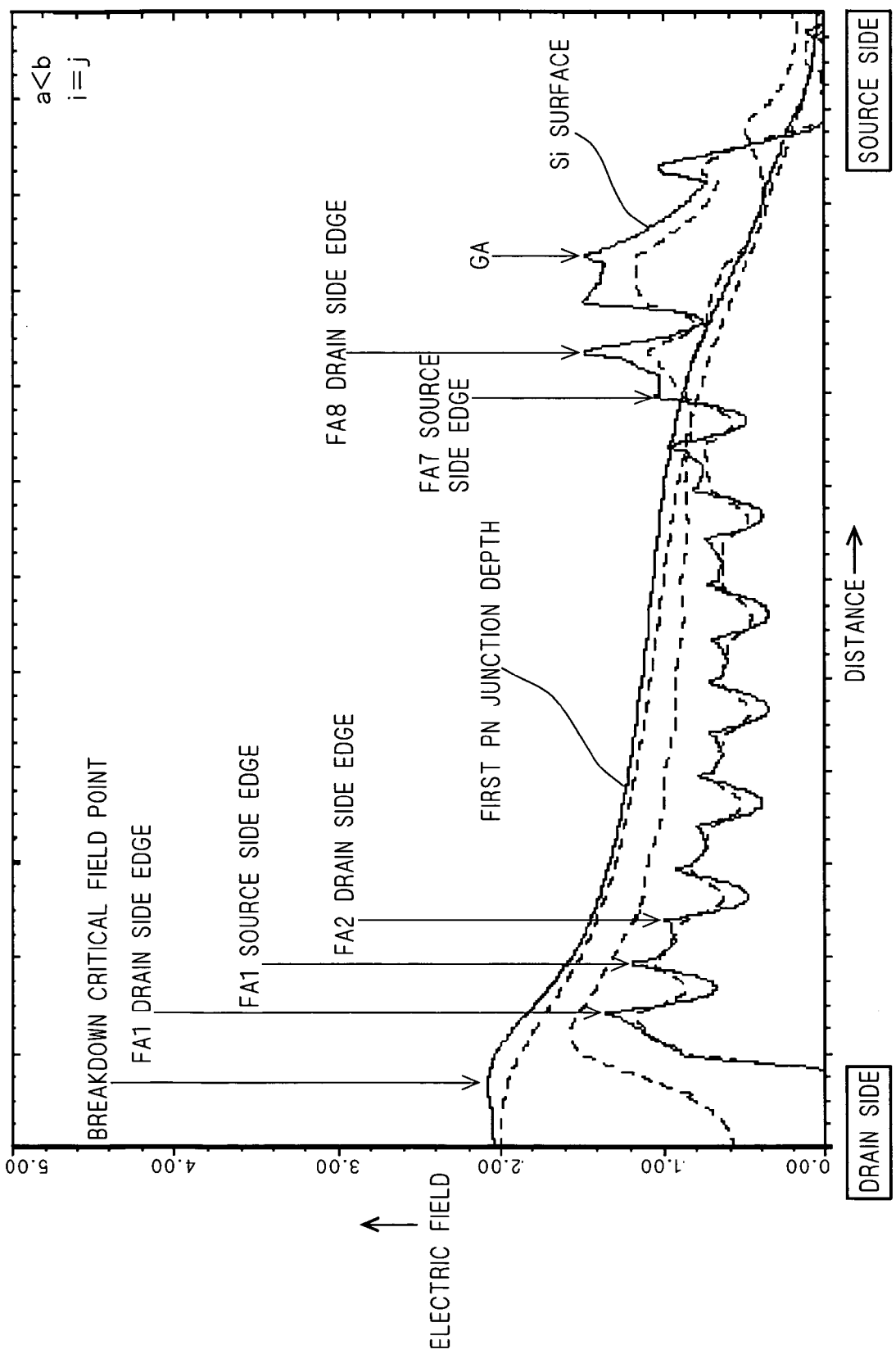
FIG. 18 is a graph showing an electric field distribution between a drain and a source of the HV-MOS in an OFF state in accordance with the third preferred embodiment.

FIG. 18 is a graph showing an electric field distribution inside the HV-MOS of FIG. 17 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p⁻ region 200. In particularly, the solid lines indicate the electric field distribution in the silicon substrate surface and the electric field distribution in the first pn junction depth between the n⁻ layer 110 and the p⁻ region 200. As can be seen from comparison between FIG. 18 and FIG. 8 showing the electric field distribution in the background-art HV-MOS, in FIG. 18 of the third preferred embodiment, the electric field peak in the silicon substrate surface becomes lower and the electric field concentration is relieved. Therefore, since the margin with respect to the electric field strength at the breakdown critical electric field point increases and the electric field peak in the silicon substrate surface becomes unlikely to exceed the electric field strength of the breakdown critical electric field point, the problems such as a decrease in withstand voltage and instability of withstand voltage characteristic can be suppressed. As a result, the HV-MOS can keep a high withstand voltage with stability.

Figure 19:
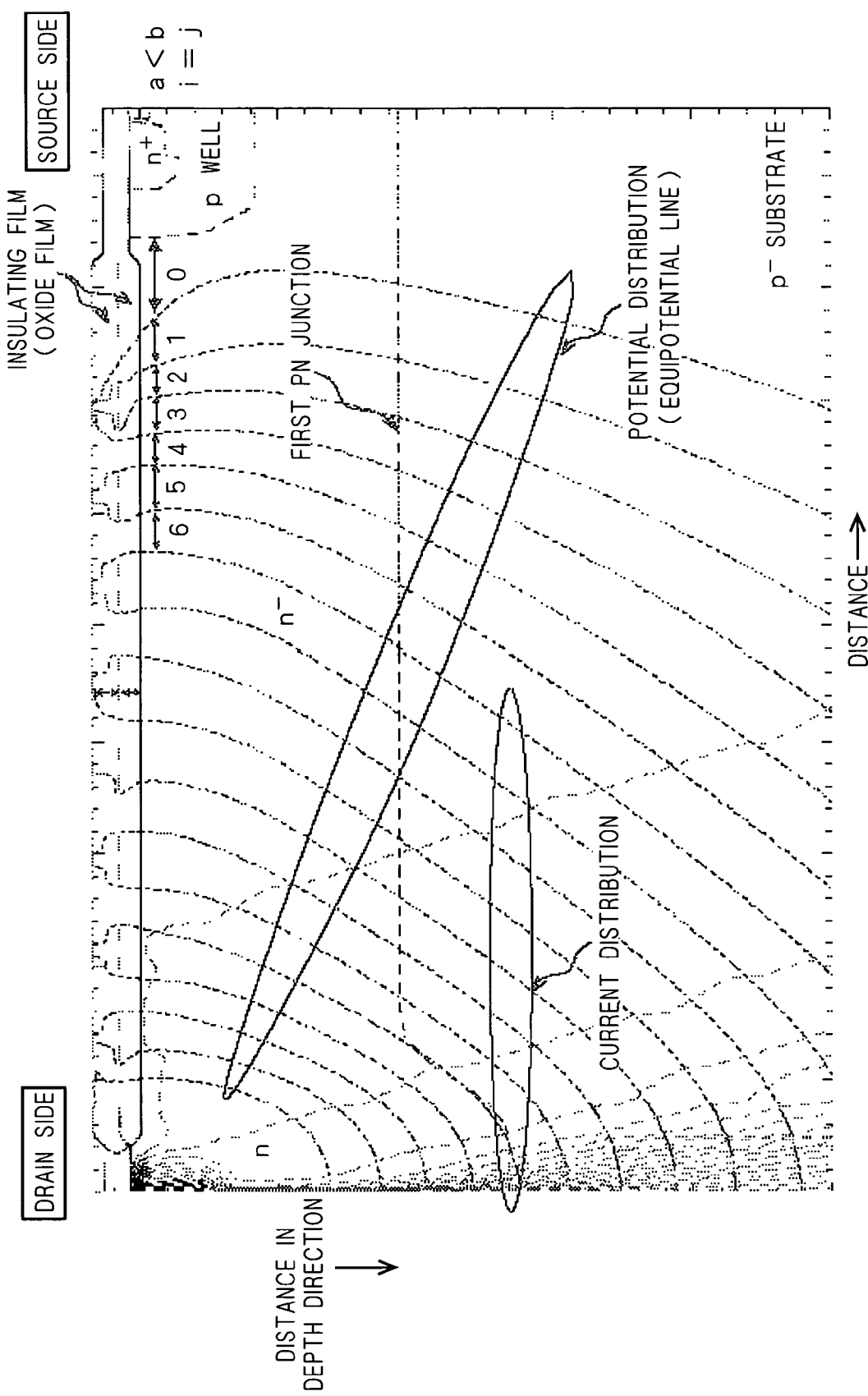
FIG. 19 is a graph showing a potential distribution and a current distribution between the drain and the source of the HV-MOS in an OFF state in accordance with the third preferred embodiment.

FIG. 19 is a graph showing a potential distribution and a current distribution inside the HV-MOS of FIG. 17 at a time when a high voltage is applied between the drain electrode 119 and the source electrode 114 in an OFF state of the HV-MOS. Also in FIG. 19, the potential distribution is indicated by equipotential lines, and reference numerals 0 to 6 represent intervals of the equipotential lines in the silicon substrate surface (in the interface between the n⁻ layer 110 and the first insulating film LA). In the third preferred embodiment, since the width of each of the first floating field plates FA is made equal to the distance between one and its adjacent one of the first floating field plates FA, the sizes of the intervals 0 to 6 become more uniform than those in the background-art case of FIG. 11. In short, in the HV-MOS of the third preferred embodiment, extension of the depletion layer near the silicon substrate surface is more uniform than that in the background-art structure and therefore the magnitude of the electric field peak at that portion is reduced to lower. Thus, from the potential distribution of FIG. 19, the above effect can be observed.

Though the relation between the thickness "a" and the distance "b" is a<b in FIG. 17, the relation of "a" and "b" may be a>b with the first preferred embodiment applied to the third preferred embodiment. In this case, the third preferred embodiment can also produce the effect of the first preferred embodiment and achieve a further increase in withstand voltage.

Also in the third preferred embodiment, though the case where the present invention is applied to a MOSFET has been discussed, application of the present invention is not limited to this but the present invention can be widely applied to, e.g., a diode, an IGBT or the like.

<The Fourth Preferred Embodiment>

Figure 20:
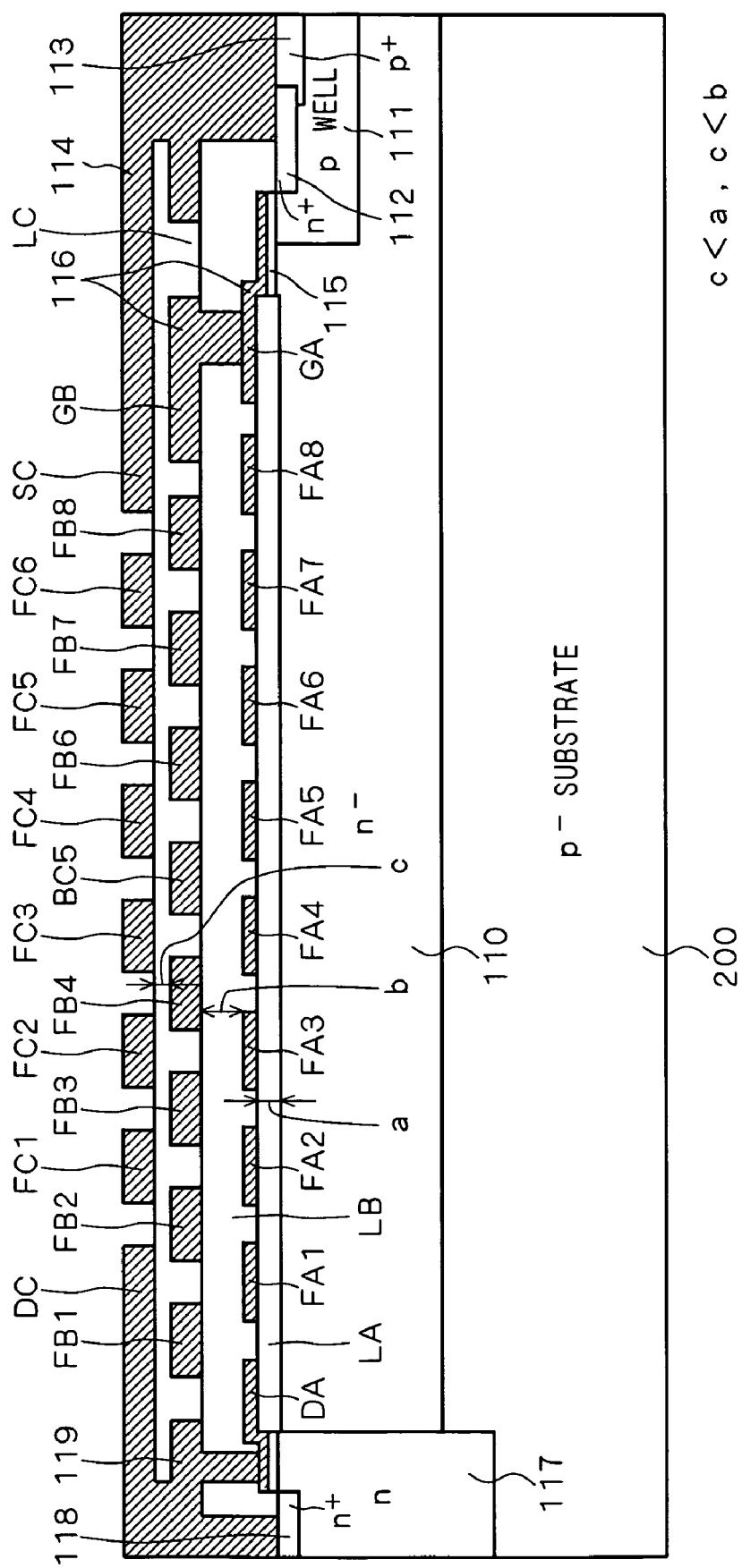
FIG. 20 is a view showing a structure of an HV-MOS in accordance with a fourth preferred embodiment.

FIG. 20 is a view showing a structure of an HV-MOS in accordance with the fourth preferred embodiment. In FIG. 20, since constituent elements identical to those in FIGS. 6 and 14 are represented by the same reference signs, detailed description thereof will be omitted.

The HV-MOS of the fourth preferred embodiment further has a third insulating film LC formed on the second floating field plates FB and a plurality of third floating field plates FC (FC1 to FC6) formed thereon, additionally to the constitution of the HV-MOS of FIG. 6. The third floating field plates FC are aligned above the n⁻ layer 110 in the first direction (the direction from the n region 117 towards the n⁺ source region 112). Then, assuming that the thickness of the first insulating film LA is "a", the distance between the first floating field plates FA and the second floating field plates FB in the second direction (the direction of thicknesses of the first insulating film LA, the second insulating film LB and the third insulating film LC) is "b" and the distance between the second floating field plates FB and the third floating field plates FC in the second direction is "c", the distance "c" is made smaller (the third insulating film LC is made thinner) so that relations c<a and c<b can be held. In the case of FIG. 20, the relation between the thickness "a" and the distance "b" is a<b like in the background-art structure.

Further, the drain electrode 119 has a portion DC extending on the third insulating film LC, and this portion DC functions as a normal field plate (not in the floating state). Hereinafter, this portion is referred to as a "third drain electrode portion DC". On the other hand, the source electrode 114 has a portion SC extending on the third insulating film LC, and this portion SC functions as a normal field plate. Hereinafter, this portion is referred to as a "third source electrode portion SC".

Figure 21:
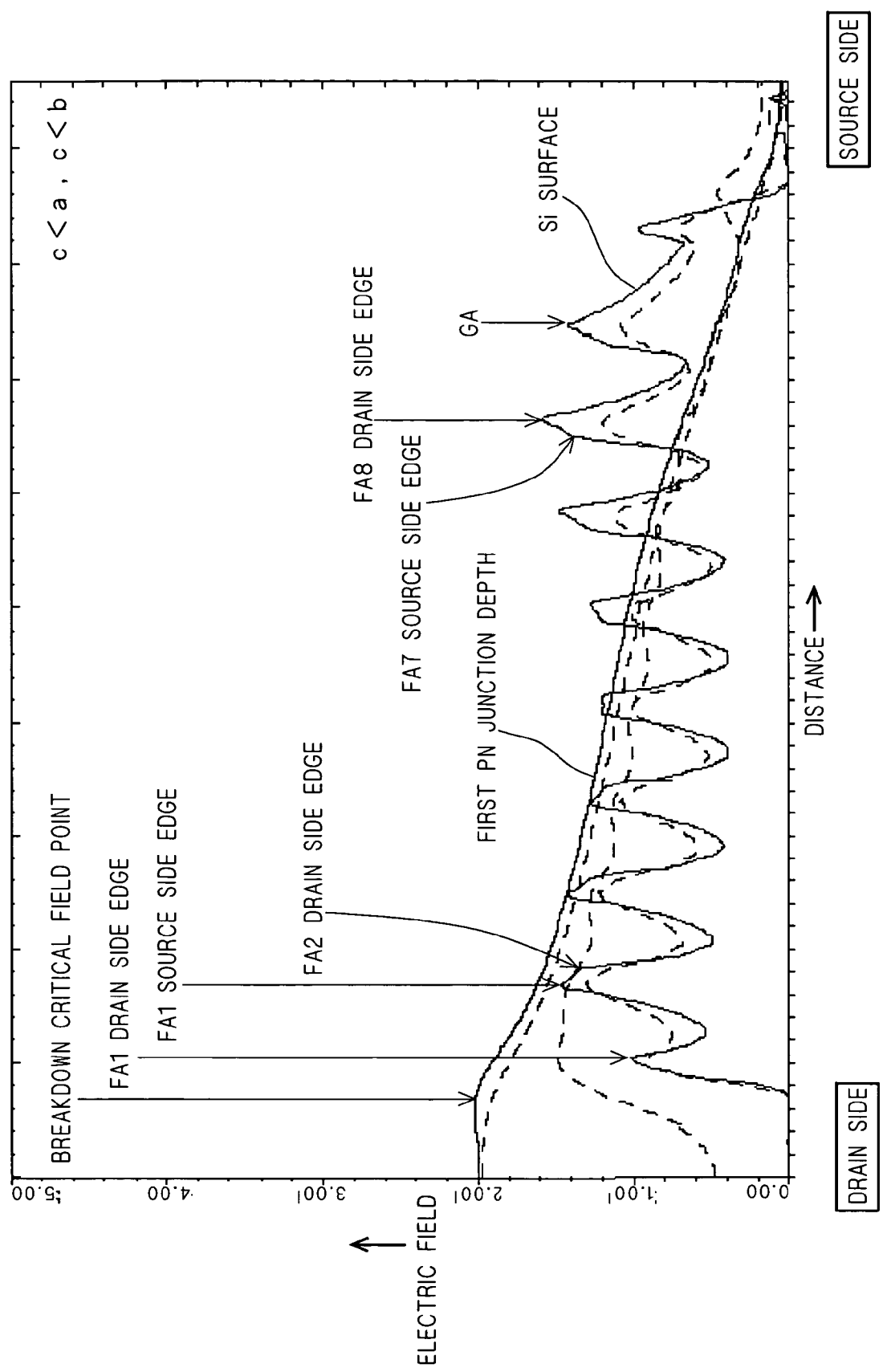
FIG. 21 is a graph showing an electric field distribution between a drain and a source of the HV-MOS in an OFF state in accordance with the fourth preferred embodiment.

FIG. 21 is a graph showing an electric field distribution inside the HV-MOS of FIG. 20 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p⁻ region 200. In particularly, the solid lines indicate the electric field distribution in the silicon substrate surface and the electric field distribution in the first pn junction depth between the n⁻ layer 110 and the p⁻ region 200. As can be seen from comparison between FIG. 21 and FIG. 8 showing the electric field distribution in the background-art HV-MOS, in FIG. 21 of the fourth preferred embodiment, the electric field peak in the silicon substrate surface becomes lower and the electric field concentration is relieved. Therefore, since the margin with respect to the electric field strength at the breakdown critical electric field point increases and the electric field peak in the silicon substrate surface becomes unlikely to exceed the electric field strength of the breakdown critical electric field point, the problems such as a decrease in withstand voltage and instability of withstand voltage characteristic can be suppressed. As a result, the HV-MOS can keep a high withstand voltage with stability.

Figure 22:
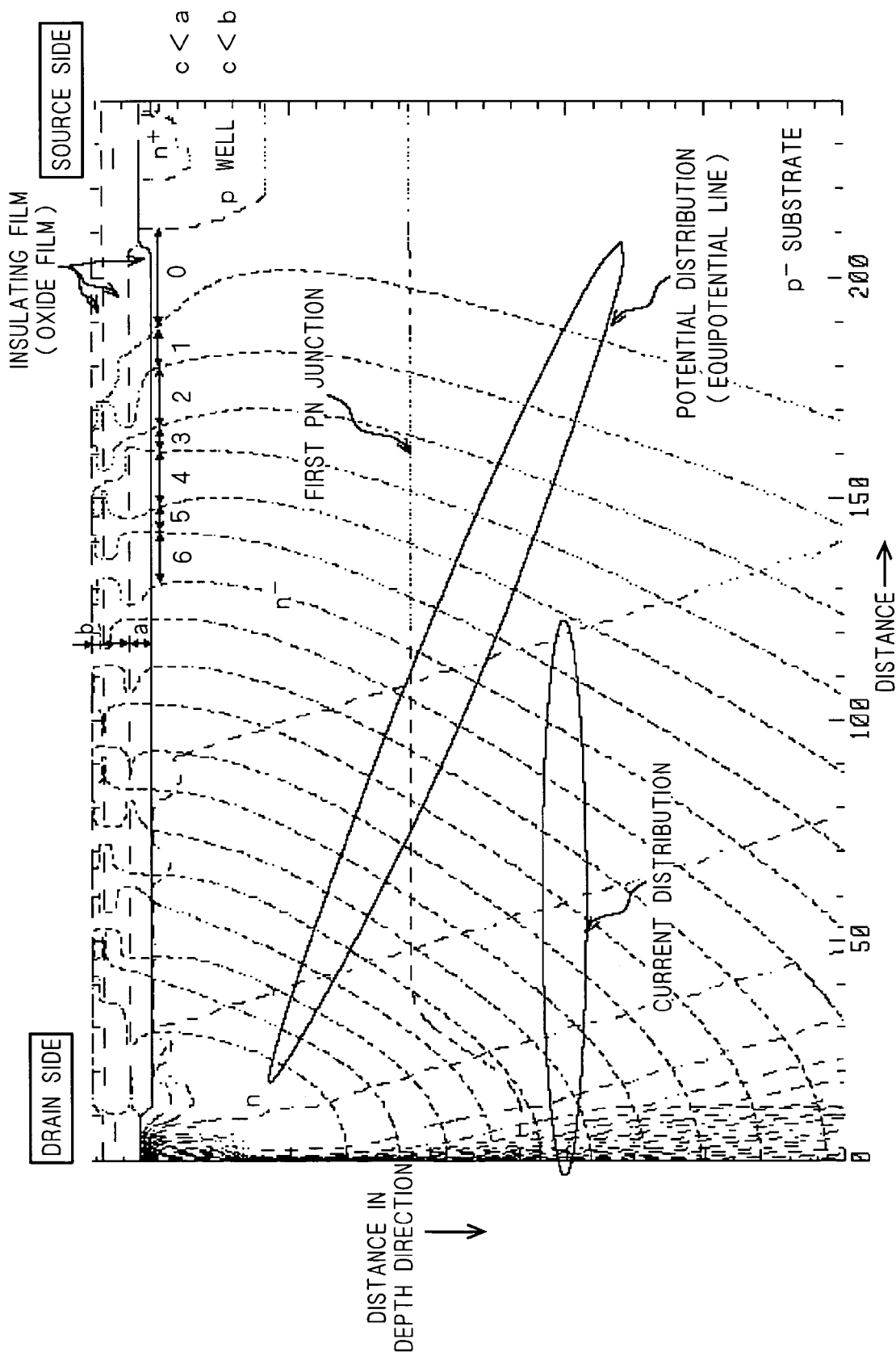
FIG. 22 is a graph showing a potential distribution and a current distribution between the drain and the source of the HV-MOS in an OFF state in accordance with the fourth preferred embodiment.

FIG. 22 is a graph showing a potential distribution and a current distribution inside the HV-MOS of FIG. 20 at a time when a high voltage is applied between the drain electrode 119 and the source electrode 114 in an OFF state of the HV-MOS. Also in FIG. 22, the potential distribution is indicated by equipotential lines, and reference numerals 0 to 6 represent intervals of the equipotential lines in the silicon substrate surface (in the interface between the n⁻ layer 110 and the first insulating film LA). As compared with FIG. 11 showing the background-art case, it is found that the equipotential lines of the silicon substrate surface are shifted toward the drain side and the depletion layer in the silicon substrate surface becomes easier to extend. This means that the electric field peak in the silicon substrate surface becomes lower. Thus, also from the potential distribution of FIG. 22, the above effect can be observed.

In the HV-MOS of the fourth preferred embodiment, since the distance "c" is made smaller, capacitance values of the capacitors formed among the second floating field plates FB, the third floating field plates FC, the third drain electrode portion DC and the source electrode portion SC increase. Therefore, since the capacity coupling effect in the capacitors increases, the polarization of the third insulating film LC is accelerated. This causes an effect of making the extension of the depletion layer easier even below the gaps among the first floating field plates FA where the depletion layer has been conventionally hard to extend, leading to an increase in withstand voltage of the HV-MOS.

Figure 23:
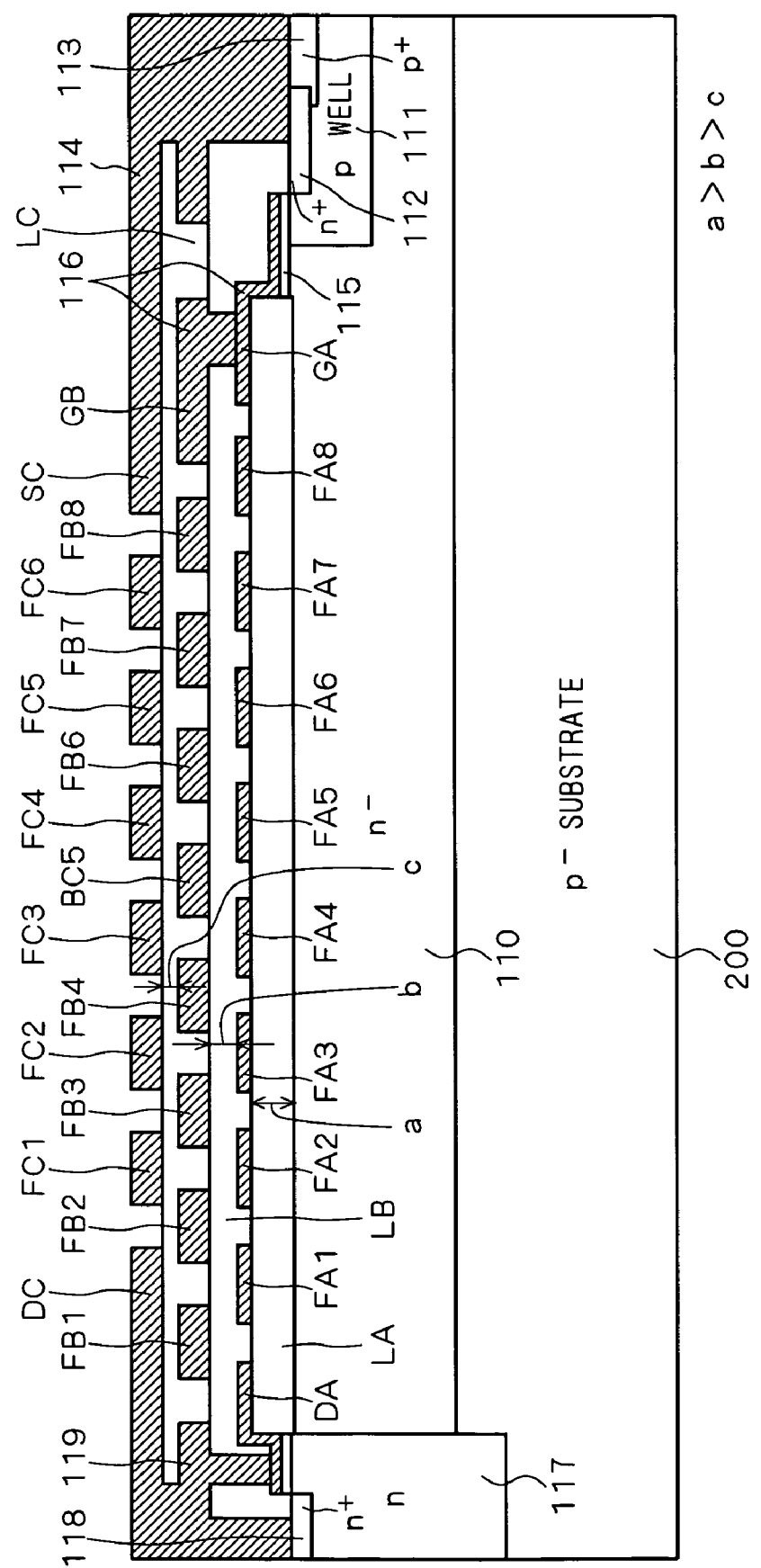
FIG. 23 is a view showing a variation of the fourth preferred embodiment.

Though the relation between the thickness "a" and the distance "b" is a<b in FIG. 20, the relation of "a" and "b" may be a>b, like in FIG. 23, with the first preferred embodiment applied to the fourth preferred embodiment. In this case, the fourth preferred embodiment can also produce the effect of the first preferred embodiment and achieve a further increase in withstand voltage.

Figure 24:
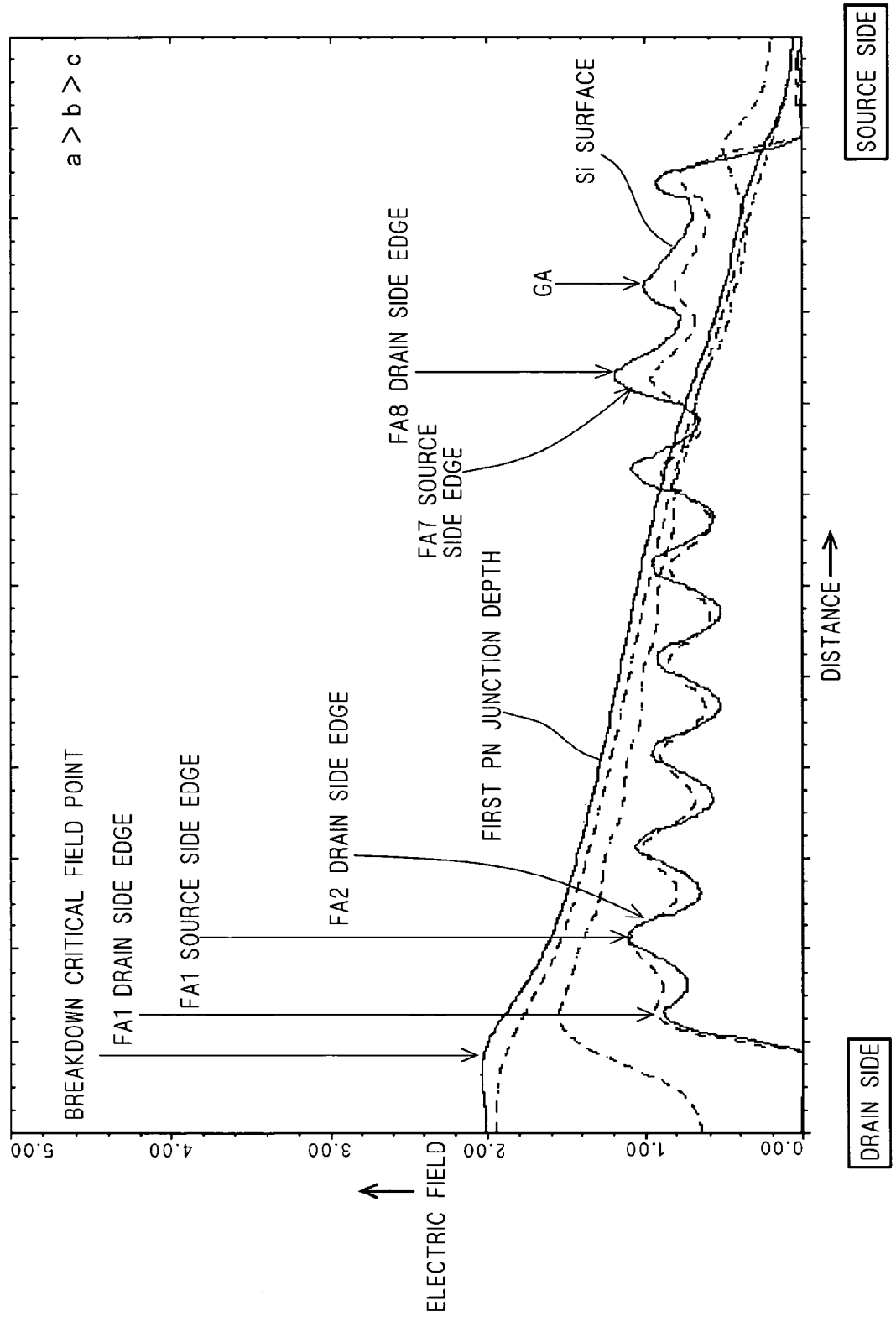
FIG. 24 is a graph showing an electric field distribution between a drain and a source of an HV-MOS in an OFF state in accordance with the variation of the fourth preferred embodiment.

FIG. 24 is a graph showing an electric field distribution inside the HV-MOS of FIG. 23 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p⁻ region 200. In particularly, the solid lines indicate the electric field distribution in the silicon substrate surface and the electric field distribution in the first pn junction depth between the n⁻ layer 110 and the p⁻ region 200. It is found that the electric field peak in the silicon substrate surface becomes still lower and the electric field concentration is further relieved as compared with FIG. 21.

Figure 25:
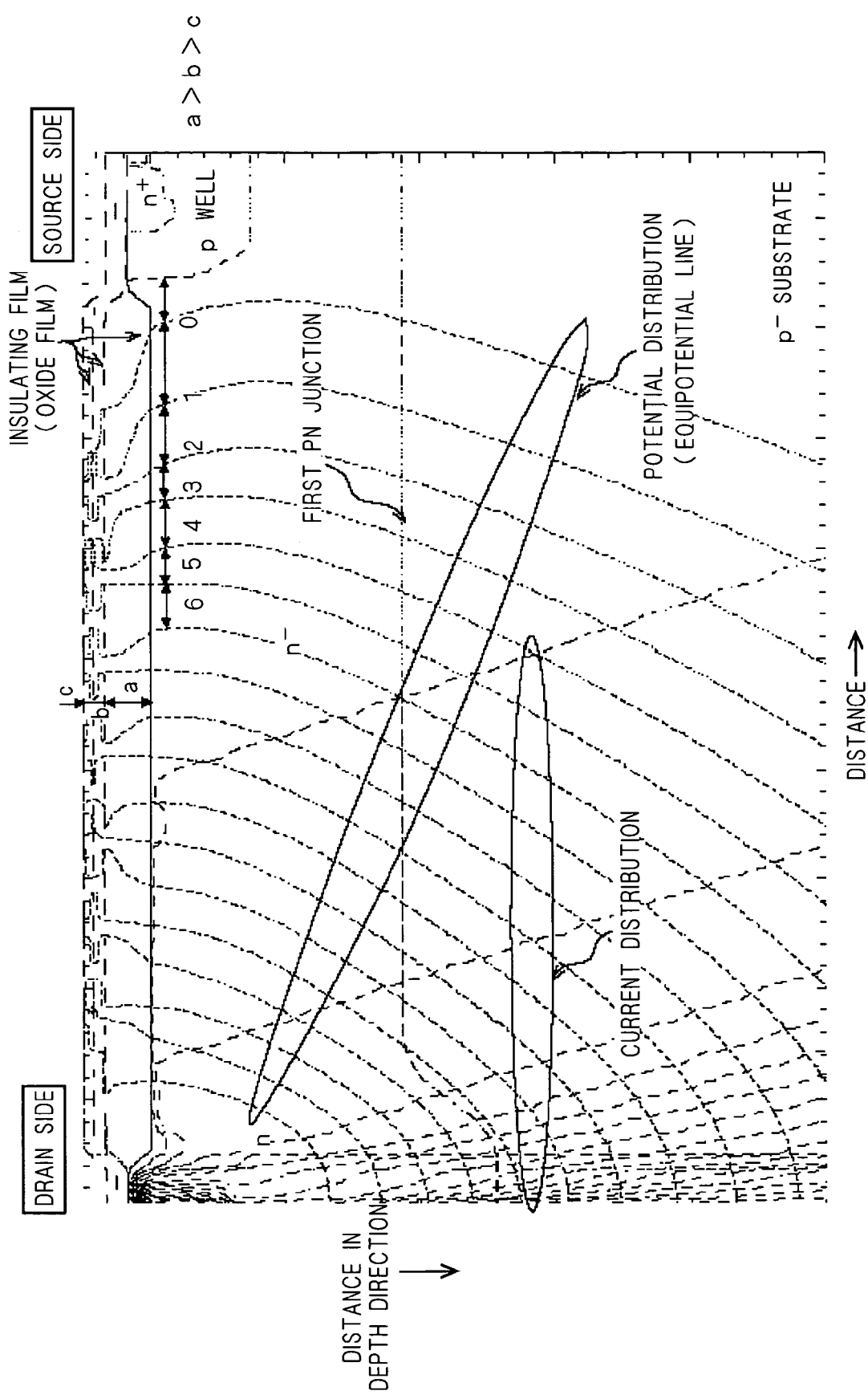
FIG. 25 is a graph showing a potential distribution and a current distribution between the drain and the source of the HV-MOS in an OFF state in accordance with the variation of the fourth preferred embodiment.

FIG. 25 is a graph showing a potential distribution and a current distribution inside the HV-MOS of FIG. 23 at a time when a high voltage is applied between the drain electrode 119 and the source electrode 114 in an OFF state of the HV-MOS. Also in FIG. 25, the potential distribution is indicated by equipotential lines, and reference numerals 0 to 6 represent intervals of the equipotential lines in the silicon substrate surface. In the HV-MOS of FIG. 23, since the thickness "a" of the first insulating film LA is large and distortion in the equipotential lines is suppressed in the first insulating film LA, the sizes of the intervals 0 to 6 become more uniform than those in FIG. 22. Therefore, it is found that the magnitude of the electric field peak in the silicon substrate surface is reduced to lower.

Thus, by applying the first preferred embodiment to the fourth preferred embodiment, a further increase in withstand voltage can be achieved. Though the case where the present invention is applied to a MOSFET has been discussed above, application of the present invention is not limited to this but the present invention can be widely applied to, e.g., a diode, an IGBT or the like.

<The Fifth Preferred Embodiment>

Figure 26:
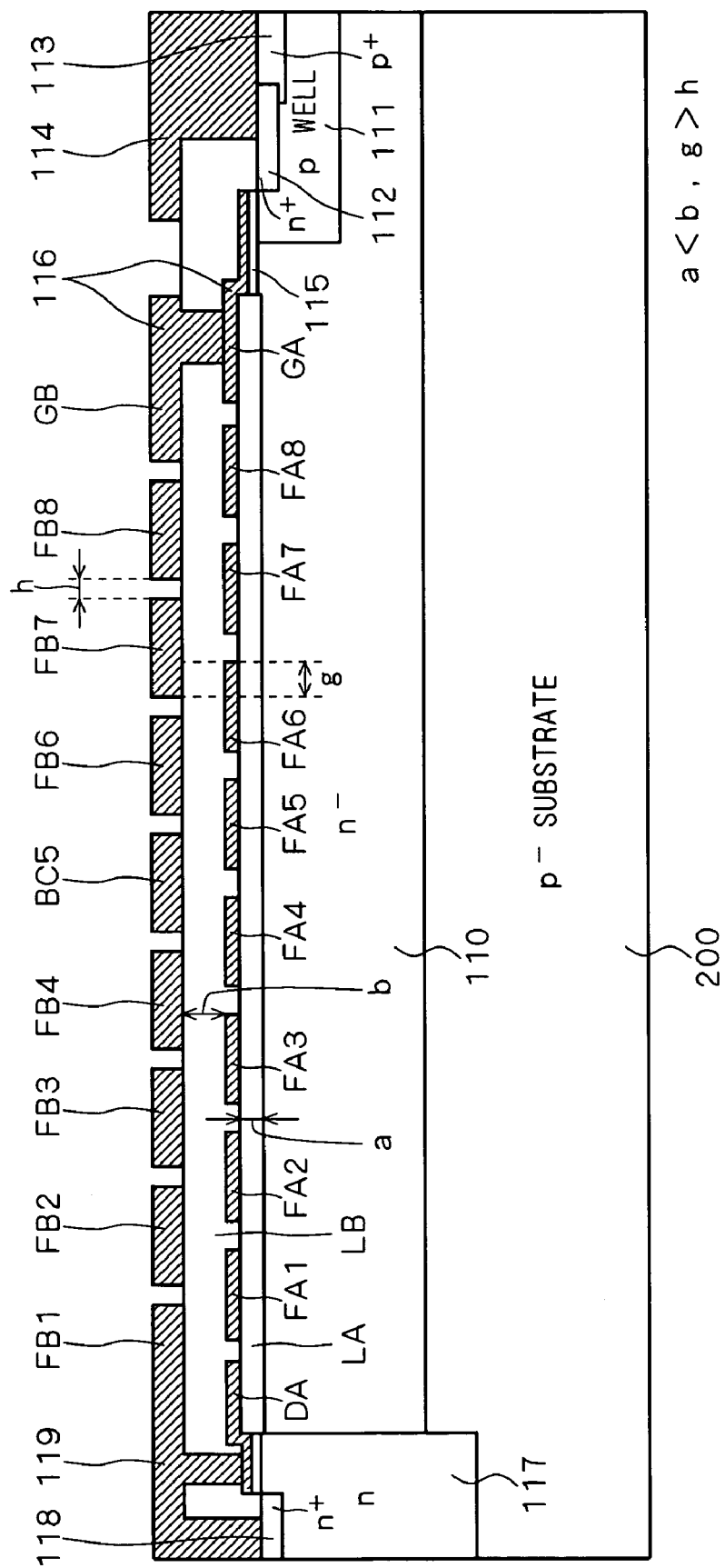
FIG. 26 is a view showing a structure of an HV-MOS in accordance with a fifth preferred embodiment.

FIG. 26 is a view showing a structure of an HV-MOS in accordance with the fifth preferred embodiment. In FIG. 26, since constituent elements identical to those in FIGS. 6 and 14 are represented by the same reference signs, detailed description thereof will be omitted.

In the fifth preferred embodiment, the width of each of the first floating field plates FA and that of each of the second floating field plates FB are made larger than those in the background-art structure. Specifically, the widths are determined so that assuming that the width of a portion in each of the first floating field plates FA which overlaps one of the second floating field plates FB with the second insulating film LB interposed therebetween in the first direction is "g" and the distance between one and the adjacent one of the second floating field plates FB in the first direction is "h", a relation g >h can be held (see FIG. 26).

Further, in the case of FIG. 26, the relation between the thickness "a" (the thickness of the first insulating film LA) and the distance "b" (the distance between the first floating field plates FA and the second floating field plates FB in the second direction) is a<b like in the background-art structure.

FIG. 26 of the fifth preferred embodiment is not different from FIG. 14 of the second preferred embodiment in other than the above.

In the fifth preferred embodiment, since the width of a portion where one of the first floating field plates FA overlaps the corresponding one of the second floating field plates FB is large, capacitance values of the capacitors formed between the first floating field plates FA and the second floating field plates FB become larger than those in the background-art structure. Therefore, since the high capacity coupling effect in the capacitors becomes higher, the polarization of the second insulating film LB is accelerated. This produces an effect of making the extension of the depletion layer easier even below the gaps among the first floating field plates FA, leading to an increase in withstand voltage of the HV-MOS.

Since the capacity coupling effect in the capacitors increases, variation of potential differences held in the capacitors between the source and the drain becomes smaller and the fifth preferred embodiment also produces an effect of preventing the dielectric breakdown of the second insulating film LB.

Though the fifth preferred embodiment also shows the case where the present invention is applied to a MOSFET, application of the present invention is not limited to this but the present invention can be widely applied to, e.g., a diode, an IGBT or the like.

<The Sixth Preferred Embodiment>

Figure 27:
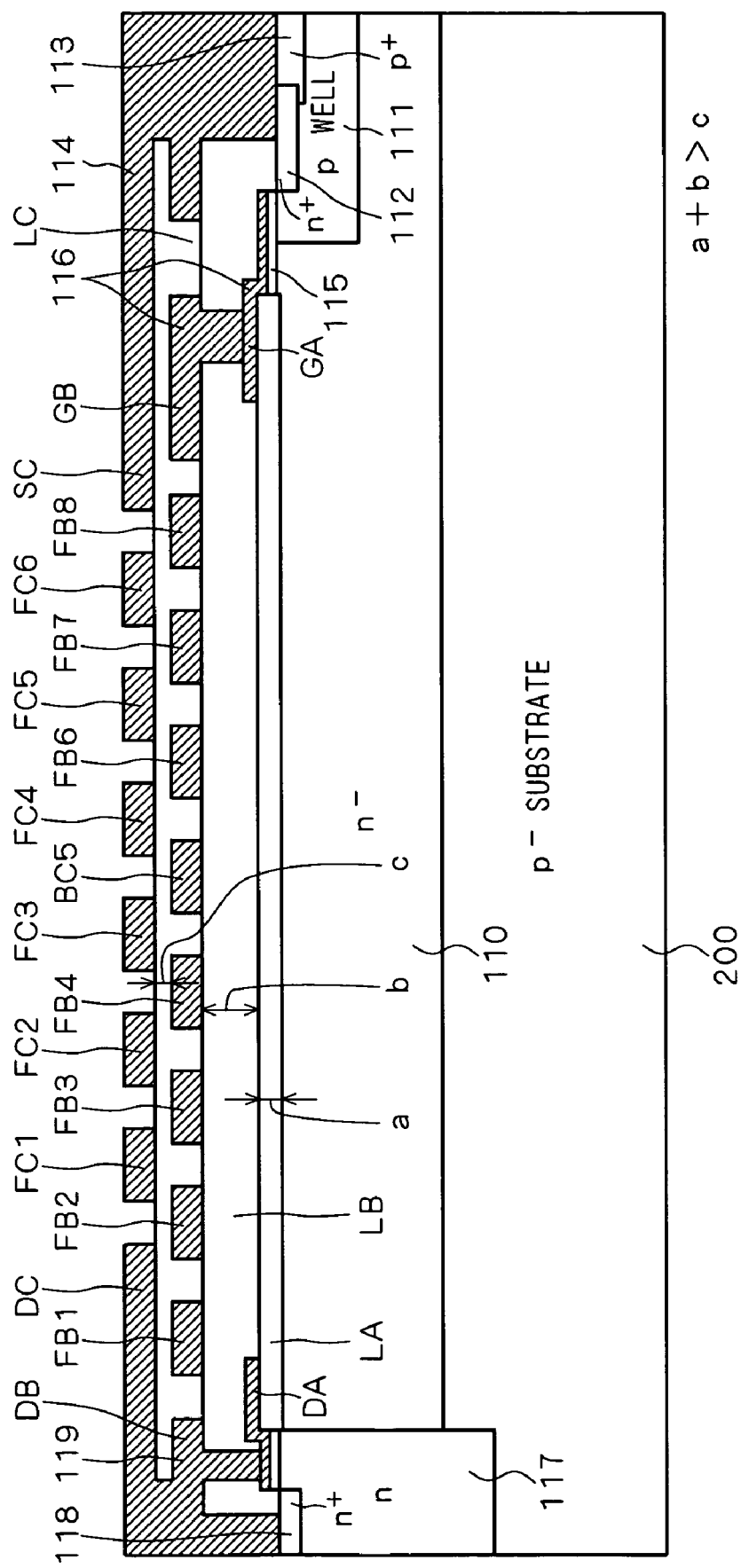
FIG. 27 is a view showing a structure of an HV-MOS in accordance with a sixth preferred embodiment.

FIG. 27 is a view showing a structure of an HV-MOS in accordance with the sixth preferred embodiment. In FIG. 27, since constituent elements identical to those in FIG. 20 are represented by the same reference signs, detailed description thereof will be omitted.

The HV-MOS of FIG. 27 has a constitution where the first floating field plates FA are removed from the constitution of FIG. 20. Assuming that the thickness of the first insulating film LA and that of the second insulating film LB are "a" and "b", respectively, and the distance between the second floating field plates FB and the third floating field plates FC in the second direction is "c", a relation a+b>c is held. In other words, the second floating field plates FB and the third floating field plates FC of FIG. 27 have the same functions as those of the first floating field plates FA and the second floating field plates FB of the first preferred embodiment (FIG. 6). Therefore, the HV-MOS of FIG. 27 can keep a high withstand voltage with stability, like the HV-MOS of the first preferred embodiment.

The drain electrode 119 has the first drain electrode portion DA extending on the first insulating film LA. The first drain electrode portion DA so extends on the first insulating film LA along the first direction as to partially overlap part of the second floating field plate FB1 with the second insulating film LB interposed therebetween. The length of a portion in the third drain electrode portion DC which extends above the first insulating film LA along the first direction is longer than the length of a portion in the first drain electrode portion DA which extends on the first insulating film LA along the first direction and longer than the length of a portion in the second drain electrode portion DB which extends above the first insulating film LA along the first direction. In other words, the third drain electrode portion DC covers the first drain electrode portion DA and the second drain electrode portion DB.

Figure 28:
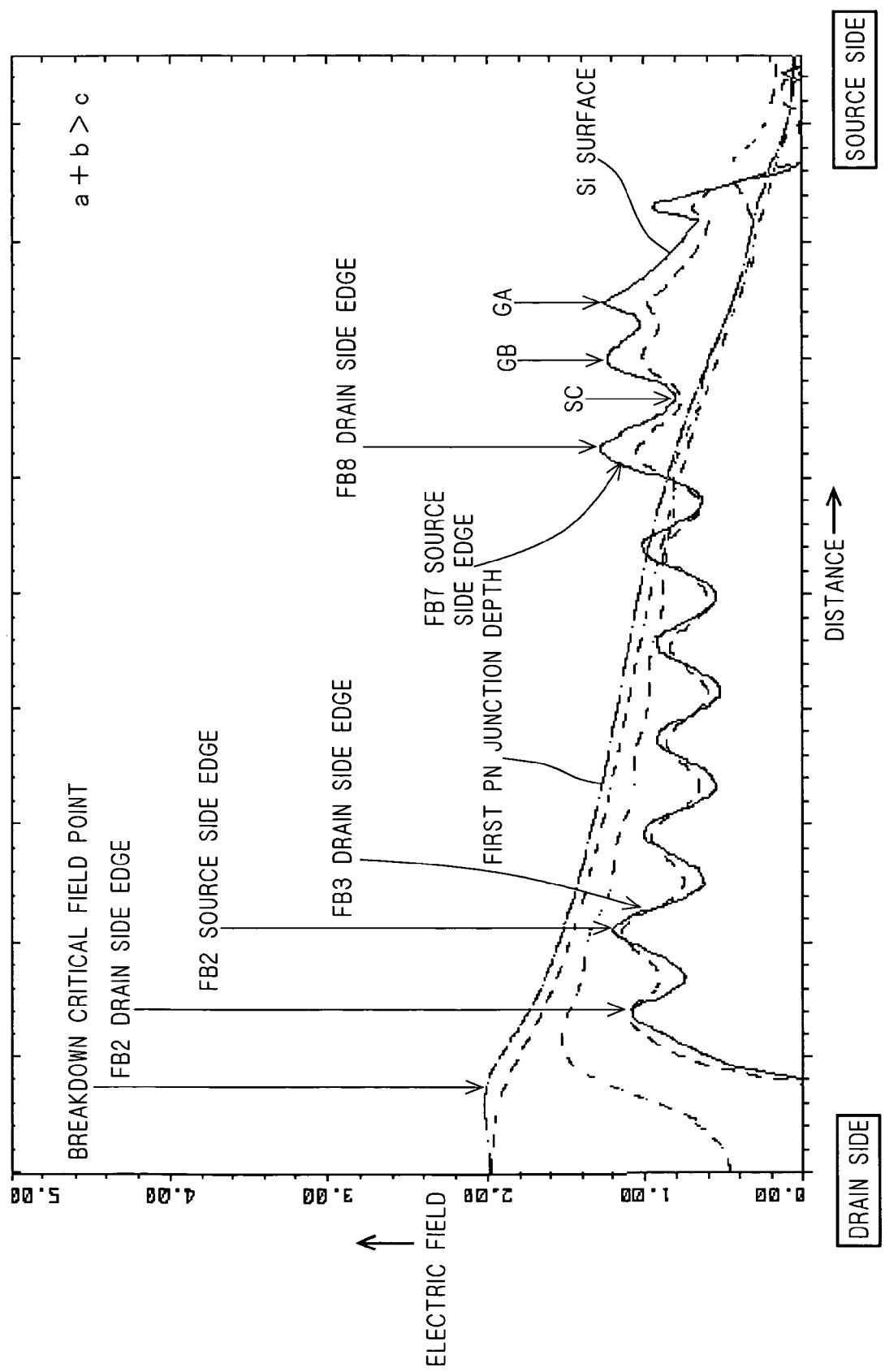
FIG. 28 is a graph showing an electric field distribution between a drain and a source of the HV-MOS in an OFF state in accordance with the sixth preferred embodiment.

FIG. 28 is a graph showing an electric field distribution inside the HV-MOS of FIG. 27 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p⁻ region 200. In particularly, the solid lines indicate the electric field distribution in the silicon substrate surface and the electric field distribution in the first pn junction depth between the n⁻ layer 110 and the p⁻ region 200. It is found that the electric field peak in the silicon substrate surface becomes lower and the electric field concentration is relieved, like in the first preferred embodiment.

The electric field peak in the silicon substrate surface on the drain side is present below an edge of the second floating field plate FB2 on the drain side and no peak is present below an edge of the second floating field plate FB1. This is because the first drain electrode portion DA which functions as a normal field plate extends up to such a position where the first drain electrode portion DA should partially overlap the second floating field plate FB1. Further, since the third drain electrode portion DC so extends above the first insulating film LA as to cover the first drain electrode portion DA and the second drain electrode portion DB, the electric field concentration near the drain electrode in the silicon substrate surface is further relieved. Therefore, since the electric field strength near the breakdown critical electric field point (a portion in the first pn junction depth of the n region 117 on the drain side) becomes lower, a value of the withstand voltage in the HV-MOS becomes higher. In short, in the sixth preferred embodiment, a further increase in withstand voltage can be achieved as compared with the first preferred embodiment.

Figure 29:
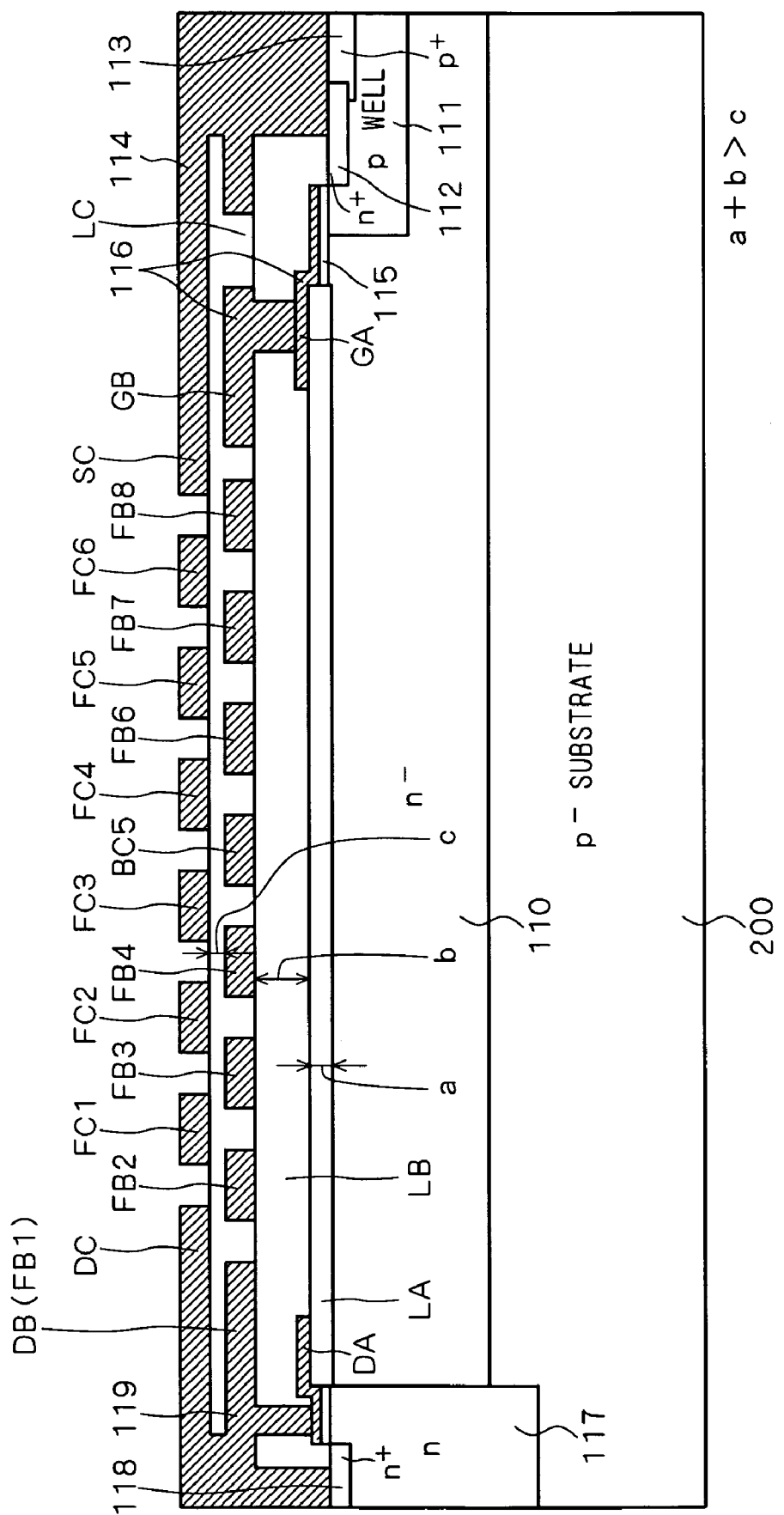
FIG. 29 is a view showing a variation of the sixth preferred embodiment.

FIG. 29 is a view showing a variation where the second preferred embodiment is applied to the sixth preferred embodiment. Specifically, the structure of FIG. 29 is different from that of FIG. 27 in that the drain electrode 119 has the second drain electrode portion DB extending on the second insulating film LB. As shown in FIG. 29, the length of a portion in the second drain electrode portion DB which extends above the first insulating film LA along the first direction is longer than the length of a portion in the first drain electrode portion DA which extends on the first insulating film LA along the first direction. In other words, the second drain electrode portion DB covers the first drain electrode portion DA with the second insulating film LB interposed therebetween. As shown in FIG. 29, the second drain electrode portion DB is a portion where the drain electrode 119 and the second floating field plate FB1 of FIG. 27 are connected to each other.

Figure 30:
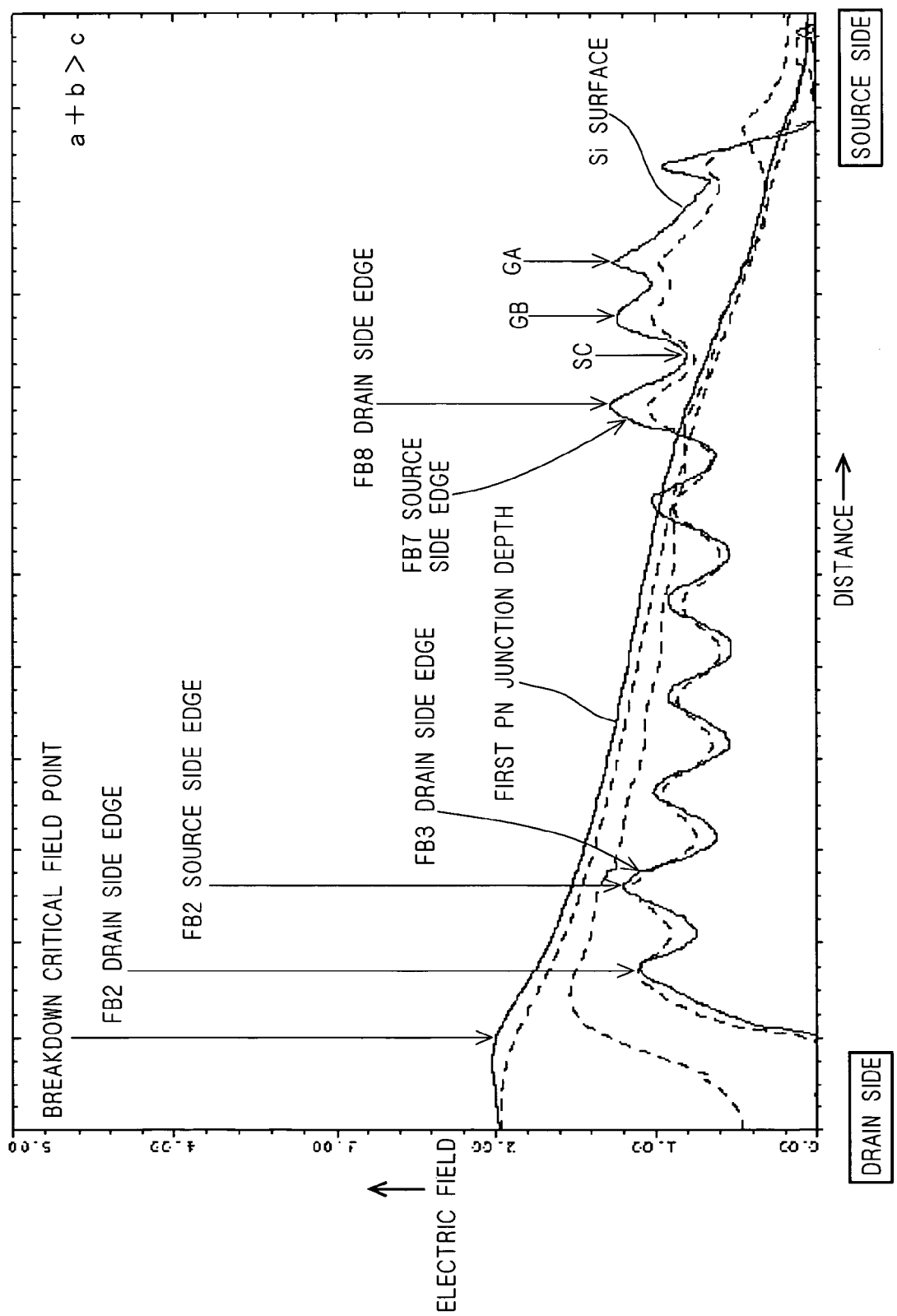
FIG. 30 is a graph showing an electric field distribution between a drain and a source of an HV-MOS in an OFF state in accordance with the variation of the sixth preferred embodiment.

FIG. 30 is a graph showing an electric field distribution inside the HV-MOS of FIG. 29 at a time when a high voltage is applied between the drain electrode 119 and the source electrode 114 in an OFF state caused by establishing a short circuit between the gate electrode 116 and the source electrode 114 in the HV-MOS. Also in FIG. 30, the electric field peak in the silicon substrate surface on the drain side is present below an edge of the second floating field plate FB2 on the drain side and no peak is present below an edge of the second floating field plate FB1, like in FIG. 28. Therefore, since the electric field strength near the breakdown critical electric field point becomes lower, a value of the withstand voltage in the HV-MOS becomes higher. In short, in this variation, a further increase in withstand voltage can be achieved as compared with the second preferred embodiment.

Though the sixth preferred embodiment also shows the case where the present invention is applied to a MOSFET, application of the present invention is not limited to this but the present invention can be widely applied to, e.g., a diode, an IGBT or the like.

<The Seventh Preferred Embodiment>

Figure 31:
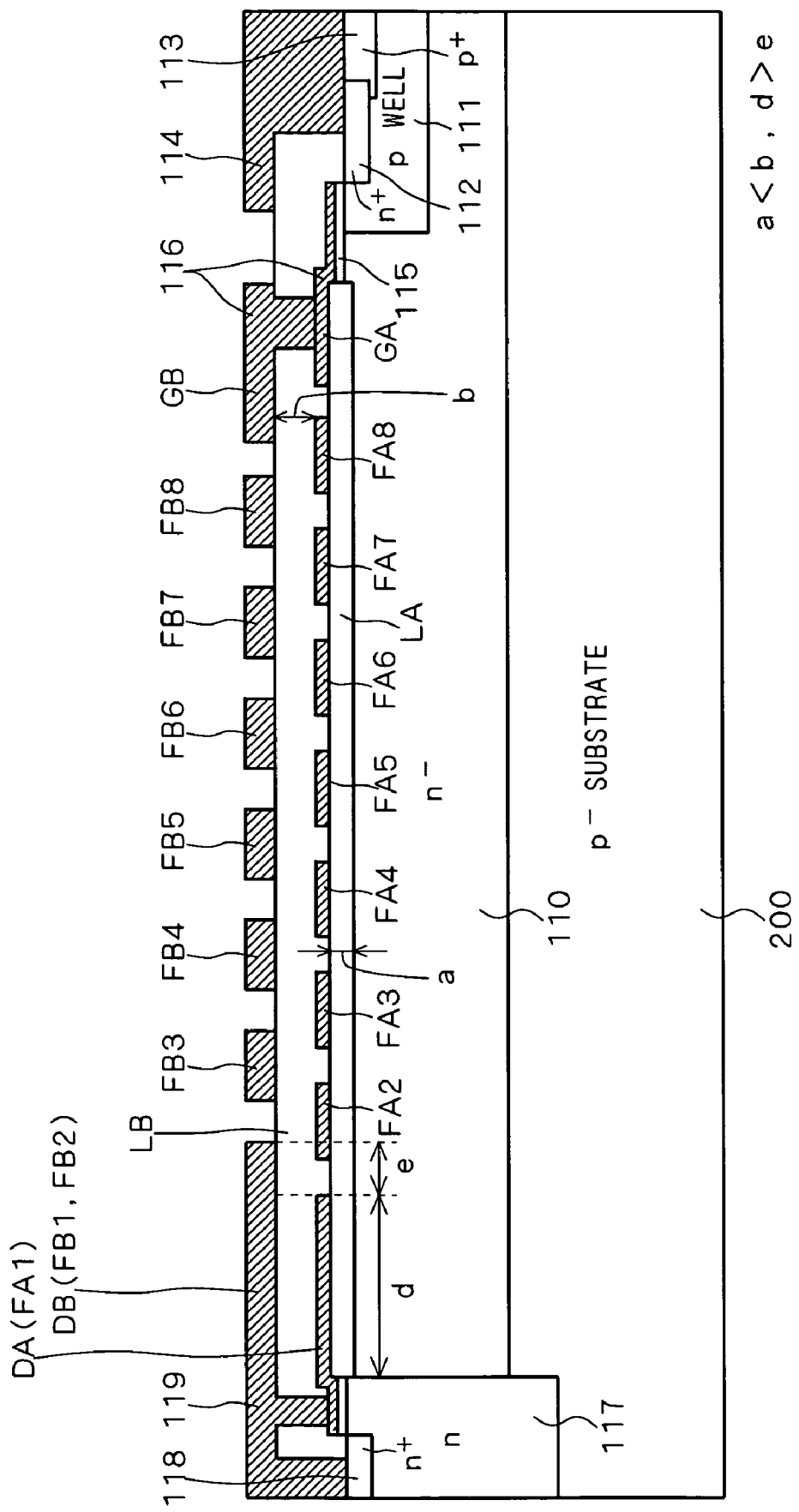
FIG. 31 is a view showing a structure of an HV-MOS in accordance with a seventh preferred embodiment.

FIG. 31 is a view showing a structure of an HV-MOS in accordance with the seventh preferred embodiment. In FIG. 27, since constituent elements identical to those in FIGS. 6 and 14 are represented by the same reference signs, detailed description thereof will be omitted.

In the HV-MOS of the seventh preferred embodiment, the drain electrode 119 has the first drain electrode portion DA extending on the first insulating film LA and the second drain electrode portion DB extending on the second insulating film LB. Further, the first drain electrode portion DA and the second drain electrode portion DB are made longer than those in the background-art structure. As shown in FIG. 31, assuming that the length of a portion in the first drain electrode portion DA which extends on the first insulating film LA along the first direction is "d", the length of a portion in the second drain electrode portion DB which extends above the first insulating film LA along the first direction is longer than the length "d" by a length "e". At that time, the length "d" is made sufficiently long so that a relation d>e can be held. Further, in the case of FIG. 31, the relation between the thickness "a" of the first insulating film LA and the distance "b" between the first floating field plates FA and the second floating field plates FB in the second direction is a<b like in the background-art structure. As shown in FIG. 31, the first drain electrode portion DA is a portion where the drain electrode 119 is connected to the first floating field plate FA1 of FIG. 6 and the second drain electrode portion DB is a portion where the second floating field plates FB1 and FB2 are connected to the drain electrode 119 of FIG. 6.

Figure 32:
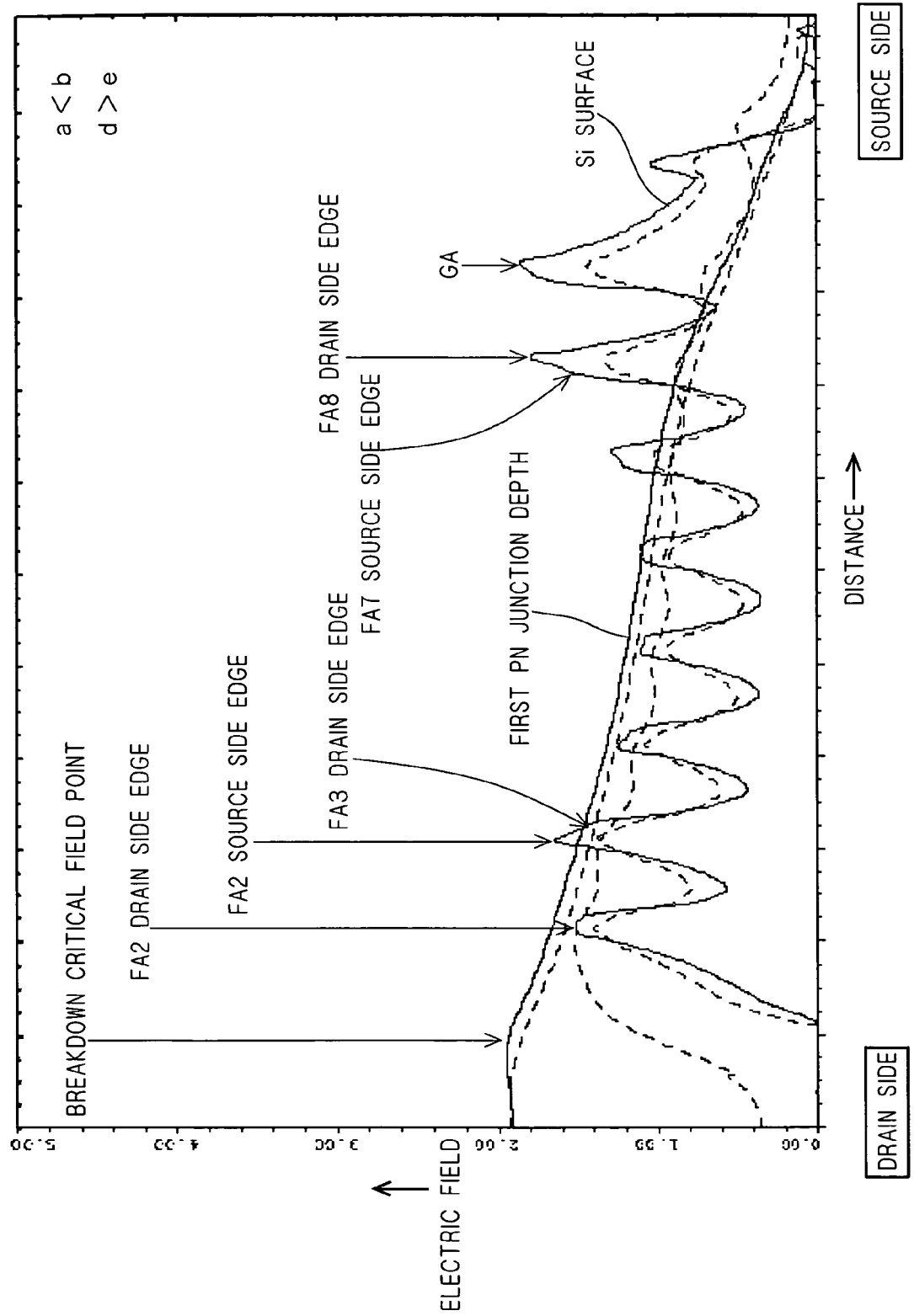
FIG. 32 is a graph showing an electric field distribution between a drain and a source of the HV-MOS in an OFF state in accordance with the seventh preferred embodiment.

FIG. 32 is a graph showing an electric field distribution inside the HV-MOS of FIG. 31 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p⁻ region 200. In particularly, the solid lines indicate the electric field distribution in the silicon substrate surface and the electric field distribution in the first pn junction depth between the n⁻ layer 110 and the p⁻ region 200. The electric field peak in the silicon substrate surface on the drain side is present below an edge of the first floating field plate FA2 on the drain side.

For example, as can be seen from comparison between FIG. 32 and FIG. 7 or the like, in the seventh preferred embodiment, the electric field peak on the drain side becomes farther away from the breakdown critical electric field point (a portion in the first pn junction depth of the n region 117 on the drain side). Therefore, since the electric field strength near the breakdown critical electric field point becomes lower, the withstand voltage in the HV-MOS increases.

Figure 33:
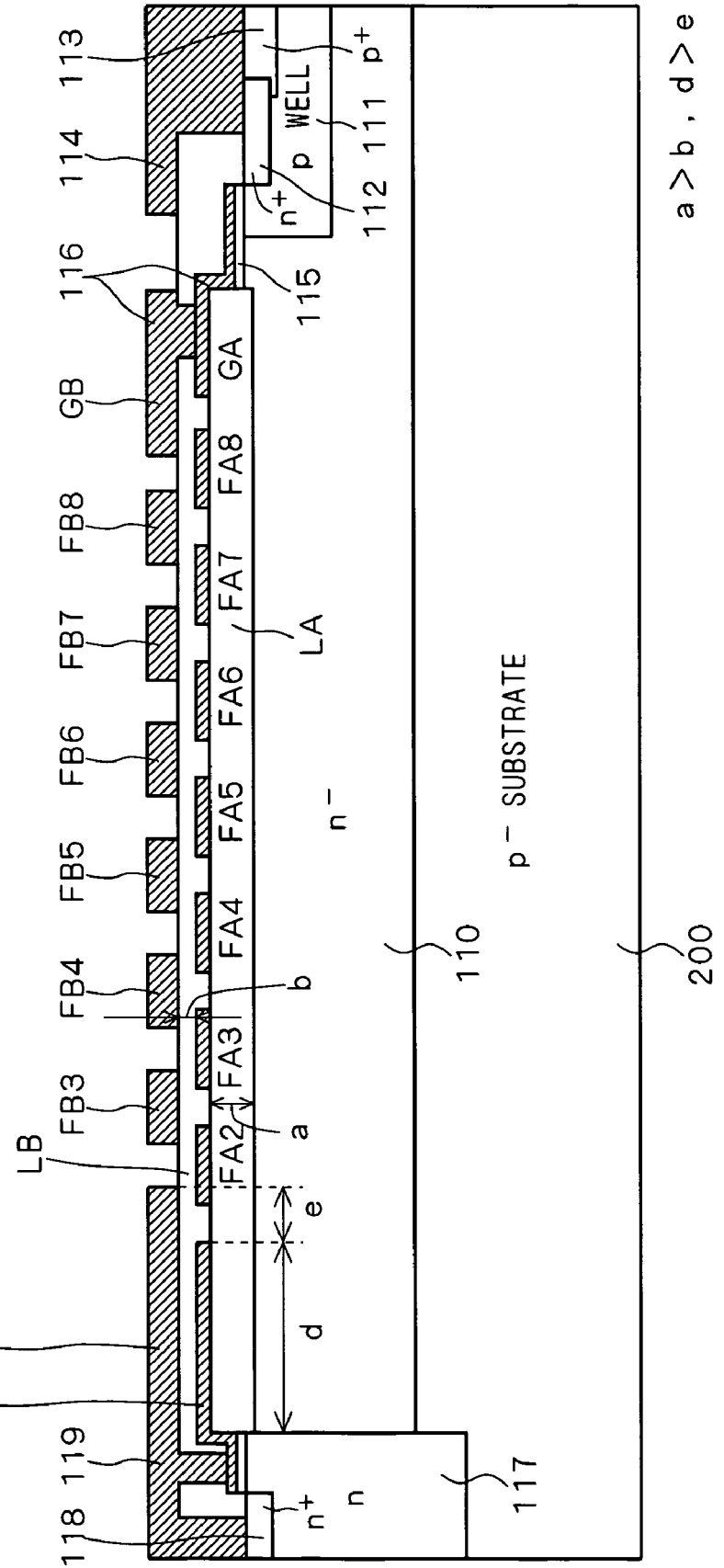
FIG. 33 is a view showing a variation of the seventh preferred embodiment.
Figure 34:
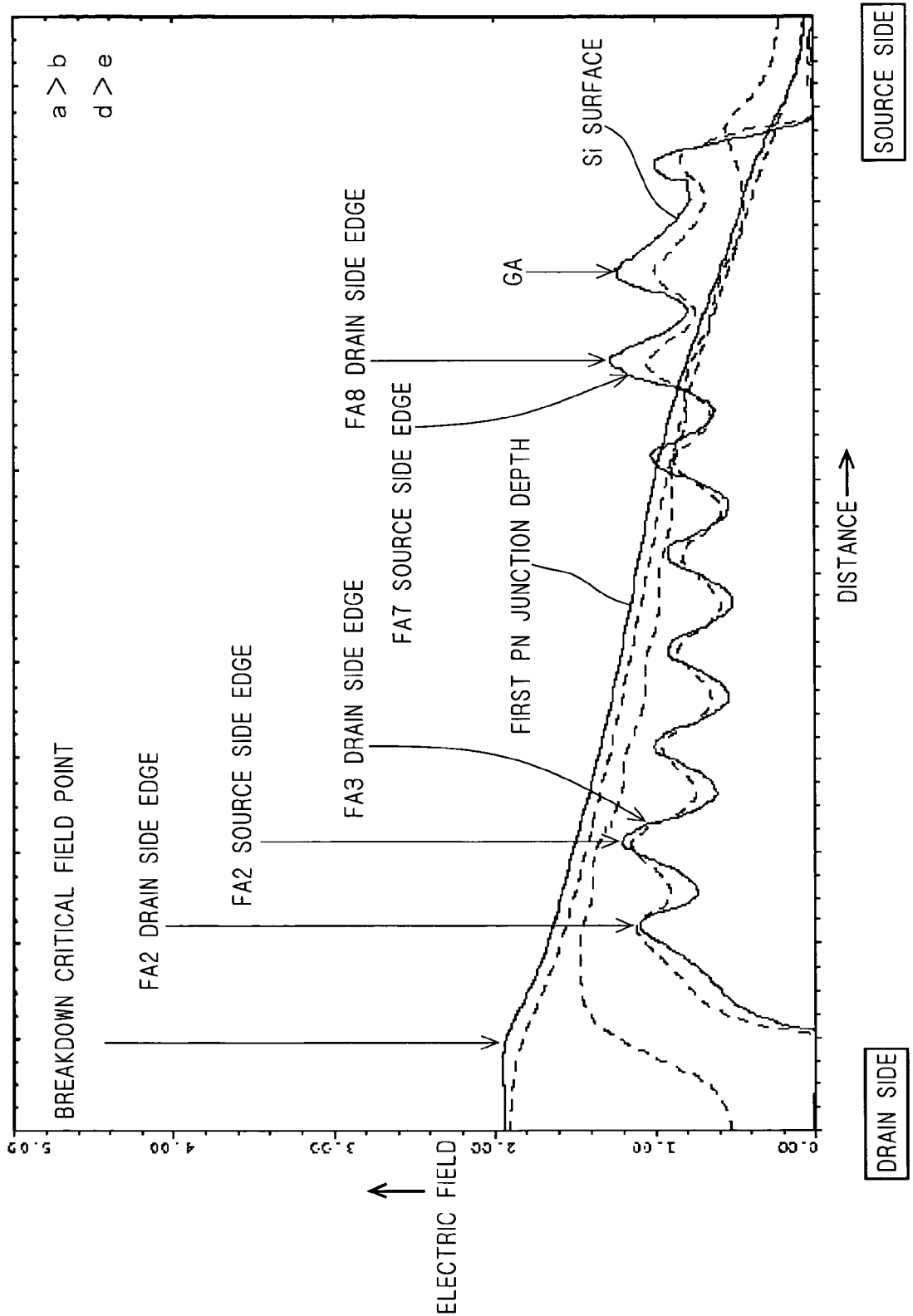
FIG. 34 is a graph showing an electric field distribution between a drain and a source of the HV-MOS in an OFF state in accordance with the variation of the seventh preferred embodiment.

Though the relation between the thickness "a" and the distance "b" is a<b in FIG. 31, the relation of "a" and "b" may be a>b, as shown in FIG. 33, with the first preferred embodiment applied to the seventh preferred embodiment. FIG. 34 is a graph showing an electric field distribution inside the HV-MOS of FIG. 33 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p⁻ region 200. In particularly, the solid lines indicate the electric field distribution in the silicon substrate surface and the electric field distribution in the first pn junction depth between the n⁻ layer 110 and the p⁻ region 200. It is found that the electric field peak in the silicon substrate surface becomes lower and the electric field concentration is relieved on the whole as compared with the case of FIG. 32. Therefore, by applying the first preferred embodiment to the seventh preferred embodiment, it is possible to further increase the withstand voltage.

Figure 35:
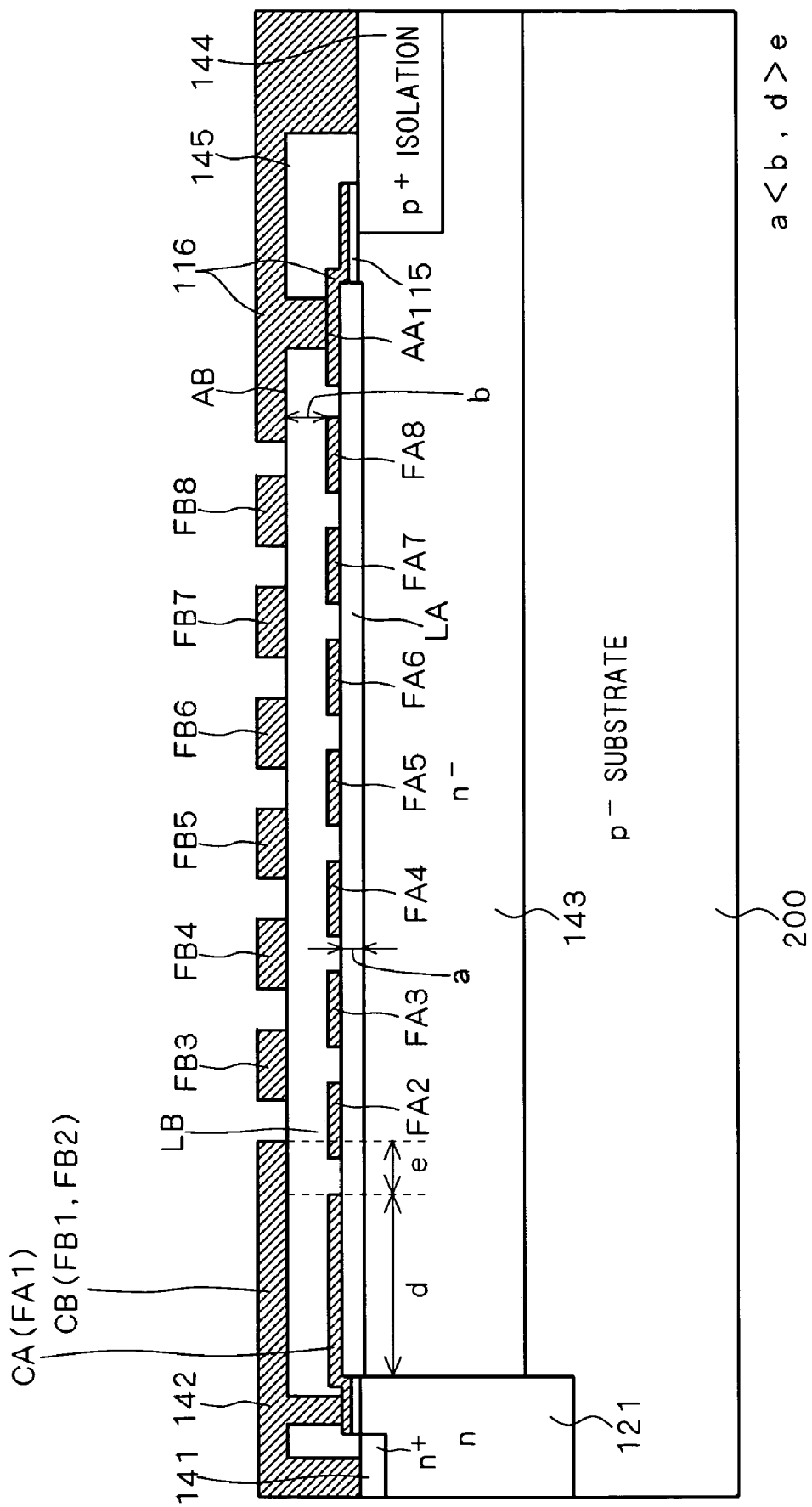
FIG. 35 is a view showing a case where the invention of the seventh preferred embodiment is applied to an HV-diode.

Application of the present invention is not limited to a MOSFET but the present invention can be widely applied to, e.g., a diode, an IGBT or the like. FIG. 35 is a view showing a case where the invention of the seventh preferred embodiment is applied to a high breakdown voltage diode (HV-diode), which is an enlarged view of the HV-diode 14 of FIG. 5. In FIG. 35, since constituent elements identical to those in FIGS. 5 and 13 are represented by the same reference signs, detailed description thereof will be omitted. Also in this figure, the lateral sides are shown conversely to those of FIG. 5, for convenience of the following discussion. The HV-diode of FIG. 35 has a structure where the first cathode electrode portion CA and the second cathode electrode portion CB are elongated like the first drain electrode portion DA and the second drain electrode portion DB of FIG. 31 in the background-art structure of HV-diode (where the relation a<b is held in FIG. 13 of the first preferred embodiment).

Figure 36:
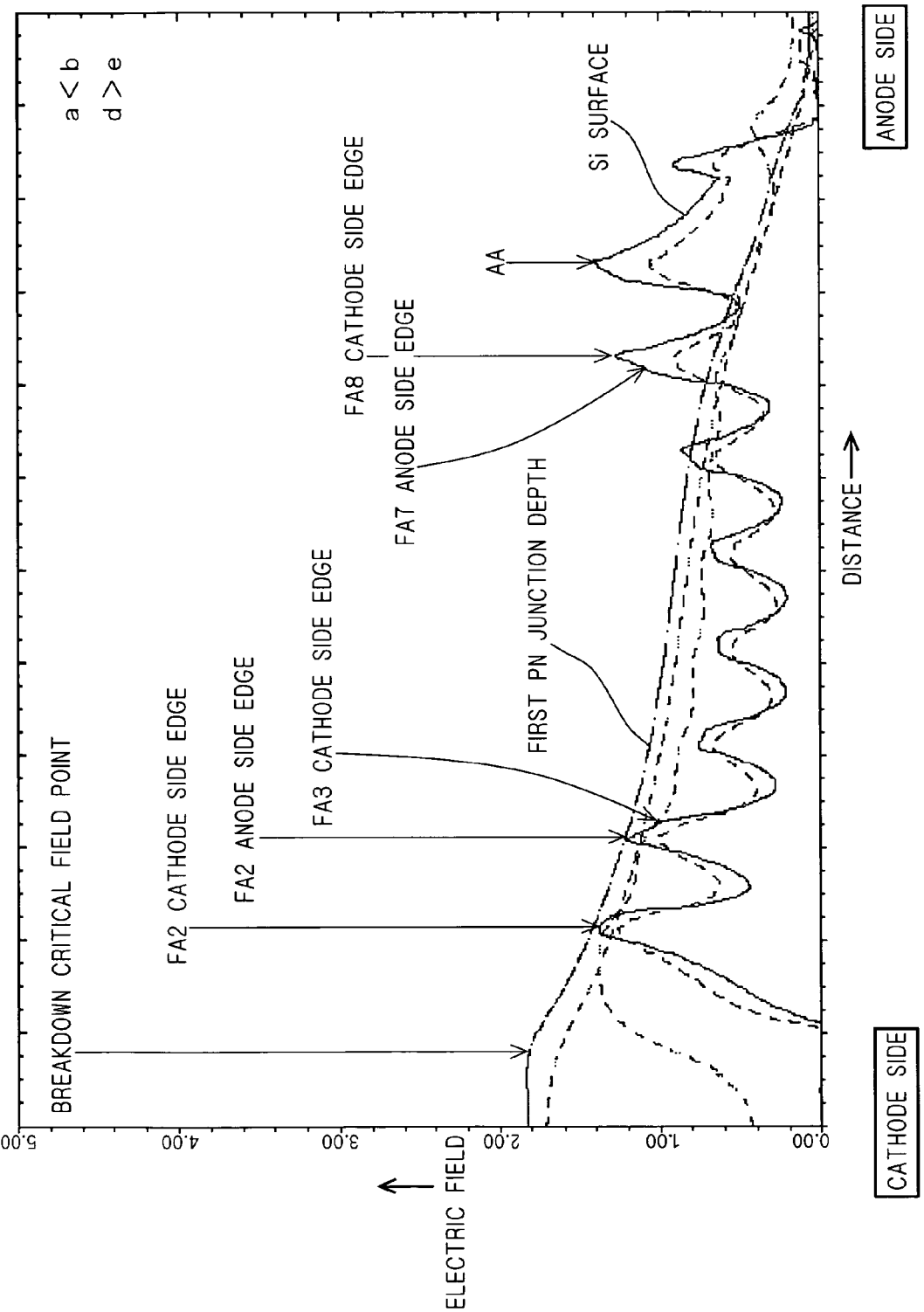
FIGS. 36 and 37 are graphs each showing an electric field distribution between a drain and a source of the HV-diode in an OFF state in accordance with the seventh preferred embodiment.

FIG. 36 is a graph showing an electric field distribution inside the HV-diode of FIG. 35 at a time when a reverse voltage is applied between the cathode electrode 142 and the anode electrode 145. This figure shows the electric field distribution in a range from the silicon substrate surface (Si surface) to the pn junction depth between the n layer 121 and the p⁻ region 200. In particularly, the solid lines indicate the electric field distribution in the silicon substrate surface and the electric field distribution in the first pn junction depth between the n⁻ layer 143 and the p⁻ region 200. This figure shows the electric field distribution in the section of C—C of FIG. 3 (i.e., a corner portion in the high potential island). The electric field peak in the silicon substrate surface on the cathode side is present below an edge of the first floating field plate FA2 on the cathode side, and the electric field strength near the breakdown critical electric field point (a portion in the first pn junction depth of the n layer 121 on the cathode side) becomes lower.

Figure 37:
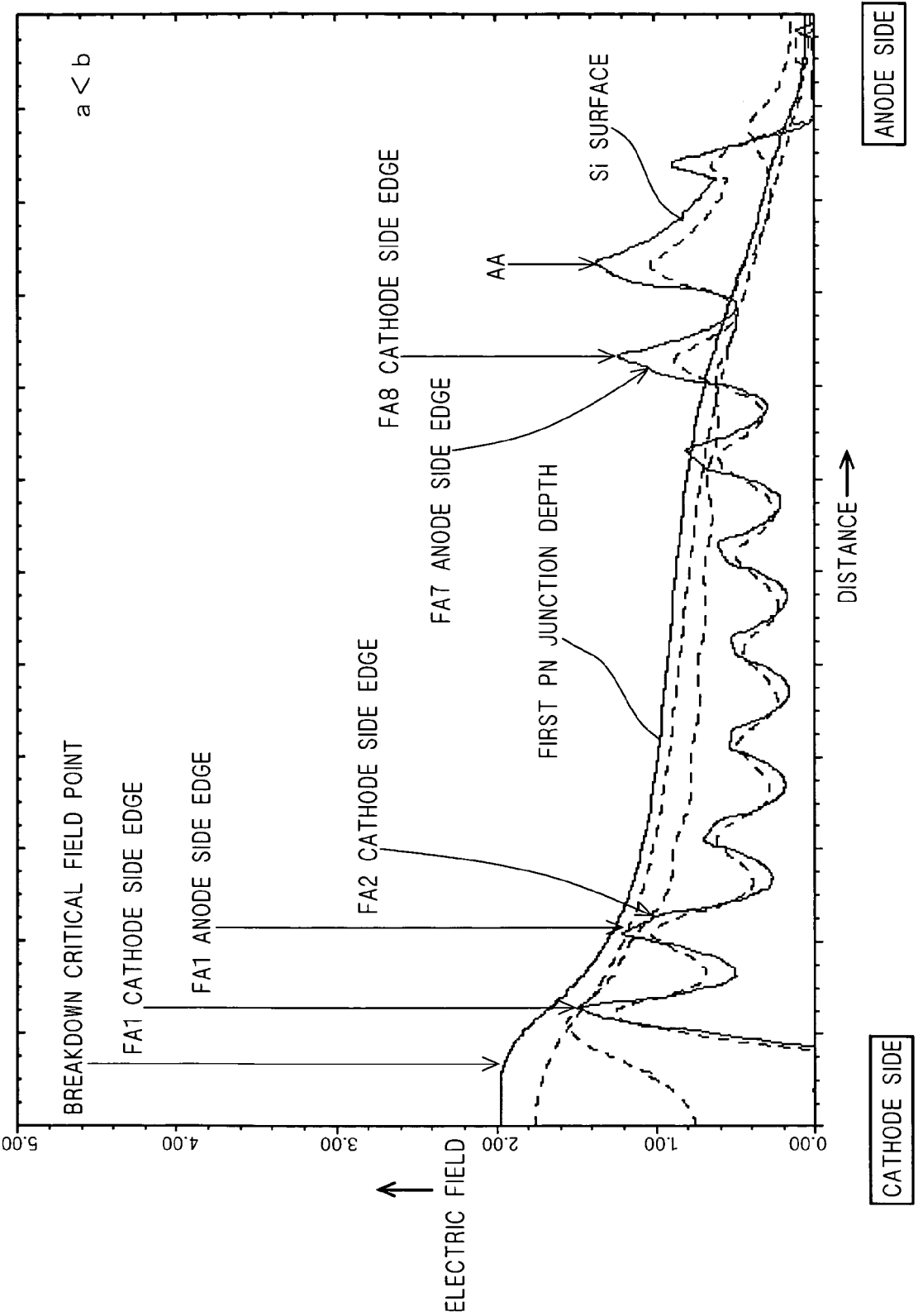

On the other hand, FIG. 37 is a graph showing an electric field distribution inside the background-art HV-diode (where the relation a<b is held in FIG. 13 of the first preferred embodiment), like FIG. 36. This figure also shows the electric field distribution in the section of C—C of FIG. 3 (i.e., the corner portion in the high potential island). The electric field peak in the silicon substrate surface on the cathode side is present below an edge of the second floating field plate FB 1 on the drain side which is not present in FIG. 35.

As can be seen from comparison between FIGS. 36 and 37, in the seventh preferred embodiment, the electric field peak on the cathode side becomes farther away from the breakdown critical electric field point. Accordingly, the electric field strength near the breakdown critical electric field point becomes higher than that in the HV-diode of FIG. 35. Therefore, the HV-diode of FIG. 35 to which the seventh preferred embodiment is applied can obtain a high withstand voltage.

In general, in the corner portion of the high potential island, due to its shape, the electric field peak tends to become higher especially in the silicon substrate surface on the cathode side of the HV-diode (the drain side in the HV-MOS). In FIG. 37, for example, it can be observed that the electric field peak in the silicon substrate surface on the cathode side is higher than that on the anode side. Therefore, in the background art, there is a possibility of decrease in withstand voltage due to an increase in electric field strength near the breakdown critical electric field point in the HV-diode or the HV-MOS formed in the corner portion. Since the seventh preferred embodiment makes it possible to reduce the electric field strength near the breakdown critical electric field point in the HV-diode or the HV-MOS to lower, application of the seventh preferred embodiment to the HV-diode or HV-MOS in the corner portion is especially effective.

<The Eighth Preferred Embodiment>

Figure 38:
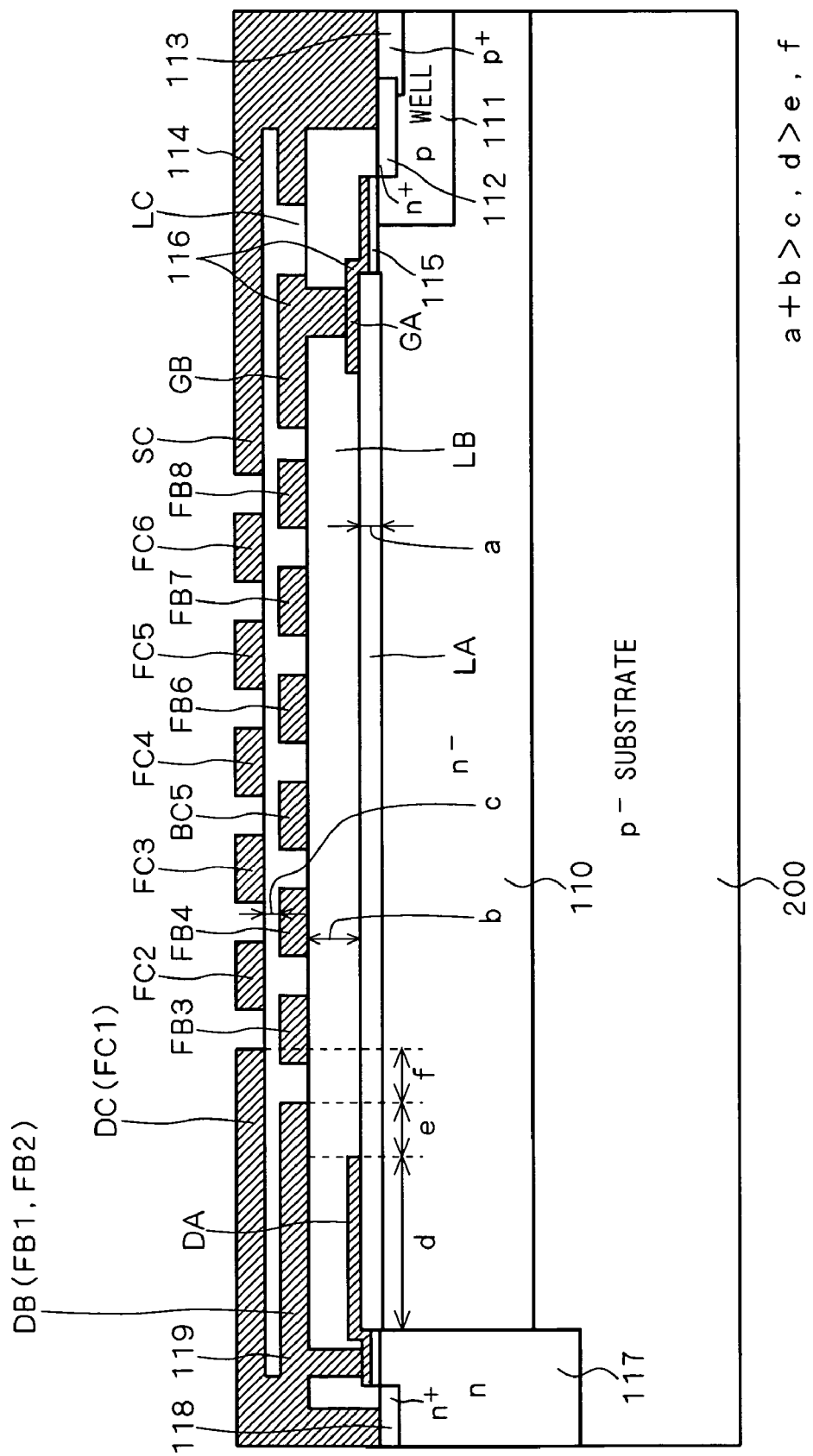
FIG. 38 is a view showing a structure of an HV-MOS in accordance with an eighth preferred embodiment.

The eighth preferred embodiment is a case where the seventh preferred embodiment is applied to the sixth preferred embodiment. FIG. 38 is a view showing a structure of an HV-MOS in accordance with the eighth preferred embodiment. In FIG. 38, since constituent elements identical to those in FIGS. 6 and 29 are represented by the same reference signs, detailed description thereof will be omitted.

The HV-MOS of the eighth preferred embodiment has a structure where the first drain electrode portion DA, the second drain electrode portion DB and the third drain electrode portion DC are elongated in the structure of FIG. 29. As shown in FIG. 38, assuming that the length of a portion in the first drain electrode portion DA which extends on the first insulating film LA along the first direction is "d", the length of a portion in the second drain electrode portion DB which extends above the first insulating film LA along the first direction is longer than the length "d" by a length "e". Further, the length of a portion in the third drain electrode portion DC which extends above the first insulating film LA along the first direction is longer than the length (d+e) by a length "f". At this time, the length "d" is made sufficiently long so that relations d>e and d>f can be held.

As shown in FIG. 38, the second drain electrode portion DB is a portion where the drain electrode 119 of FIG. 29 is connected to the second floating field plates FB1 and FB, and the third drain electrode portion DC is a portion where the third floating field plate FC 1 is connected to the drain electrode 119 of FIG. 29.

Figure 39:
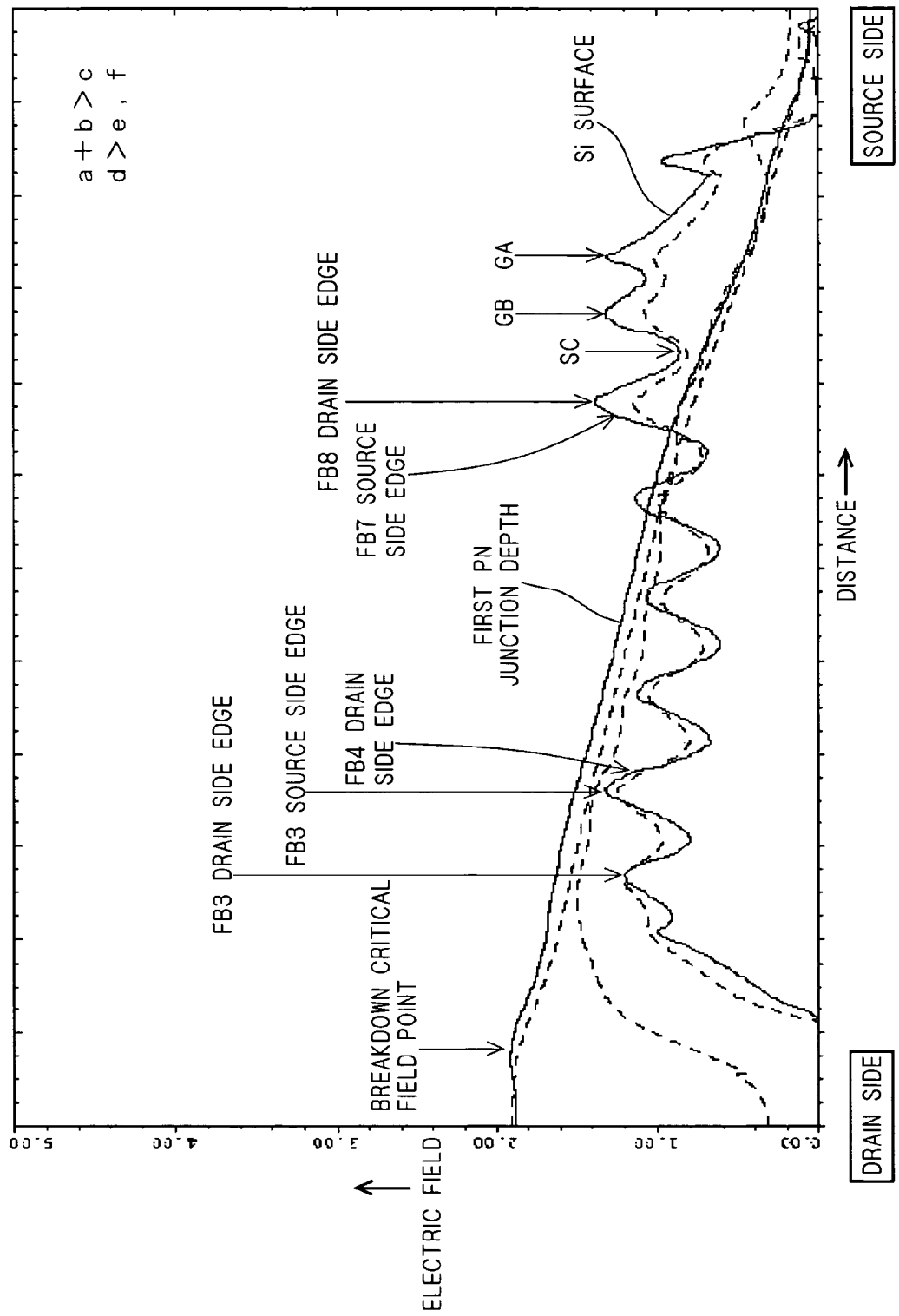
FIG. 39 is a graph showing an electric field distribution between a drain and a source of the HV-MOS in an OFF state in accordance with the eighth preferred embodiment.

FIG. 39 is a graph showing an electric field distribution inside the HV-MOS of FIG. 38 at a time when a high voltage is applied between the drain electrode 119 and the source electrode 114 in an OFF state caused by establishing a short circuit between the gate electrode 116 and the source electrode 114 in the HV-MOS. This figure shows the electric field distribution in a range from the silicon substrate surface (Si surface) to the pn junction depth between the n region 117 and the p$^-$ region 200. In particularly, the solid lines indicate the electric field distribution in the silicon substrate surface and the electric field distribution in the first pn junction depth between the n$^-$ layer 110 and the p$^-$ region 200. The electric field peak in the silicon substrate surface on the drain side is present below an edge of the second floating field plate FB3 on the drain side. As can be seen from comparison between FIG. 39 and FIG. 30, also in the eighth preferred embodiment, like in the seventh preferred embodiment, the electric field peak on the drain side becomes farther away from the breakdown critical electric field point (a portion in the first pn junction depth of the n region 117 on the drain side). Therefore; since the electric field strength near the breakdown critical electric field point becomes lower, the withstand voltage in the HV-MOS increases.

As discussed above, in the corner portion of the high potential island, the electric field peak tends to become higher especially in the silicon substrate surface on the cathode side of the HV-diode (the drain side in the HV-MOS), and there is a possibility of decrease in withstand voltage. Since the eighth preferred embodiment makes it possible to reduce the electric field strength near the breakdown critical electric field point in the HV-diode or the HV-MOS to lower, application of the eighth preferred embodiment to the HV-diode in the corner portion of the high potential island is especially effective.

Variation

Though the present invention is applied to a lateral device having a RESURF structure in the above preferred embodiments, the present invention can be also applied to a vertical device. Herein, a variation where the first preferred embodiment is applied to a vertical device will be discussed.

Figure 40:
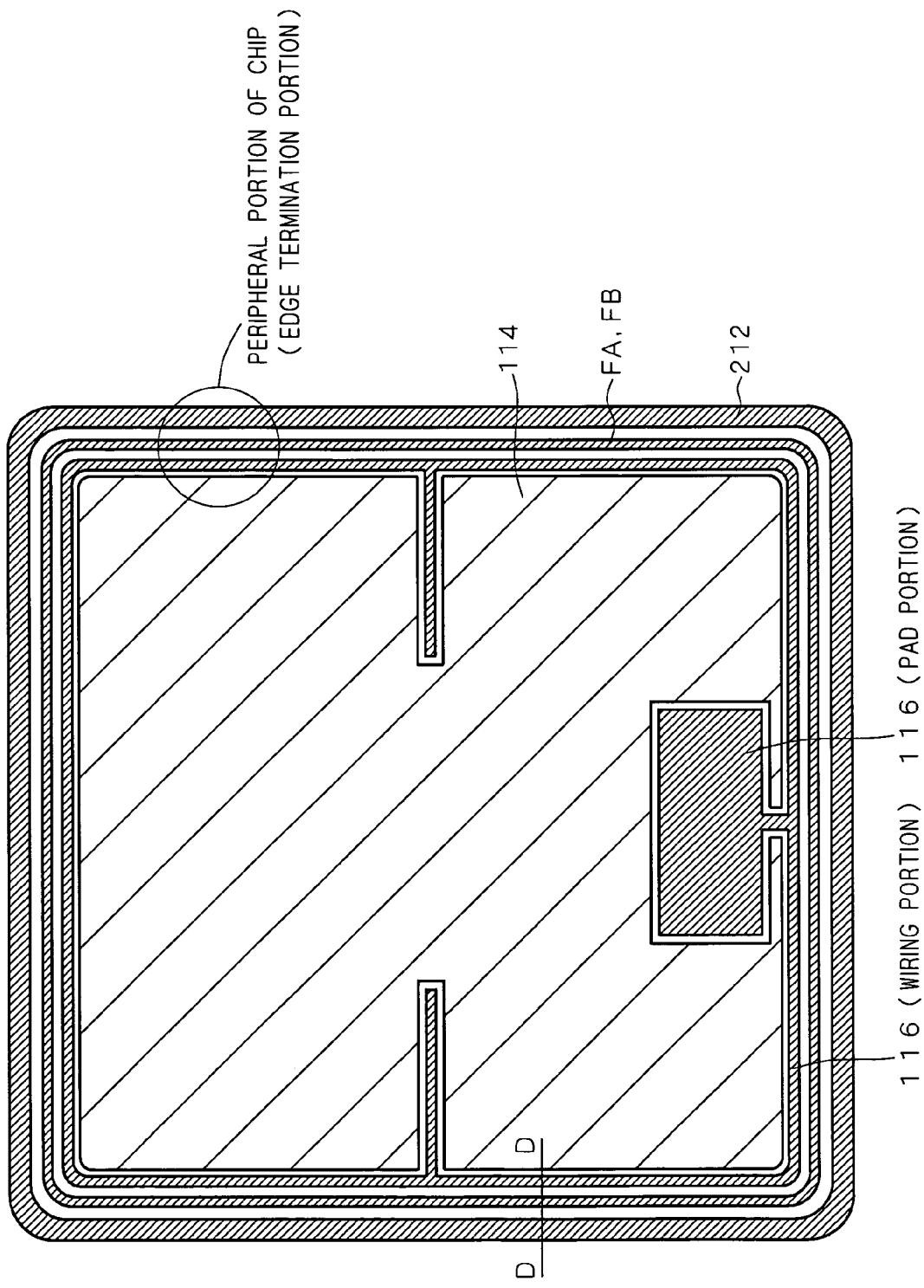
FIG. 40 is a view showing a variation of the present invention.
Figure 41:
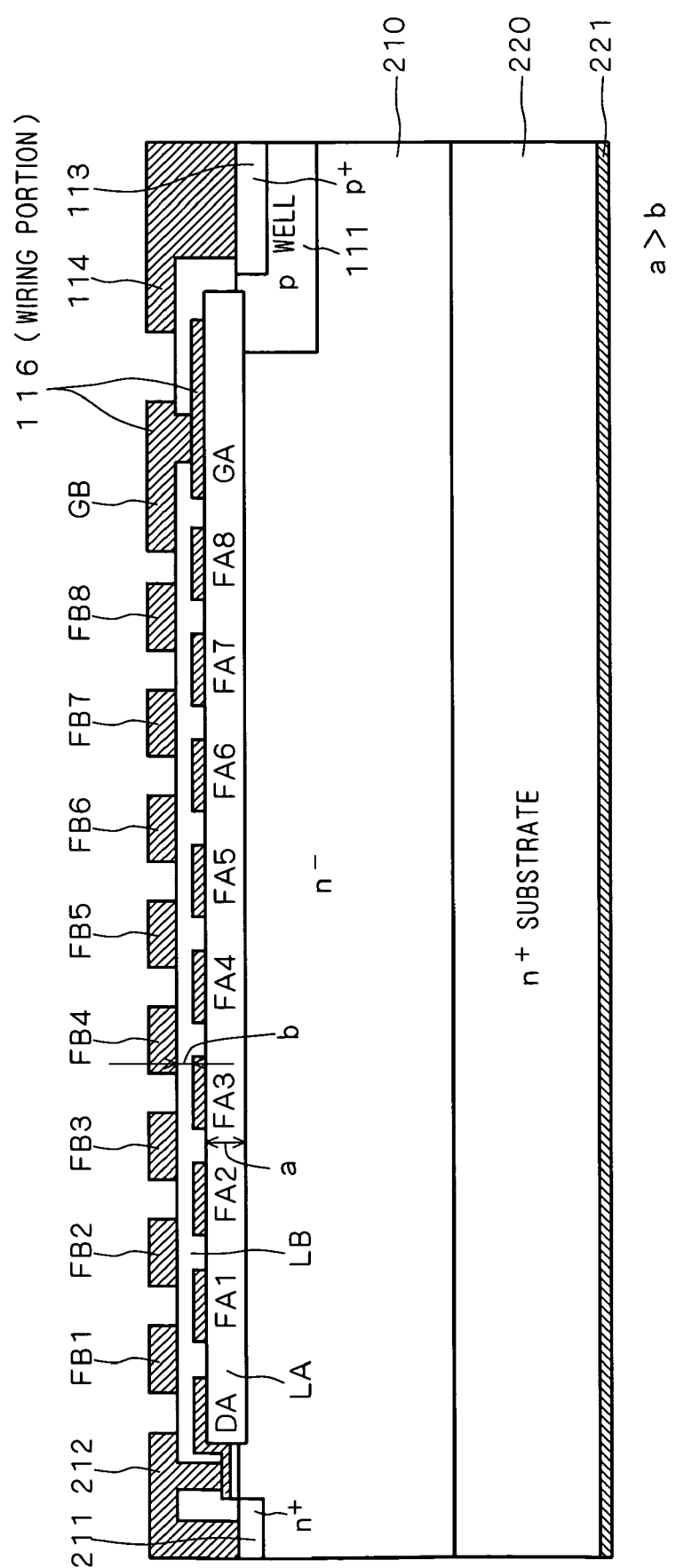
FIG. 41 is a cross section showing the variation of the present invention.

FIG. 40 is a plan view showing a chip of a vertical HV-MOS. FIG. 41 is an enlarged cross section of a peripheral portion (edge termination portion) of the chip, taken along the line D—D. In FIGS. 40 and 41, identical constituent elements are represented by the same reference signs. Further, in these figures, constituent elements having the same functions as those in FIG. 6 are represented by the same reference signs.

As shown in FIG. 40, in the vertical HV-MOS, the source electrode 114 and the gate electrode 116 are provided on an upper surface of the chip and a drain electrode (not shown) is provided on a back surface thereof. In the edge termination portion on the upper surface of the chip, a channel stopper layer 211 (see FIG. 41) is formed and an electrode 212 (referred to as a "channel stopper electrode") is formed thereon.

In the vertical HV-MOS, unlike in the lateral HV-MOS shown in the first to eighth preferred embodiments, an n$^-$ layer 210 serving as the first semiconductor region is formed on an n$^+$ substrate 220. Specifically, no p$^-$ region (the fourth semiconductor region) is formed below the n$^-$ layer 210. The n$^+$ substrate 220 functions as a drain in the HV-MOS and a drain electrode 221 is formed or a back surface of the n$^+$ substrate 220. Inside the n$^-$ layer 210, the p well 111 serving as the second semiconductor region is formed and the p$^+$ region 113 is formed inside the p well 111. Above the p well 111, the gate electrode 116 is formed with the first insulating film LA interposed therebetween, and above the p well 111 and the p$^+$ region 113, the source electrode 114 is formed. The channel stopper layer 211 serving as the third semiconductor region is formed in the edge termination portion of the chip in the n$^-$ layer 210 and the channel stopper electrode 212 is formed thereon. The p well 111 and the channel stopper layer 211 are so formed as to sandwich the n$^-$ layer 210.

Above the n$^-$ layer 210 between a wiring portion of the gate electrode 116 and the channel stopper electrode 212, a plurality of first floating field plates FA are formed with the first insulating film LA interposed therebetween. Further, the second insulating film LB is formed on the first floating field plates FA and a plurality of second floating field plates FB are formed on the second insulating film LB. As shown in FIG. 41, the first floating field plates FA and the second floating field plates FB are aligned in the first direction from the third semiconductor region (the channel stopper layer 211) towards the second semiconductor region (the p well 111) (in FIG. 40, the first floating field plates FA and the second floating field plates FB are simplified).

In this variation, like in the first preferred embodiment, assuming that the thickness of the first insulating film LA is "a" and the distance between the first floating field plates FA and the second floating field plates FB in the second direction (a direction of thicknesses of the first insulating film LA and the second insulating film LB) is "b", the first insulating film LA is made thicker and the second insulating film LB is made thinner than those of the background-art structure so that a relation a>b can be held.

Thus, when the first preferred embodiment is applied to the vertical HV-MOS, the electric field concentration in an interface between the first insulating film LA and the n⁻ layer 210 is relieved in an OFF state of the HV-MOS. Therefore, the HV-MOS can keep a high withstand voltage with stability in the edge termination portion of the chip, and it is possible to ensure an increase in withstand voltage of the vertical HV-MOS.

Though the case where the present invention is applied to the vertical HV-MOS has been discussed, the present invention can be applied to overall vertical power devices such as an IGBT and a diode and can produce the same effect. Though only the application of the first preferred embodiment to the vertical device has been shown in this variation, it goes without saying that other preferred embodiments may be applied to the vertical device.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a first semiconductor region of a first conductivity type;
   a second semiconductor region of a second conductivity type and a third semiconductor region of said first conductivity type having impurity concentration higher than that of said first semiconductor region which are so formed as to sandwich said first semiconductor region;
   a first insulating film formed on said first semiconductor region;
   a plurality of first floating field plates formed on said first insulating film, being arranged above said first semiconductor region along a first direction which is a direction from said third semiconductor region towards said second semiconductor region;
   a second insulating film formed on said first floating field plates;
   a plurality of second floating field plates formed on said second insulating film, being arranged above said first semiconductor region along said first direction;
   a third insulating film formed on said second floating field plates; and
   a plurality of third floating field plates formed on said third insulating film, being arranged above said first semiconductor region along said first direction.

2. The semiconductor device according to claim 1, further comprising
   an electrode formed on said third semiconductor region,
   wherein said electrode has a first electrode portion extending on said first insulating film and a second electrode portion extending on said second insulating film, and
   the length of a portion in said second electrode portion which extends above said first insulating film along said first direction is longer than the length of a portion in said first electrode portion which extends above said first insulating film along said first direction.

3. The semiconductor device according to claim 1, wherein assuming that the thickness of said first insulating film is "a" and the distance between said second floating field plates and said third floating field plates in said second direction is "c", a relation a>c is held.

4. The semiconductor device according to claim 1, wherein
   said second semiconductor region functions as a channel region of a transistor, and
   said third semiconductor region functions as a drain of said transistor.

5. The semiconductor device according to claim 1, wherein
   said second semiconductor region functions as an anode of a diode, and
   said third semiconductor region functions as a cathode of said diode.

6. The semiconductor device according to claim 1, wherein
   said third semiconductor region functions as a channel stopper of a peripheral portion of a chip.

7. The semiconductor device according to claim 1, further comprising
   a fourth semiconductor region of said second conductivity type, being in contact with a lower side of said first semiconductor region.

8. The semiconductor device according to claim 7, wherein
   the impurity concentration of said first semiconductor region is low and the thickness thereof is thin so that a depletion layer extends, between said second semiconductor region and said third semiconductor region, up to an upper surface of said semiconductor substrate from a first pn junction between said first semiconductor region and said fourth semiconductor region, by applying a reverse voltage across said first pn junction, said reverse voltage being lower than a breakdown voltage of a second pn junction between said first semiconductor region and said second semiconductor region.

9. The semiconductor device according to claim 1, wherein assuming that the thickness of said first insulating film is "a" and the distance between said first floating field plates and said second floating field plates in a second direction which is a direction of said thickness is "b", a relation a>b is held.

10. A semiconductor device, comprising:
    a first semiconductor region of a first conductivity type;
    a second semiconductor region of a second conductivity type and a third semiconductor region of said first conductivity type having impurity concentration higher than that of said first semiconductor region which are so formed as to sandwich said first semiconductor region;
    an electrode formed on said third semiconductor region;
    a first insulating film formed on said first semiconductor region;
    a second insulating film formed on said first insulating film;
    a plurality of second floating field plates formed on said second insulating film, being arranged above said first semiconductor region along a first direction which is a direction from said third semiconductor region towards said second semiconductor region;
    a third insulating film formed on said second floating field plates; and
    a plurality of third floating field plates formed on said third insulating film, being arranged above said first semiconductor region along said first direction,
    wherein said electrode has a first electrode portion extending on said first insulating film along said first direction.

11. The semiconductor device according to claim 10, wherein
    said electrode has a second electrode portion extending on said second insulating film and a third electrode portion extending on said third insulating film, and the length of a portion in said third electrode portion which extends above said first insulating film along said first direction is longer than the length of a portion in said first electrode portion which extends above said first insulating film along said first direction and longer than the length of a portion in said second electrode portion which extends above said first insulating film along said first direction.

12. The semiconductor device according to claim 10, wherein assuming that the thickness of said first insulating film is "a", the thickness of said second insulating film is "b" and the distance between said second floating field plates and said third floating field plates in a second direction which is a direction of said thickness is "c", a relation a+b>c is held.

13. The semiconductor device according to claim 10, further comprising a fourth semiconductor region of said second conductivity type, being in contact with a lower side of said first semiconductor region.

14. The semiconductor device according to claim 13, wherein the impurity concentration of said first semiconductor region is low and the thickness thereof is thin so that a depletion layer extends, between said second semiconductor region and said third semiconductor region, up to an upper surface of said semiconductor substrate from a first pn junction between said first semiconductor region and said fourth semiconductor region, by applying a reverse voltage across said first pn junction, said reverse voltage being lower than a breakdown voltage of a second pn junction between said first semiconductor region and said second semiconductor region.

15. A semiconductor device, comprising:

a first semiconductor region of a first conductivity type;

a second semiconductor region of a second conductivity type and a third semiconductor region of said first conductivity type having impurity concentration higher than that of said first semiconductor region which are so formed as to sandwich said first semiconductor region;

an electrode formed on said third semiconductor region;

a first insulating film formed on said first semiconductor region;

a second insulating film formed on said first insulating film;

a plurality of second floating field plates formed on said second insulating film, being arranged above said first semiconductor region along a first direction which is a direction from said third semiconductor region towards said second semiconductor region;

a third insulating film formed on said second floating field plates; and a plurality of third floating field plates formed on said third insulating film, being arranged above said first semiconductor region along said first direction, wherein said electrode has a first electrode portion extending on said first insulating film and a second electrode portion extending on said second insulating film, and the length of a portion in said second electrode portion which extends above said first insulating film along said first direction is longer than the length of a portion in said first electrode portion which extends on said first insulating film along said first direction.

16. The semiconductor device according to claim 15, wherein said electrode further has a third electrode portion extending on said third insulating film, and the length of a portion in said third electrode portion which extends above said first insulating film along said first direction is longer than the length of a portion in said second electrode portion which extends above said first insulating film along said first direction.

17. The semiconductor device according to claim 16, wherein assuming that the length of a portion in said first electrode portion which extends on said first insulating film along said first direction is "d", the length of a portion in said second electrode portion which extends above said first insulating film along said first direction is longer than said length "d" by a length "e", and the length of a portion in said third electrode portion which extends above said first insulating film along said first direction is longer than said length (d+e) by a length "f", relations d>e and d>f are held.

18. The semiconductor device according to claim 15, wherein assuming that the thickness of said first insulating film is "a", the thickness of said second insulating film is "b" and the distance between said second floating field plates and said third floating field plates in a second direction which is a direction of said thickness is "a" relation a+b>c is held.

19. The semiconductor device according to claim 15, further comprising a fourth semiconductor region of said second conductivity type, being in contact with a lower side of said first semiconductor region.

20. The semiconductor device according to claim 19, wherein the impurity concentration of said first semiconductor region is low and the thickness thereof is thin so that a depletion layer extends, between said second semiconductor region and said third semiconductor region, up to an upper surface of said semiconductor substrate from a first pn junction between said first semiconductor region and said fourth semiconductor region, by applying a reverse voltage across said first pn junction, said reverse voltage being lower than a breakdown voltage of a second pn junction between said first semiconductor region and said second semiconductor region.

* * * * *